(12) United States Patent
Lin

(10) Patent No.: US 6,444,489 B1
(45) Date of Patent: Sep. 3, 2002

(54) SEMICONDUCTOR CHIP ASSEMBLY WITH BUMPED MOLDED SUBSTRATE

(76) Inventor: Charles W. C. Lin, 34 Pinewood Grove, Singapore (SG), 738290

(*) Notice: Subject to any disclaimer, the term of this patent is extended or adjusted under 35 U.S.C. 154(b) by 109 days.

(21) Appl. No.: 09/738,667

(22) Filed: Dec. 15, 2000

(51) Int. Cl.$^7$ .............................................. H01L 21/44
(52) U.S. Cl. ..................... 438/107; 438/108; 438/110; 438/612
(58) Field of Search ............................... 438/107, 108, 438/110, 125, 612, 613, 118

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,859,722 A | 8/1989 | Shiobara et al. | 523/433 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 4,985,600 A | 1/1991 | Heerman | 174/255 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,081,520 A | 1/1992 | Yoshii et al. | 357/80 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,132,778 A | 7/1992 | Juskey et al. | 357/72 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |

(List continued on next page.)

FOREIGN PATENT DOCUMENTS

| | | |
|---|---|---|
| DE | A-37 32 249 A1 | 4/1989 |
| EP | A-0 361 192 B1 | 2/1994 |
| EP | 0 718 882 A1 | 6/1996 |
| WO | WO 99/57762 | 11/1999 |

OTHER PUBLICATIONS

Markstein et al., "Controlling the Variables in Stencil Printing," Electronic Packaging & Production, Feb. 1997, pp. 48–56.

(List continued on next page.)

Primary Examiner—Kevin M. Picardat
(74) Attorney, Agent, or Firm—David M. Sigmond

(57) ABSTRACT

A semiconductor chip assembly includes a semiconductor chip and a molded substrate. The chip includes a conductive pad. The molded substrate includes a base, a bump that extends above the base, and a through-hole in the base that is offset from the bump and aligned with the pad. A routing line covers the bump and extends along a top surface of the molded substrate to the through-hole and extends through the through-hole and contacts the pad. The molded substrate is compressible and permits a portion of the routing line that covers the bump to exhibit elastic deformation in response to vertically oriented external pressure. A method of manufacturing the assembly includes forming the molded substrate and attaching the molded substrate to the chip by transfer molding, exposing the pad using the through-hole, depositing a metal layer on the molded substrate and in the through-hole and on the pad, and removing a portion of the metal layer to form the routing line.

100 Claims, 53 Drawing Sheets

U.S. PATENT DOCUMENTS

| | | |
|---|---|---|
| 5,294,038 A | 3/1994 | Nakano et al. .......... 228/179.1 |
| 5,327,010 A | 7/1994 | Uenaka et al. .............. 257/679 |
| 5,334,804 A | 8/1994 | Love et al. ................. 174/267 |
| 5,346,750 A | 9/1994 | Hatakeyama et al. ....... 428/209 |
| 5,355,283 A | 10/1994 | Marrs et al. ................ 361/760 |
| 5,358,621 A | 10/1994 | Oyama ....................... 205/123 |
| 5,364,004 A | 11/1994 | Davidson .................... 228/1.1 |
| 5,397,921 A | 3/1995 | Karnezos .................... 257/779 |
| 5,407,864 A | 4/1995 | Kim ........................... 437/203 |
| 5,424,245 A | 6/1995 | Gurtler et al. .............. 437/183 |
| 5,438,477 A | 8/1995 | Pasch ......................... 361/689 |
| 5,439,162 A | 8/1995 | George et al. ......... 228/180.22 |
| 5,447,886 A | 9/1995 | Rai ............................. 437/183 |
| 5,454,161 A | 10/1995 | Beilin et al. ................. 29/852 |
| 5,454,928 A | 10/1995 | Rogers et al. .............. 205/125 |
| 5,475,236 A | 12/1995 | Yoshizaki .................... 257/48 |
| 5,477,087 A | 12/1995 | Kawakita et al. ........... 257/737 |
| 5,477,933 A | 12/1995 | Nguyen ...................... 174/262 |
| 5,478,007 A | 12/1995 | Marrs .................... 228/180.22 |
| 5,483,421 A | 1/1996 | Gedney et al. ............. 361/771 |
| 5,484,647 A | 1/1996 | Nakatani et al. ............ 428/209 |
| 5,485,949 A | 1/1996 | Tomura et al. .......... 228/180.5 |
| 5,487,218 A | 1/1996 | Bhatt et al. ................... 29/852 |
| 5,489,804 A | 2/1996 | Pasch ......................... 257/778 |
| 5,493,096 A | 2/1996 | Koh ....................... 219/121.71 |
| 5,508,228 A | 4/1996 | Nolan et al. ................ 437/183 |
| 5,508,229 A | 4/1996 | Baker ......................... 437/183 |
| 5,525,065 A | 6/1996 | Sobhani ........................ 439/67 |
| 5,536,973 A | 7/1996 | Yamaji ....................... 257/737 |
| 5,542,601 A | 8/1996 | Fallon et al. ............... 228/119 |
| 5,547,740 A | 8/1996 | Higdon et al. .............. 428/209 |
| 5,556,810 A | 9/1996 | Fujitsu ....................... 437/209 |
| 5,556,814 A | 9/1996 | Inoue et al. ................ 437/230 |
| 5,564,181 A | 10/1996 | Dineen et al. ................ 29/841 |
| 5,572,069 A | 11/1996 | Schneider .................... 257/690 |
| 5,576,052 A | 11/1996 | Arledge et al. ............... 427/98 |
| 5,583,073 A | 12/1996 | Lin et al. .................... 439/183 |
| 5,595,943 A | 1/1997 | Itabashi et al. ............. 437/230 |
| 5,599,744 A | 2/1997 | Koh et al. .................. 437/195 |
| 5,611,140 A | 3/1997 | Kulesza et al. ............... 29/832 |
| 5,611,884 A | 3/1997 | Bearinger et al. .......... 156/325 |
| 5,613,296 A | 3/1997 | Kurino et al. ................. 29/852 |
| 5,614,114 A | 3/1997 | Owen .................... 219/121.66 |
| 5,615,477 A | 4/1997 | Sweitzer ...................... 29/840 |
| 5,619,791 A | 4/1997 | Lambrecht, Jr. et al. ...... 29/852 |
| 5,627,405 A | 5/1997 | Chillara ...................... 257/668 |
| 5,627,406 A | 5/1997 | Pace ........................... 257/700 |
| 5,633,204 A | 5/1997 | Tago et al. ................. 438/614 |
| 5,637,920 A | 6/1997 | Loo ............................ 257/700 |
| 5,641,113 A | 6/1997 | Somaki et al. ......... 228/180.22 |
| 5,645,628 A | 7/1997 | Endo et al. ................ 106/1.23 |
| 5,646,067 A | 7/1997 | Gaul .......................... 437/180 |
| 5,648,686 A | 7/1997 | Hirano et al. ............... 257/778 |
| 5,654,584 A | 8/1997 | Fujitsu ....................... 257/666 |
| 5,656,858 A | 8/1997 | Kondo et al. ............... 257/737 |
| 5,663,598 A | 9/1997 | Lake et al. ................. 257/737 |
| 5,665,652 A | 9/1997 | Shimizu ..................... 438/127 |
| 5,666,008 A | 9/1997 | Tomita et al. .............. 257/778 |
| 5,669,545 A | 9/1997 | Pham et al. ................. 228/1.1 |
| 5,674,785 A | 10/1997 | Akram et al. .............. 437/217 |
| 5,674,787 A | 10/1997 | Zhao et al. ................. 437/230 |
| 5,682,061 A | 10/1997 | Khandros et al. ........... 257/666 |
| 5,686,353 A | 11/1997 | Yagi et al. .................. 437/183 |
| 5,691,041 A | 11/1997 | Frankeny et al. ........... 428/209 |
| 5,722,162 A | 3/1998 | Chou et al. ................... 29/852 |
| 5,723,369 A | 3/1998 | Barber ....................... 438/106 |
| 5,731,223 A | 3/1998 | Padmanabhan ............. 437/183 |
| 5,736,456 A | 4/1998 | Akram ....................... 438/614 |
| 5,739,585 A | 4/1998 | Akram et al. .............. 257/698 |
| 5,744,859 A | 4/1998 | Ouchida .................... 257/668 |
| 5,757,071 A | 5/1998 | Bhansali ..................... 257/697 |
| 5,757,081 A | 5/1998 | Chang et al. ............... 257/778 |
| 5,764,486 A | 6/1998 | Pendse ....................... 361/774 |
| 5,774,340 A | 6/1998 | Chang et al. ............... 361/771 |
| 5,789,271 A | 8/1998 | Akram ......................... 438/18 |
| 5,798,285 A | 8/1998 | Bentlage et al. ............ 438/108 |
| 5,801,072 A | 9/1998 | Barber ........................ 438/107 |
| 5,801,447 A | 9/1998 | Hirano et al. ............... 257/778 |
| 5,803,340 A | 9/1998 | Yeh et al. .................. 228/56.3 |
| 5,804,771 A | 9/1998 | McMahon et al. .......... 174/255 |
| 5,808,360 A | 9/1998 | Akram ....................... 257/738 |
| 5,811,879 A | 9/1998 | Akram ....................... 257/723 |
| 5,813,115 A | 9/1998 | Misawa et al. ............... 29/832 |
| 5,817,541 A | 10/1998 | Averkiou et al. ........... 438/107 |
| 5,822,856 A | 10/1998 | Bhatt et al. ................... 29/832 |
| 5,834,844 A | 11/1998 | Akagawa et al. ........... 257/734 |
| 5,861,666 A | 1/1999 | Bellaar ....................... 257/686 |
| 5,863,816 A | 1/1999 | Cho ........................... 438/123 |
| 5,870,289 A | 2/1999 | Tokuda et al. .............. 361/779 |
| 5,883,435 A | 3/1999 | Geffken et al. ............. 257/758 |
| 5,925,931 A | 7/1999 | Yamamoto .................. 257/737 |
| 5,929,516 A | 7/1999 | Heerman et al. ........... 257/701 |
| 5,994,222 A | 11/1999 | Smith et al. ................ 438/689 |
| 6,012,224 A | 1/2000 | DiStefano et al. ............ 29/840 |
| 6,013,877 A | 1/2000 | Degani et al. .............. 174/264 |
| 6,017,812 A | 1/2000 | Yonezawa et al. .......... 438/613 |
| 6,018,196 A | 1/2000 | Noddin ....................... 257/777 |
| 6,020,561 A | 2/2000 | Ishida et al. ................ 174/261 |
| 6,037,665 A | 3/2000 | Miyazaki .................... 257/773 |
| 6,046,909 A | 4/2000 | Joy ............................. 361/748 |
| 6,084,297 A | 6/2000 | Brooks et al. .............. 257/698 |
| 6,084,781 A | 7/2000 | Klein ......................... 361/771 |
| 6,088,236 A | 7/2000 | Tomura et al. ............. 361/783 |
| 6,103,552 A | 8/2000 | Lin ............................. 438/113 |
| 6,103,992 A | 8/2000 | Noddin .................. 219/121.71 |
| 6,122,172 A | 9/2000 | Dumoulin et al. .......... 361/719 |
| 6,127,204 A | 10/2000 | Isaacs et al. ................ 438/106 |
| 6,350,386 B1 * | 2/2002 | Lin ............................. 438/125 |
| 6,350,632 B1 * | 2/2002 | Lin ............................. 438/107 |
| 6,350,633 B1 * | 2/2002 | Lin ............................. 438/106 |

OTHER PUBLICATIONS

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, , pp. 43–46.

Kuchenmeister et al., "Film Chip Interconnection Systems Prepared by Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly with Solder Via".

U.S. application Ser. No. 09/464,562, filed Dec. 16, 1999, entitled "Bumpless Flip Chip Assembly with Strips and Via–Fill".

U.S. application Ser. No. 09/464,561, filed Dec. 16, 1999, entitled "Bumpless Flip Chip Assembly with Strips–In–Via and Plating".

U.S. application Ser. No. 09/120,408, filed Jul. 22, 1998, entitled "Flip Chip Assembly With Via Interconnection".

U.S. application Ser. No. 09/465,024, filed Dec. 16, 1999, entitled "Bumpless Flip Chip Assembly with Solder Via".

U.S. application Ser. No. 09/464,562, filed Dec. 16, 1999, entitled "Bumpless Flip Chip Assembly With Strips and Via–Fill".

U.S. application Ser. No. 09/464,561, filed Dec. 16, 1999, entitled "Bumpless Flip Chip Assembly with Strips–In–Via and Plating".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method Of Making a Support Circuit For A Semiconductor Chip Assembly".

U.S. application Ser. No. 09/643,445, filed Aug. 22, 2000, entitled "Method of Making a Semiconductor Chip Assembly".

U.S. application Ser. No. 09/665,928, filed Sep. 20, 2000, entitled "Semiconductor Chip Assembly with Ball Bond Connection Joint".

U.S. application Ser. No. 09/665,931, filed Sep. 20, 2000, entitled "Method Of Making A Support Circuit With A Tapered Through–Hole For A Semiconductor Chip Assembly".

U.S. application Ser. No. 09/677,207, filed Oct. 2, 2000, entitled "Method Of Making A Semiconductor Chip Assembly With A Conductive Trace Subtractively Formed Before and After Chip Attachment".

U.S. application Ser. No. 09/687,619, filed Oct. 13, 2000, entitled "Method Of Connecting A Conductive Trace To A Semiconductor Chip".

* cited by examiner

SEMICONDUCTOR CHIP ASSEMBLY WITH BUMPED MOLDED SUBSTRATE

BACKGROUND OF THE INVENTION

1. Field of the Invention

The present invention relates to a semiconductor chip assembly, and more particularly to a semiconductor chip assembly in which a semiconductor chip is attached to a molded substrate.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding. Wire bonding is by far the most common. In this approach, wires are bonded, one at a time, from the chip to external circuitry by ultrasonic, thermocompression or thermosonic processes. TAB involves bonding gold-bumped pads on the chip to external circuitry on a polymer tape using thermocompression bonding. Both wire bonding and TAB require mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuit, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes.

Recent introduction of grid array packaging (e.g., ball grid arrays), chip size packages (CSP) and flip-chip packages using high density interconnect substrates are relentlessly driving increased printed circuit board density. Shrinking traces and spaces and increasing layer count increase printed circuit board density, however reducing the size of plated through-holes can even more significantly increase printed circuit board density. Small through-holes allow more routing space so that more conductive lines can be placed between the through-holes. Small through-holes also increase design flexibility and reduce design cycle time and overall product introduction time.

The semiconductor chip assembly is subsequently connected to another circuit such as a PCB or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB. However, since BGA and LGA packages are connected to the PCB by solder joints, the compliance is small and solder joint reliability problems exist. Moreover, this lack of compliance can lead to loss of electrical contact. For instance, as the number of connections increase, the PCB becomes more prone to deform, and the accuracy of flatness and applied pressure becomes more difficult to meet. In addition, during operation, heat generated by the chip tends to create straining and warping due to differences in thermal coefficients of expansion in various materials. In order to reduce this problem, compliant bumps have been developed. Several approaches are described below.

U.S. Pat. No. 5,508,228 discloses a chip with compliant bumps over the pads for adhesive flip-chip assemblies. The compliant bumps include polymer bumps covered by a thin ductile metal layer. The compliant bumps are formed by depositing a polymeric material over the chip, selectively removing portions of the polymeric material so that polymer bumps remain over the pads, depositing a metal layer over the polymer bumps that electrically connects to the underlying pads, and severing the metal layer between adjacent bumps. Drawbacks to this approach include the difficulty with properly depositing the metal layer over the polymer bumps and the lack of horizontal routing (fan-in or fan-out) between the bumps and the pads.

U.S. Pat. No. 5,929,516 discloses a semiconductor chip assembly with a polymer substrate and a chip. The polymer substrate includes a polymer stud grid array that surrounds a trough and is formed by injection (or transfer) molding. Electrical conductors on the polymer substrate include outside terminals on the studs and inside terminals in or near the trough. The chip is disposed in the trough. In one embodiment, the chip is face-up and the pads are connected to the inside terminals near the trough by wire bonds. In another embodiment, the chip is face-down and the pads are connected to the inside terminals in the trough by solder joints in a flip-chip attachment. Drawbacks to this approach include the need to electrically connect the chip to the electrical conductors by wire bonds or solder joints, the inability to provide a chip size package and the inability to be manufactured during wafer processing.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a semiconductor chip and a molded substrate that provides a low cost, high performance, high reliability package.

Another objective of the present invention is to provide a convenient, cost-effective method for manufacturing semiconductor chip assemblies as chip size packages, ball grid arrays or other structures.

In accordance with one aspect of the invention, a semiconductor chip assembly includes a chip and a molded substrate. The chip includes a conductive pad. The molded substrate includes a base, a bump that extends above the base, and a through-hole in the base that is offset from the bump and aligned with the pad. A routing line covers the bump, extends along a top surface of the molded substrate to the through-hole, extends through the through-hole and contacts the pad.

Preferably, the molded substrate is compressible and permits a portion of the routing line that covers the bump to exhibit elastic deformation in response to vertically oriented external pressure directed towards the top surface. It is also preferred that the routing line spans 360 degrees around the through-hole and provides all horizontal and vertical routing between the top of the bump and the pad.

In accordance with another aspect of the invention, a method of manufacturing the assembly includes transfer molding the molded substrate on the chip, exposing the pad using the through-hole, depositing a metal layer on the molded substrate, in the through-hole and on the pad, and removing a portion of the metal layer to form the routing line.

In accordance with another aspect of the invention, a method of manufacturing the assembly includes transfer molding the molded substrate, forming a first portion of the routing line that covers the bump and extends along the top surface to the through-hole, attaching the molded substrate to the chip using an adhesive, exposing the pad using the through-hole and an opening in the adhesive, and forming a second portion of the routing line in the through-hole that contacts the pad.

The method may include forming the through-hole either during or after the transfer molding, forming a portion of the routing line that covers the bump either before or after attaching the molded substrate to the chip, and singulating the chip from other chips on a wafer either before or after attaching the molded substrate to the chip.

The method may also include molding the molded substrate on the chip, molding the molded substrate on an adhesive on the chip, or forming the molded substrate and then attaching the molded substrate to the chip using an adhesive.

The method may further include forming the routing line by electrolessly plating a first metal layer on the molded substrate, electroplating a second metal layer over the first metal layer, laser etching the second metal layer to define a periphery of the routing line, and wet chemical etching the first metal layer using the second metal layer as an etch mask.

An advantage of the present invention is that the semiconductor chip assembly can include a compliant, compressible bump which is electrically connected to and horizontally offset from a chip pad. Another advantage is that the assembly need not include wire bonds, TAB leads or solder joints. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1D and 2A–2D are cross-sectional and top views, respectively, of a method of manufacturing a semiconductor chip assembly in accordance with a first embodiment of the present invention. In the first embodiment, the molded substrate is formed on the chip by transfer molding, the metal layer is deposited on the molded substrate and into the through-hole and on the pad, and then a portion of the metal layer is selectively removed to form the routing line.

Figure 1A:
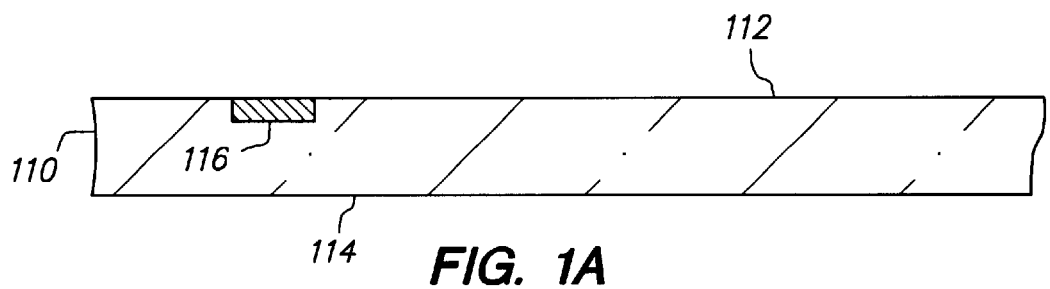
FIGS. 1A–1D are cross-sectional views showing a method of manufacturing a semiconductor chip assembly in accordance with a first embodiment of the present invention in which the molded substrate is formed on the chip by transfer molding.
Figure 2A:
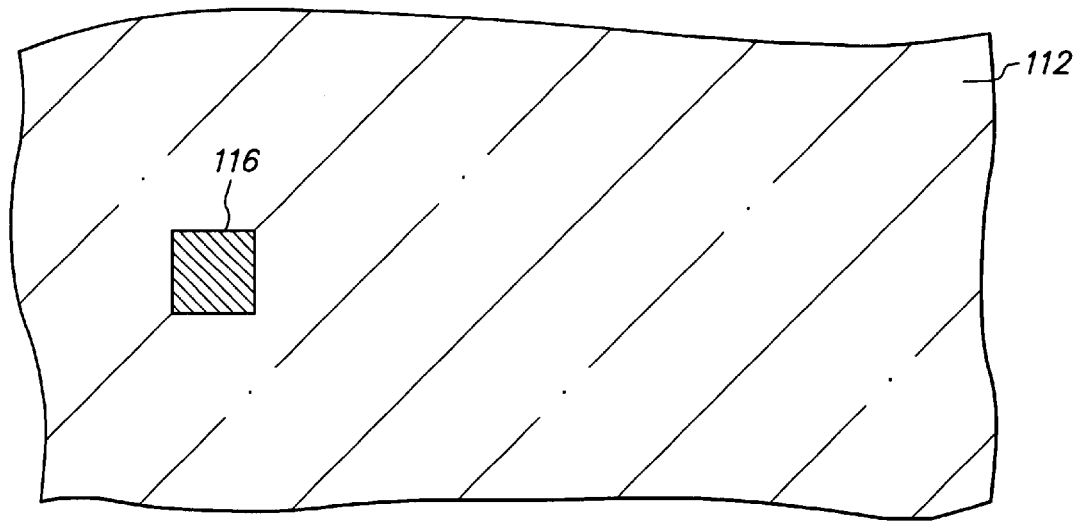
FIGS. 2A–2D are top plan views corresponding to FIGS. 1A–10D, respectively.

FIGS. 1A and 2A are cross-sectional and top views, respectively, of semiconductor chip 110 which is an integrated circuit in which various transistors, circuits, interconnect lines and the like are formed (not shown). Chip 110 includes upper surface 112 and lower surface 114. Upper surface 112 includes conductive pad 116. Pad 116 is substantially aligned with the insulative housing of chip 110 so that upper surface 112 is essentially flat. Alternatively, if desired, pad 116 can extend above or be recessed below the insulative housing. Pad 116 provides a bonding site to electrically couple chip 110 with external circuitry. Thus, pad 116 can be an input/output pad or a power/ground pad. Pad 116 has a length and width of 75 microns.

Pad 116 initially has an aluminum base that needs to be rendered catalytic to electrolessly plated copper. The aluminum base is cleaned by dipping chip 110 in a solution containing 0.05 M phosphoric acid at room temperature for 1 minute, and then native oxide on the aluminum base is removed by dipping chip 110 in 50 volume percentage $HNO_3$. Pad 116 can be rendered catalytic to electrolessly plated copper by depositing several metal layers, such as chromium/nickel/gold or titanium/nickel/gold on the aluminum base. The chromium or titanium layer provides adhesion to the aluminum base, the nickel provides a barrier layer, and the gold surface layer is catalytic to electroless copper and prevents the nickel from oxidizing. The metal layers are typically selectively deposited by evaporation or electroplating using a mask which is a relatively complicated process. Therefore, as the preferred approach, chip 110 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. A suitable zinc solution is Enthone Alumon EN™ applied at room temperature. Thereafter, chip 110 is dipped in an electroless nickel plating solution such as Enthone Enplate NI-424 at 85° C. Advantageously, the nickel is amorphous and does not deposit on the dielectric material surrounding the aluminum base, and therefore a mask is not necessary. In addition, nickel adheres well to aluminum. Since the zinc layer is catalytic to electroless nickel, a nickel surface layer is formed on the aluminum base. The nickel layer is primarily nickel and contains about 4 to 9 weight percentage phosphorus and is about 3 to 5 microns thick. Thereafter, chip 110 is dipped in an electroless gold plating solution such as a solution containing gold cyanide, amine borane and borohydride at 70° C. A suitable electroless gold plating solution is MacDermid PLANAR™. Advantageously, the gold deposits on the nickel layer without depositing on the dielectric material surrounding the aluminum base, and therefore a mask is not necessary. The gold surface layer is extremely thin, with a thickness on the order of 0.05 microns. Thereafter, chip 110 is rinsed in distilled water.

Chip 110 includes many other pads on upper surface 112, and only pad 116 is shown for convenience of illustration. In addition, chip 110 is one of many chips on an integrated circuit wafer.

Figure 1B:
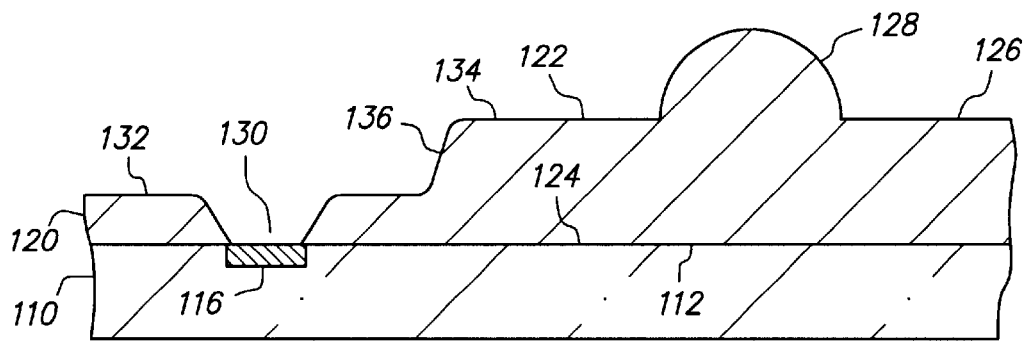
Figure 2B:
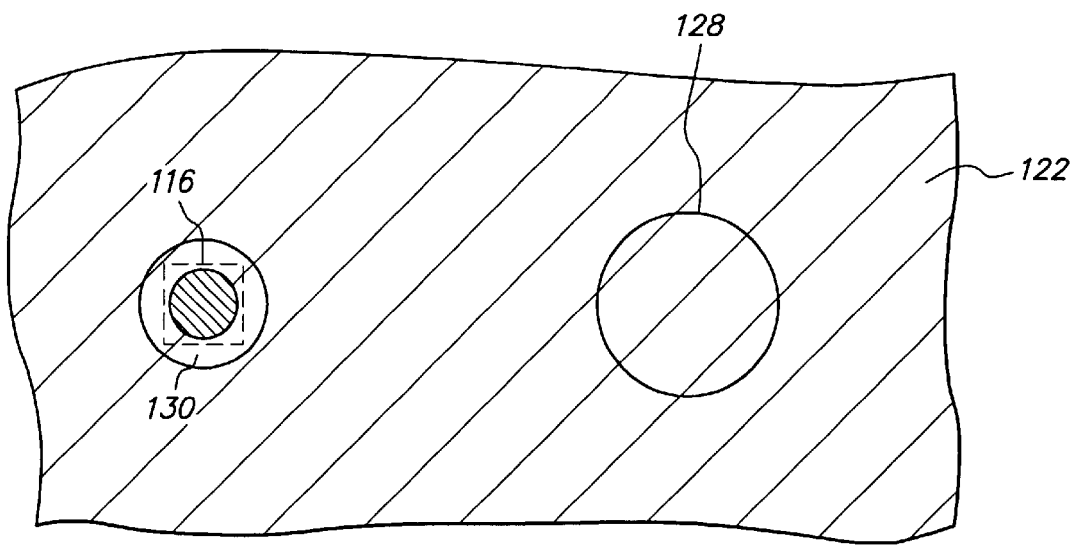

FIGS. 1B and 2B are cross-sectional and top views, respectively, of molded substrate 120 and chip 110. Molded substrate 120 is both formed and molded on chip 110 during a transfer molding operation. Molded substrate 120 includes top surface 122 and bottom surface 124. Molded substrate 120 also includes base 126, bump 128 and through-hole 130. Base 126 extends between top surface 122 and bottom surface 124, and bump 128 extends above base 126 at top surface 122. Through-hole 130 is offset from bump 128 and extends between top surface 122 and bottom surface 124. Base 126 includes recessed portion 132, non-recessed portion 134, and sloped inner wall 136 therebetween. The slope of inner wall 136 promotes electroless deposition thereon. Bump 128 is disposed on non-recessed portion 134, and through-hole 130 extends through recessed portion 132.

Recessed portion 132 has a thickness of 100 microns, and non-recessed portion 134 has a thickness of 250 microns. Bump 128 is a hemisphere with a radius of 150 microns. Thus, bump 128 extends 150 microns above base 126. Through-hole 130 has a diameter of 100 microns at top surface 122, a diameter of 65 microns at bottom surface 124, and tapered sidewalls therebetween. Thus, through-hole 130 has a conical shape in which the diameter increases as the height increases. The conical shape promotes electroless deposition on the sidewalls.

Molded substrate 120 includes many other bumps extending above base 126 and through-holes extending through base 126, and only bump 128 and through-hole 130 are shown for convenience of illustration. The other through-holes are matched in one-to-one correspondence with and expose the other pads on chip 110. Likewise, the other bumps are matched in one-to-one correspondence with and offset from the other through-holes. In addition, molded substrate 120 is part of a continuous molded structure formed on the wafer that provides corresponding bumps and through-holes for each of the pads on each of the chips in the wafer.

Molded substrate 120 is mechanically attached to chip 110 by bottom surface 124 being molded on upper surface 112. Thus, bottom surface 124 and upper surface 112 contact one another and are adhesively attached to one another. In addition, molded substrate 120 and chip 110 are positioned relative to one another so that pad 116 is aligned with and exposed by through-hole 130. That is, at least a portion of pad 116, and preferably a majority of pad 116, is directly beneath through-hole 130. Since the 75 micron length and width of pad 116 exceeds the 65 micron diameter of through-hole 130 at bottom surface 124, all of pad 116 cannot be directly beneath through-hole 130. Instead, a central portion of pad 116 is directly beneath and exposed by through-hole 130, and a peripheral portion of pad 116 is covered by base 126 and outside through-hole 130.

Molded substrate 120, including base 126, bump 128 and through-hole 130, is simultaneously formed and molded on chip 110 during a single transfer molding operation. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, various wafers (including a wafer that contains chip 110) are placed in the mold cavities, one wafer per cavity, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities. As a result, the molding compound contacts the exposed portions of the wafers in the cavities. The upper mold section is shaped to define the bases, the bumps and the through-holes of the molded substrates, and the lower mold section is shaped to allow the molding compound to cover the entire lower surface of the wafers to provide backside environmental protection such as moisture resistance and particle protection for the chips. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the wafers from the mold, and excess molding compound attached to the wafers that solidified in the runners and the gates is trimmed and removed. The molded wafers are then loaded into magazines and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the wafer, the flame retardant reduces flammability, the stress-relief agent reduces crack propagation, the coloring agent reduces photonic activity and device visibility, and the mold-release agent facilitates removal from the mold.

Suitable resins include polymeric materials such as epoxies, silicones, polyimides, phenolics, polyurethanes, polyether sulfone, polyphenylene sulfide and PET-type polyester. Epoxies are popular resins. Suitable epoxies include orthocresol-novolaks, linear aliphatics, alicyclics, bisphenols and biphenyls. Suitable curing agents include amines, phenols and acid anhydrides. Suitable accelerators include amines, imidazoles, organophosphines and ureas. Suitable inert fillers include grounded fused silica, alumina, boron nitride, aluminum nitride and silicon nitride. An inorganic filler with an average particle size of 0.5 to 50 microns is preferred for lowering hygroscopicity and increasing thermal resistance to heat during a subsequent solder operation with the next level assembly. Suitable coupling agents include silanes and titanates. Suitable flame retardants include antimony trioxide, halides and phosphides. Suitable stress-relief agents include silicones phenolics and thermoplastics. Suitable coloring agents include carbon black. Suitable mold-release agents include silicones, hydrocarbon waxes, fluorocarbons, stearic acid, montanic acid, calcium salt and magnesium salt. Molding compounds are well-known in the art. See, for instance, U.S. Pat. Nos. 4,859,722 and 5,132,778.

Figure 1C:
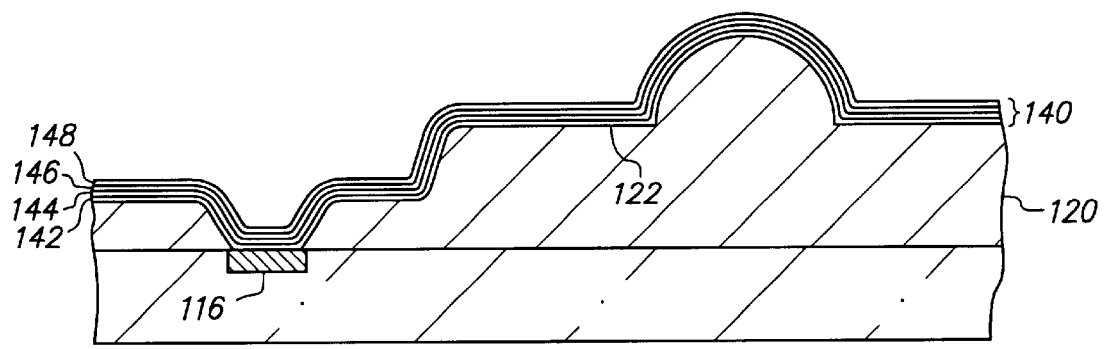
Figure 2C:
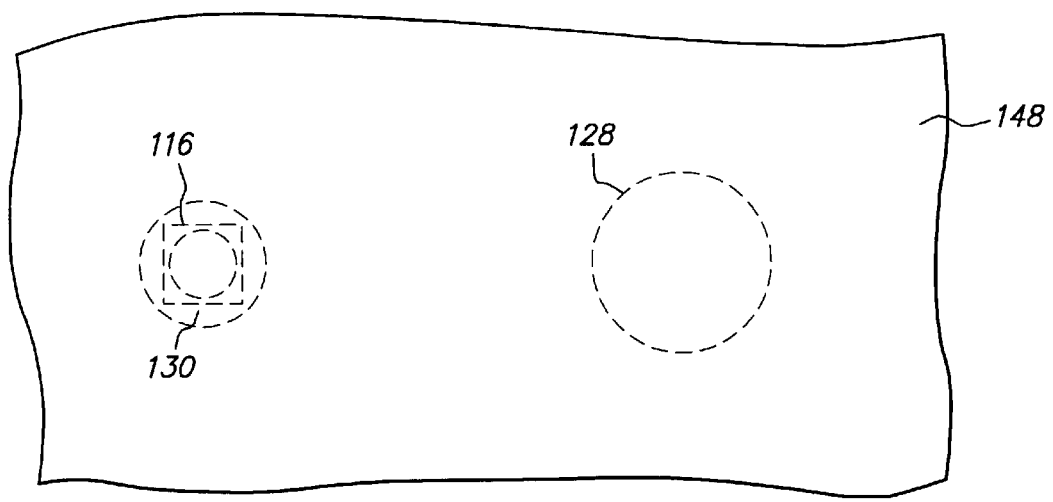

FIGS. 1C and 2C are cross-sectional and top bottom views, respectively, of metal layer 140 formed on the structure. Metal layer 140 includes copper layer 142 deposited on top surface 122, the sidewalls of through-hole 130 and the exposed central region of pad 116, copper layer 144 deposited on copper layer 142, nickel layer 146 deposited on copper layer 144, and gold layer 148 deposited on nickel layer 146. Copper layer 142 is deposited by electroless deposition, whereas copper layer 144, nickel layer 146 and gold layer 148 are deposited by electroplating. Copper layer 142 is 0.1 microns thick, copper layer 144 is 5 microns thick, nickel layer 146 is 1 micron thick, and gold layer 148 is 0.3 microns thick. As a result, the diameter of the space inside through-hole 130 is narrowed by 12.8 microns.

Prior to depositing copper layer 142, molded substrate 120 is rendered catalytic to electroless copper. To accomplish this, the structure is dipped in a copper activator solution such as dilute palladium chloride of approximately 0.1 grams of palladium chloride and 5 cubic centimeters of hydrochloric acid per liter of water for 10 seconds. A suitable copper activator solution is Shipley CATAPOSIT™. Palladium becomes trapped in the exposed surfaces of molded substrate 120, thereby providing a nucleation layer that renders these surfaces catalytic to electroless copper. In addition, as mentioned above, pad 116 has been rendered catalytic to electroless copper by the gold surface layer. Thereafter, the structure is submerged in an electroless copper plating solution such as Shipley CUPOSIT™ 250 at 60° C. and copper layer 142 deposits on top surface 122, the sidewalls of through-hole 130, and the exposed central portion of pad 116. Thereafter, the structure is removed from the electroless copper plating solution, copper layer 142 is connected to a plating bus (not shown), current is applied to the plating bus from an external power source, and the structure is submerged in an electrolytic copper plating solution such as Sel-Rex CUBATH M™ at room temperature to electroplate copper layer 144 on copper layer 142. Thereafter, the structure is removed from the electrolytic copper plating solution and submerged in an electrolytic nickel plating solution such as Technic Techni Nickel "S" at room temperature while current is applied to the plating bus to electroplate nickel layer 146 on copper layer 144. Thereafter, the structure is removed from the electrolytic nickel plating solution and submerged in an electrolytic gold plating solution such as Technic Orotemp at room temperature while current is applied to the plating bus to electroplate gold layer 148 on nickel layer 146.

Advantageously, copper 142 is blanket deposited on both pad 116 and the exposed nucleated dielectric surfaces of molded substrate 120 and provides a plating bus for rapidly depositing copper layer 144, the combination of copper layers 142 and 144 provide an excellent electrical conductor, nickel layer 146 prevents the formation of copper-gold intermetallics between copper layer 144 and gold layer 148 that may be brittle and/or difficult to remove when copper layers 142 and 144 are etched, and gold layer 148 facilitates selectively removing portions of metal layer 140 as described below. Furthermore, since the gold surface layer on pad 116 is extremely thin, no appreciable amount of copper-gold intermetallics forms between copper layer 142 and pad 116.

Figure 1D:
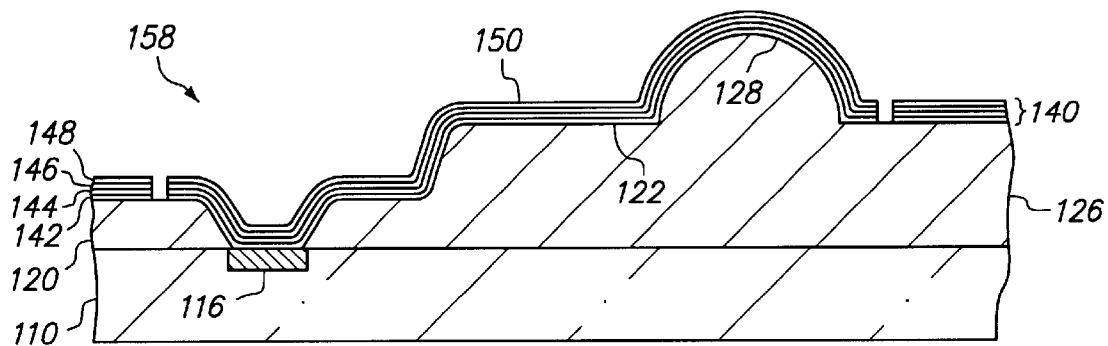
Figure 2D:
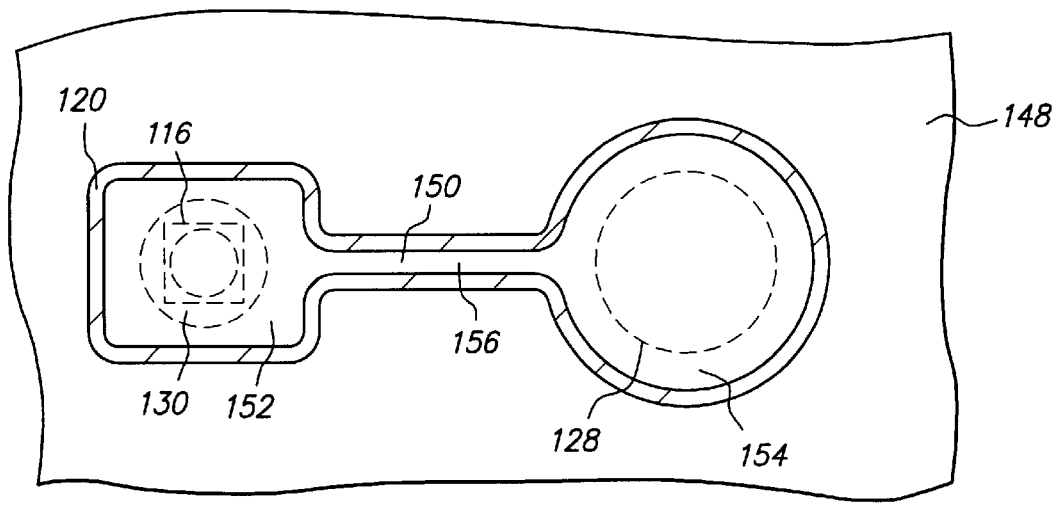

FIGS. 1D and 2D are cross-sectional and top views, respectively, of routing line 150 formed subtractively from metal layer 140. Routing line 150 covers bump 128, extends along top surface 122 to through-hole 130, covers and spans 360 degrees around the sidewalls of through-hole 130, extends through through-hole 130 and contacts pad 116. As a result, routing line 150 provides horizontal and vertical routing between the top of bump 128 and pad 116. Bump 128 is positioned closer than pad 116 to a central region of chip 110, so routing line 150 provides horizontal fan-in routing for pad 116. In addition, routing line 150 does not extend to any other pads on chip 110 or bumps on molded substrate 120. Instead, routing line 150 is an isolated electrical conductor between pad 116 and bump 128. Moreover, the compressibility of bump 128 and the underlying region of base 126 permits the portion of routing line 150 that covers bump 128 to provide a compressible, compliant contact terminal. That is, the portion of routing line 150 that covers bump 128 exhibits elastic deformation in response to vertically oriented external pressure directed towards top surface 122. As a result, the semiconductor chip assembly provides excellent vertical compliance for the next level assembly.

Routing line 150 includes enlarged rectangular region 152 that surrounds through-hole 130, enlarged circular region 154 that covers and surrounds bump 128, and routing region 156 therebetween. Rectangular region 152 has a width of 150 microns and a length of 250 microns, circular region 154 has a diameter of 250 microns, and routing region 156 has a width of 50 microns.

Routing line 150 is formed by applying multiple etch steps to metal layer 140. Initially, laser direct write is applied to gold layer 148 to define the periphery of routing line 150. The laser scans across and removes a 25 micron wide portion or track of gold layer 148 that begins and ends at the same location. Since the laser cuts through the portion of gold layer 148 it strikes, the laser also strikes the underlying portion of nickel layer 146. However, the laser does not cut through nickel layer 146 or reach copper layer 144. Instead, nickel layer 146 protects the underlying copper as well as molded substrate 120 and chip 110 from the laser.

The laser parameters such as wavelength, power density, beam size, scanning rate, etc. are chosen so that the laser cuts through gold layer 148 without cutting through nickel layer 146. For instance, Nd:YAG lasers provide a desirable balance between maximizing absorption in metals and minimizing absorption in polymer substrates. As reported in M. Greenstein, "Optical Absorption Aspects of Laser Soldering for High Density Interconnects," Applied Optics, Vol. 28, No. 21 (Nov. 1, 1989), Nd:YAG lasers at high frequencies in the range of 300 to 600 nm wavelengths can provide significantly more absorption of the laser energy in gold than the fundamental frequency 1064 nm wavelength. The frequency doubled 533 nm wavelength (green light) can be generated by directing a 1064 nm wavelength at a nonlinear doubling crystal such as potassium titanyl phosphate. A suitable laser direct write apparatus is the Model 5320 Laser Processing System produced by Electro Scientific Industries of Portland, Oregon. The Model 5320 provides a Nd:YAG laser at the frequency tripled 355 nm wavelength (UV light) as high energy pulses at a repetition rate of 15 to 30 KHz. Specific laser structuring methods for severing a metal layer on an injection molded polymeric substrate are also set forth in German Patent DE-A-37 32 249 and European Patent Application EP-A-0 361 192, as discussed in U.S. Pat. Nos. 5,929,516 and 6,122,172.

After the laser direct write is applied to define peripheral edges in gold layer 148, the structure is submerged in a first wet chemical etch that is highly selective of nickel with respect to gold. As a result, gold layer 148 as patterned by the laser direct write provides an etch mask for nickel layer 146, and the first wet chemical etch provides pattern transfer of the peripheral edges defined by the laser direct write through nickel layer 146 to copper layer 144. It is not critical that the nickel etching solution be highly selective of nickel with respect to copper since copper layers 142 and 144 will be subsequently etched as well. Nonetheless, copper layer 144 protects molded substrate 120 and chip 110 from the first wet chemical etch. A suitable nickel etching solution can be provided by a solution containing a dilute mixture of nitric and hydrochloric acid.

Thereafter, the structure is submerged in a second wet chemical etch that is highly selective of copper with respect to gold. As a result, gold layer 148 as patterned by the laser direct write provides an etch mask for copper layers 142 and 144, and the second wet chemical etch provides pattern transfer of the peripheral edges defined by the laser direct write through copper layers 142 and 144 to base 126. The second wet chemical etch is not selective of molded substrate 120, and therefore no appreciable amount of molded substrate 120 is removed. A suitable copper etching solution can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for applying the first and second wet chemical etches in order to form the outer edges of routing line 150 with the desired dimensions and undercut can be established through trial and error.

At this stage, semiconductor chip assembly 158 which includes chip 110, molded substrate 120 and routing line 150 can be considered complete. Molded substrate 120 is mechanically coupled to chip 110 due to the transfer molding operation, and routing line 150 provides horizontal and vertical electrical routing for pad 116. Semiconductor chip assembly 158 includes other routing lines formed from metal layer 140 by laser direct write and the two wet chemical etches, and only a single routing line 150 is shown for convenience of illustration. The other routing lines are each connected to a respective pad on chip 110, extend through a respective through-hole in base 126, and extend along top surface 122 to and cover a respective bump above base 126. In addition, the routing lines are electrically isolated from one another. If desired, solder balls can be screen printed on portions of the routing lines that cover the bumps to provide connections to the next level assembly. Finally, chip 110 is singulated from other chips on the wafer, thereby singulating assembly 158 from other assemblies, so that assembly 158 forms a chip size package.

FIGS. 3A–3E and 4A–4E are cross-sectional and top views, respectively, of a method of manufacturing a semiconductor chip assembly in accordance with a second embodiment of the present invention. In the second embodiment, the molded substrate is formed on the chip by transfer molding. However, the through-hole is not formed during the transfer molding. Instead, the through-hole is formed by laser drilling after the transfer molding. Thereafter, the metal layer is deposited on the molded substrate and into the through-hole and on the pad, and a portion of the metal layer is selectively removed to form the routing line. Thus, the primary difference between the first and second embodiments is that in the second embodiment the through-hole is formed by laser drilling after the transfer molding operation. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, molded substrate 220 corresponds to molded substrate 120, etc.

Figure 3A:
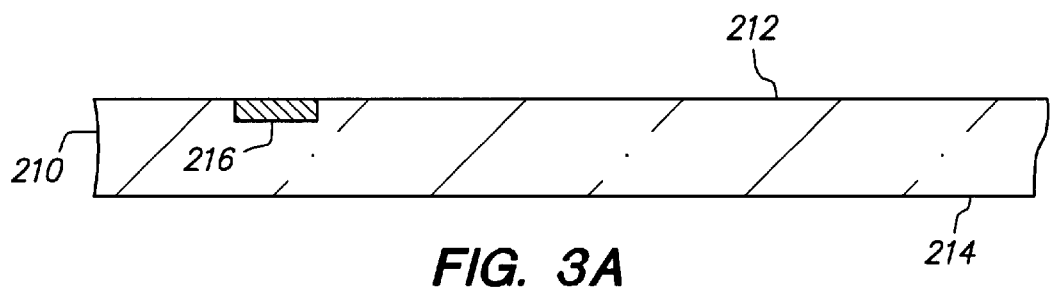
FIGS. 3A–3E are cross-sectional views showing a method of manufacturing a semiconductor chip assembly in accordance with a second embodiment of the present invention in which the molded substrate is formed on the chip by transfer molding and then the through-hole is formed by laser drilling.
Figure 4A:
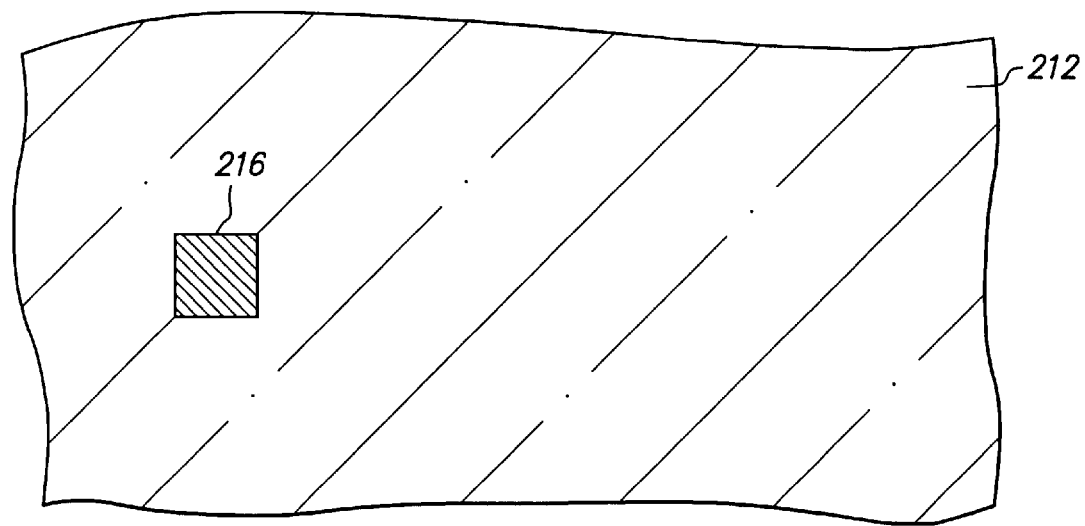
FIGS. 4A–4E are top plan views corresponding to FIGS. 3A–3E, respectively.

FIGS. 3A and 4A are cross-sectional and top views, respectively, of semiconductor chip 210 that includes upper surface 212, lower surface 214 and pad 216.

Figure 3B:
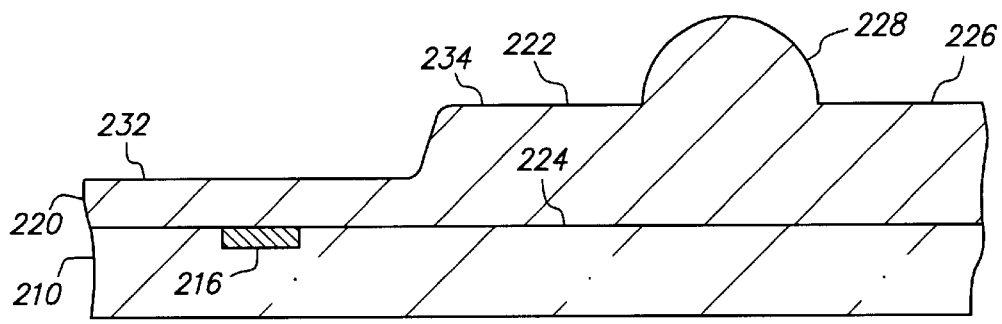
Figure 4B:
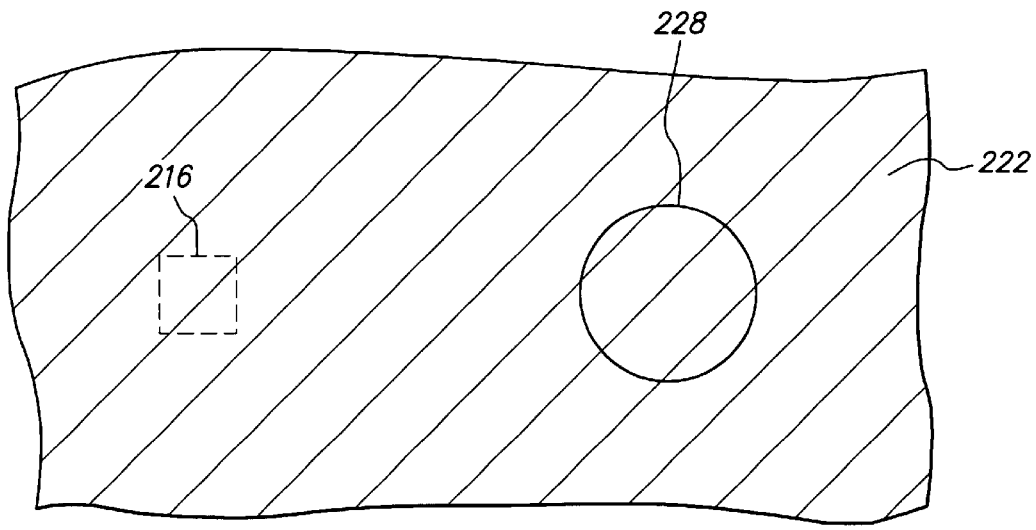

FIGS. 3B and 4B are cross-sectional and top views, respectively, of molded substrate 220 molded on chip 210. Molded substrate 220 includes top surface 222, bottom surface 224, base 226 and bump 228. Base 226 includes recessed portion 232 and non-recessed portion 234. However, molded substrate 220 is devoid of through-holes. Therefore, molded substrate 220 covers pad 216.

Figure 3C:
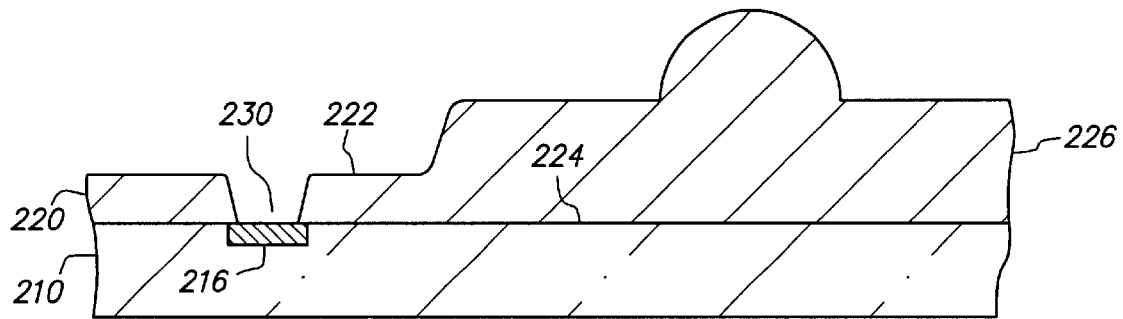
Figure 4C:
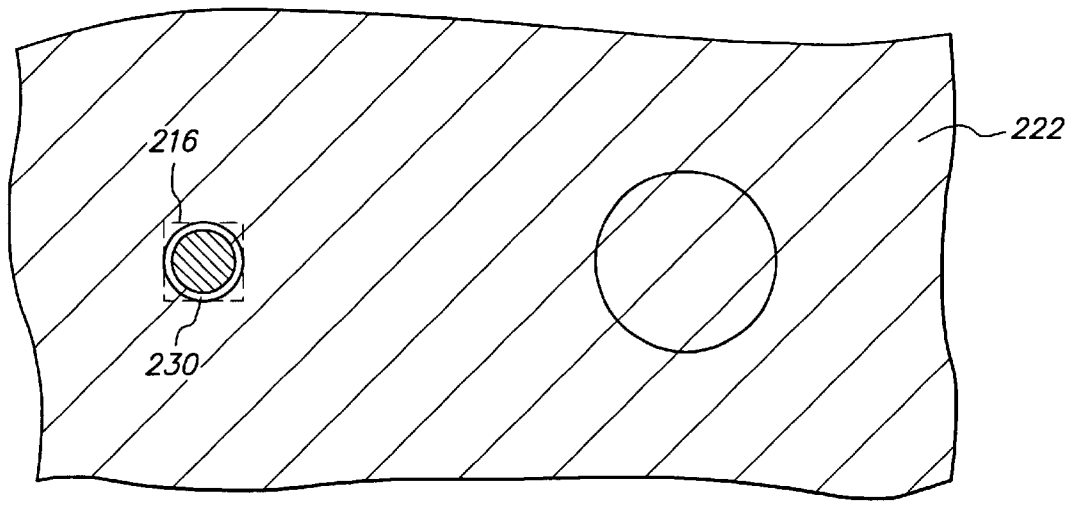

FIGS. 3C and 4C are cross-sectional and top views, respectively, of molded substrate 220 molded on chip 210 after through-hole 230 is formed in molded substrate 220 by laser drilling. Through-hole 230 has a diameter of 75 microns at top surface 222, a diameter of 65 microns at bottom surface 224, and tapered sidewalls therebetween. Thus, through-hole 230 has a conical shape in which the diameter increases as the height increases. In addition, the location of through-hole 230 is chosen so that pad 216 is aligned with and exposed by through-hole 230. After the laser cuts through base 226 it strikes pad 216. However, the laser does not deform or remove an appreciable amount of pad 216. Instead, pad 216 provides an etch stop for the laser. A suitable laser drilling apparatus is the Model 5320 Laser Processing System mentioned above. The Model 5320 can be adjusted for laser drilling through-hole 230 by decreasing the power density, decreasing the pulse rate and defocusing the beam, and then adjusted for laser etching gold layer 248 to define the periphery of routing line 250 by increasing the power density, increasing the pulse rate and focusing the beam. Furthermore, during the laser drilling operation, a lens can be used to focus the laser beam on bottom surface 224 and redirect parallel light into non-parallel light to provide through-hole 230 with tapered sidewalls.

Figure 3D:
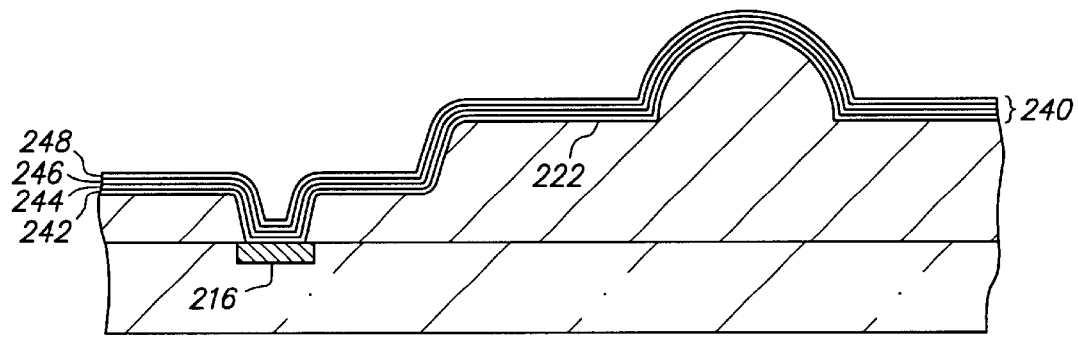
Figure 4D:
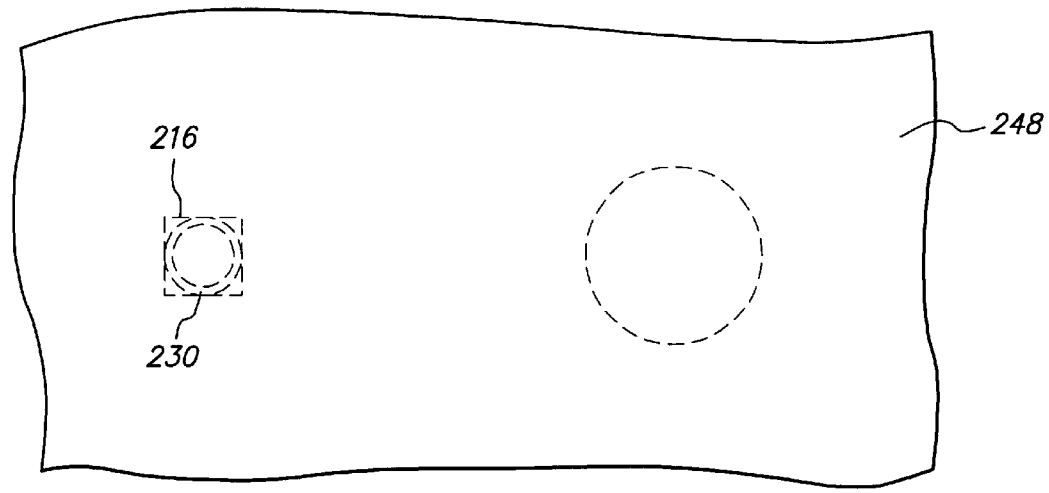

FIGS. 3D and 4D are cross-sectional and top bottom views, respectively, of metal layer 240 formed on top surface 222, the sidewalls of through-hole 230, and pad 216. Metal layer 240 includes copper layer 242, copper layer 244, nickel layer 246 and gold layer 248.

Figure 3E:
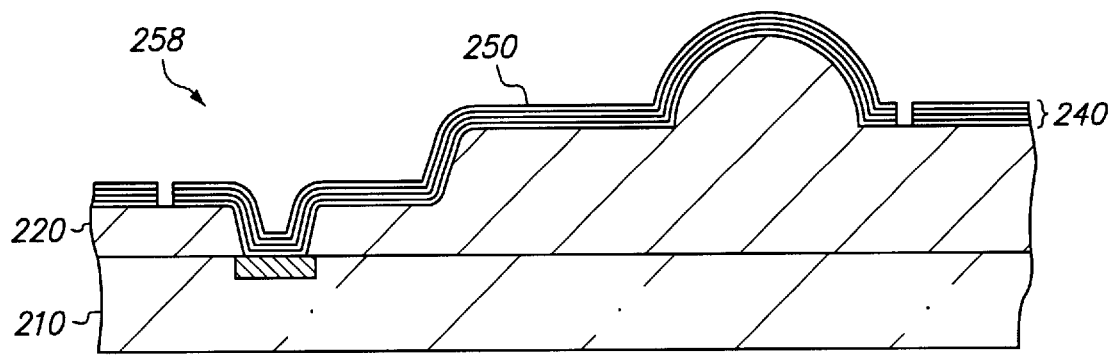
Figure 4E:
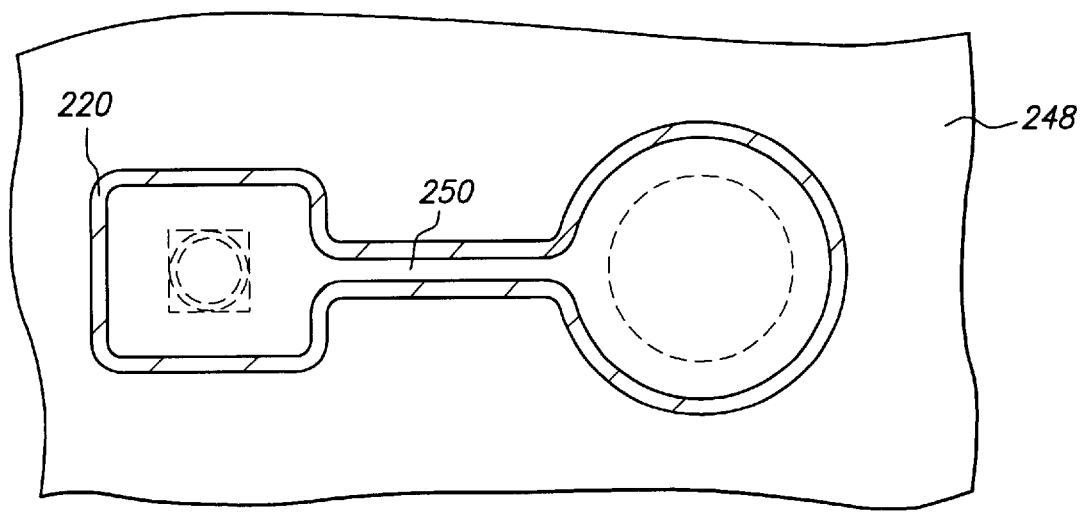

FIGS. 3E and 4E are cross-sectional and top bottom views, respectively, of routing line 250 subtractively formed from metal layer 240. Semiconductor chip assembly 258 includes chip 210, molded substrate 220 and routing line 250.

FIGS. 5A–5F and 6A–6F are cross-sectional and top views, respectively, of a method of manufacturing a semiconductor chip assembly in accordance with a third embodiment of the present invention. In the third embodiment, the molded substrate is formed and attached to the chip by transfer molding. However, the molded substrate is not molded on the chip. Instead, an adhesive is deposited on the chip, and then the molded substrate is molded on the adhesive. Thereafter, an opening is formed in the adhesive below the through-hole to expose the pad, the metal layer is deposited on the molded substrate and into the through-hole and on the pad, and a portion of the metal layer is selectively removed to form the routing line. In addition, the opening in the adhesive provides a pattern transfer of the through-hole to the pad. Thus, the primary difference between the first and third embodiments is that in the third embodiment the molded substrate is molded on an adhesive on the chip. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, molded substrate 320 corresponds to molded substrate 120, etc.

Figure 5A:
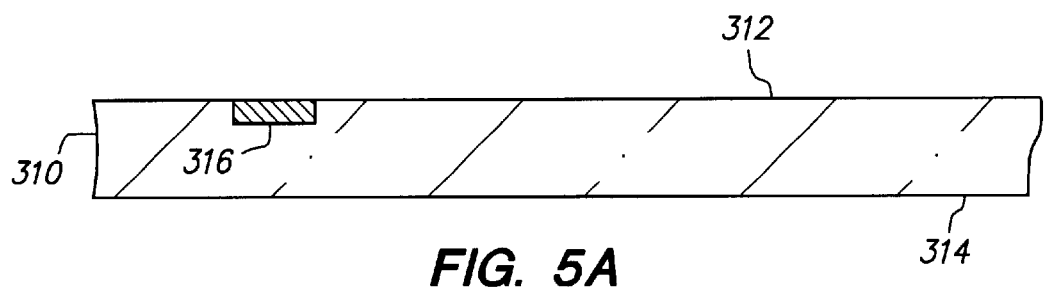
FIGS. 5A–5F are cross-sectional views showing a method of manufacturing a semiconductor chip assembly in accordance with a third embodiment of the present invention in which an adhesive is placed on the chip and then the molded substrate is formed on the adhesive by transfer molding.
Figure 6A:
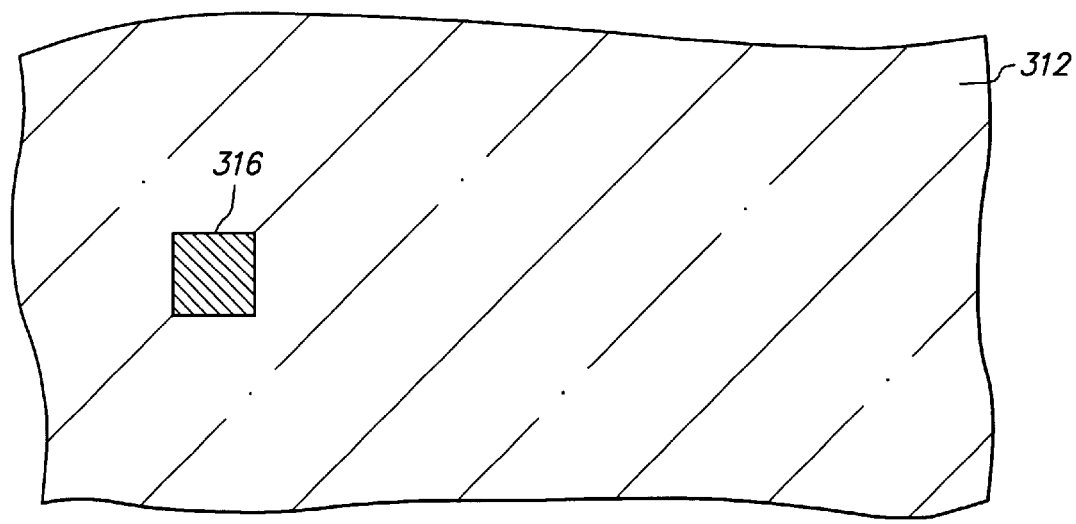
FIGS. 6A–6F are top plan views corresponding to FIGS. 5A–5F, respectively.

FIGS. 5A and 6A are cross-sectional and top views, respectively, of semiconductor chip 310 that includes upper surface 312, lower surface 314 and pad 316.

Figure 5B:
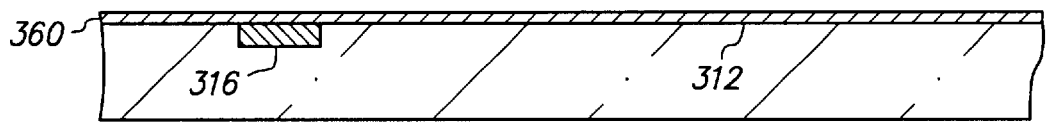
Figure 6B:
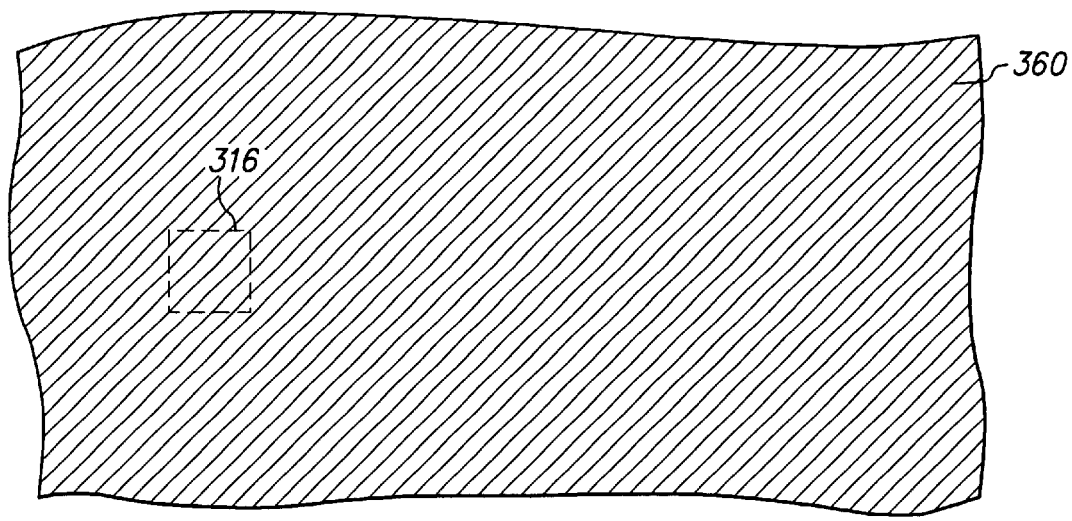

FIGS. 5B and 6B are cross-sectional and top views, respectively, of adhesive 360 deposited on upper surface 312. Adhesive 360 is an electrical insulator that covers upper surface 312 including pad 316. Preferably, adhesive 360 is initially applied to upper surface 312 as an epoxy paste (A stage) using spin-coating. The epoxy paste includes an epoxy resin, a curing agent, an accelerator and a filler. The filler is an inert material such as silica (powdered fused quartz) that provides thermal coefficient of expansion matching. A suitable epoxy paste is Ablestik ABELBOND 961-2™. Thereafter, the epoxy paste is partially cured or hardened (B stage) at relatively low temperature in the range of 100 to 150° C. without fully curing (C stage) the epoxy.

Figure 5C:
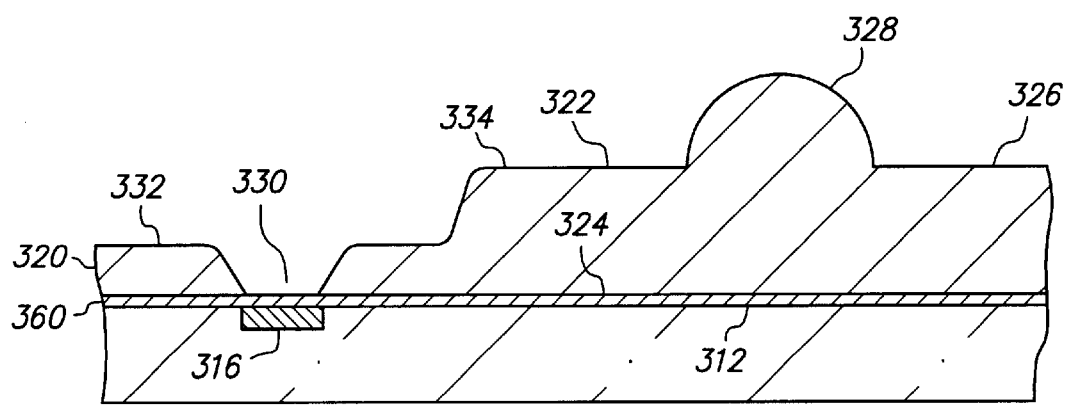
Figure 6C:
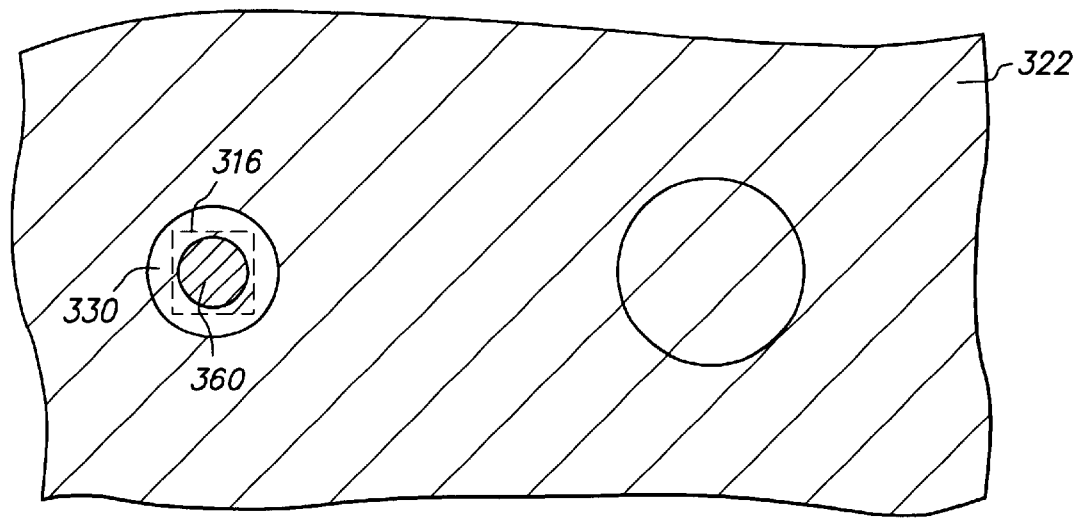

FIGS. 5C and 6C are cross-sectional and top views, respectively, of molded substrate 320 molded on adhesive 360. Molded substrate 320 includes top surface 322, bottom surface 324, base 326, bump 328 and through-hole 330. Base 326 includes recessed portion 332 and non-recessed portion 334. However, upper surface 312 does not contact bottom surface 324. Instead, adhesive 360 is sandwiched between upper surface 312 and bottom surface 324. Through-hole 330 does not expose pad 316 which remains covered by adhesive 360. In addition, the transfer molding operation that forms molded substrate 320 on adhesive 360 also fully cures and hardens adhesive 360 (C stage) which is 2 microns thick.

Figure 5D:
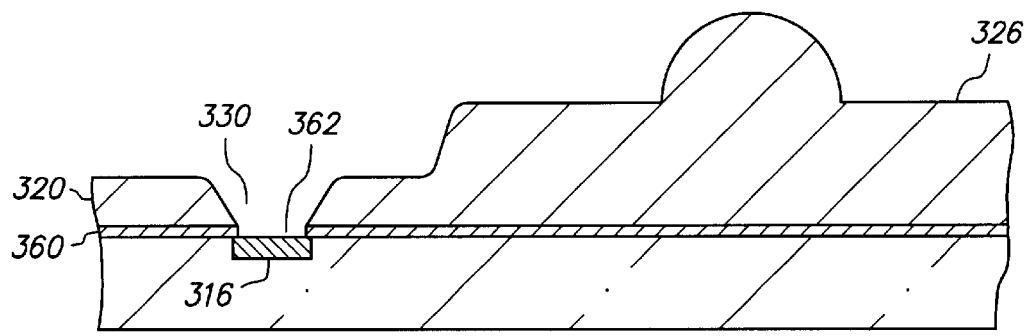
Figure 6D:
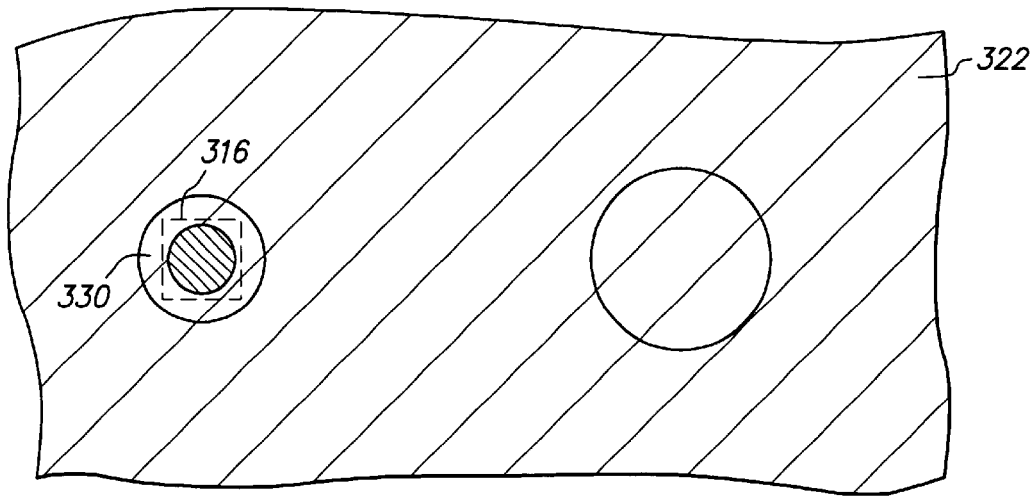

FIGS. 5D and 6D are cross-sectional and top views, respectively, of opening 362 formed in adhesive 360. In particular, the portion of adhesive 360 exposed by through-hole 330 is selectively removed using molded substrate 320 as an etch mask so that pad 316 is exposed by through-hole 330 and opening 362. This can be achieved by applying a suitable etch that is highly selective of adhesive 360 with respect to pad 316. The preferred etch depends on the relative thickness of adhesive 360 and base 326. Most etches exhibit little or no selectivity of adhesive 360 with respect to base 326. That is, adhesive 360 and base 326 etch at about the same rate. In this instance, adhesive 360 is relatively thin compared to base 326, so a blanket plasma etch can be applied to remove the portion of adhesive 360 exposed by through-hole 330. The plasma etch removes any adhesive 360 that resides in through-hole 330 as well as any adhesive 360 directly below through-hole 330, thereby forming opening 362 and exposing pad 316. The plasma etch also removes a few microns from top surface 322, which has no appreciable effect on molded substrate 320. As a result, opening 362 is formed in adhesive 360 without damaging pad 316 or molded substrate 320. Opening 362 is axially aligned with through-hole 330, has an essentially identical diameter to the bottom of through-hole 330, and provides an extension or pattern transfer of through-hole 330 through adhesive 360 to pad 316.

Figure 5E:
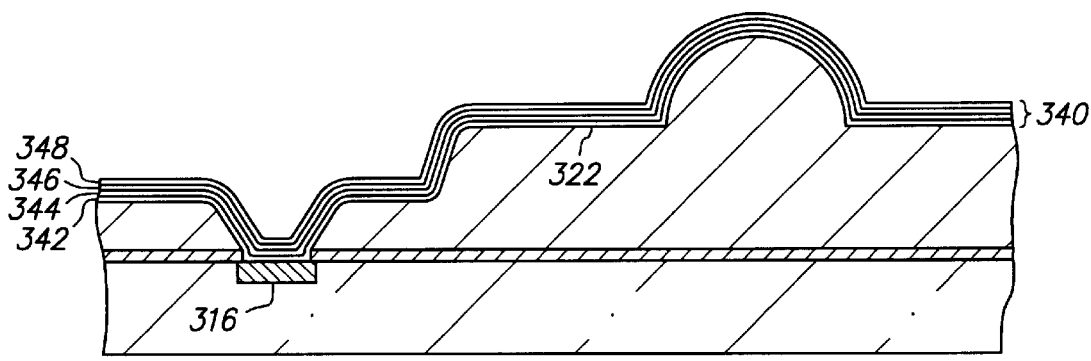
Figure 6E:
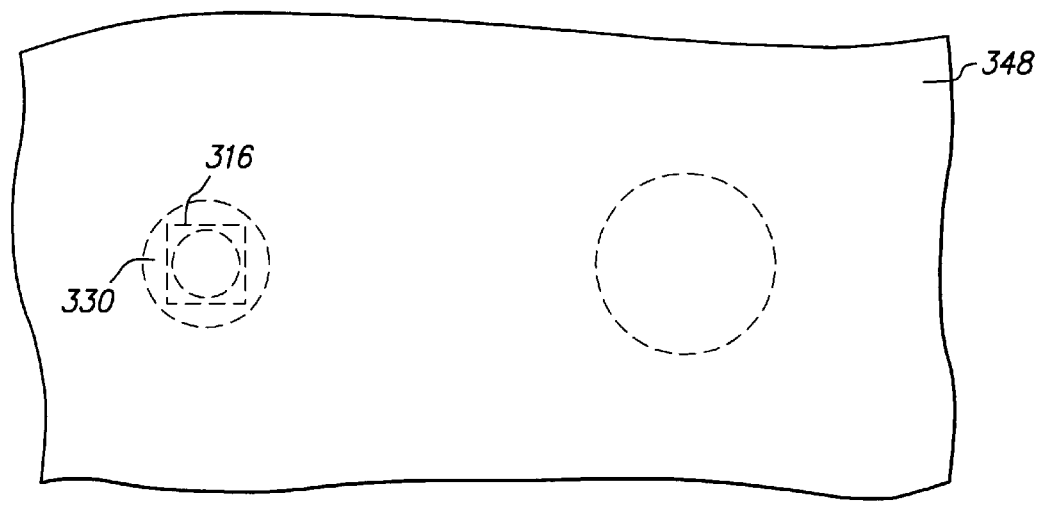

FIGS. 5E and 6E are cross-sectional and top bottom views, respectively, of metal layer 340 formed on top surface 322, the sidewalls of through-hole 330 and opening 362, and pad 316. Metal layer 340 includes copper layer 342, copper layer 344, nickel layer 346 and gold layer 348.

Figure 5F:
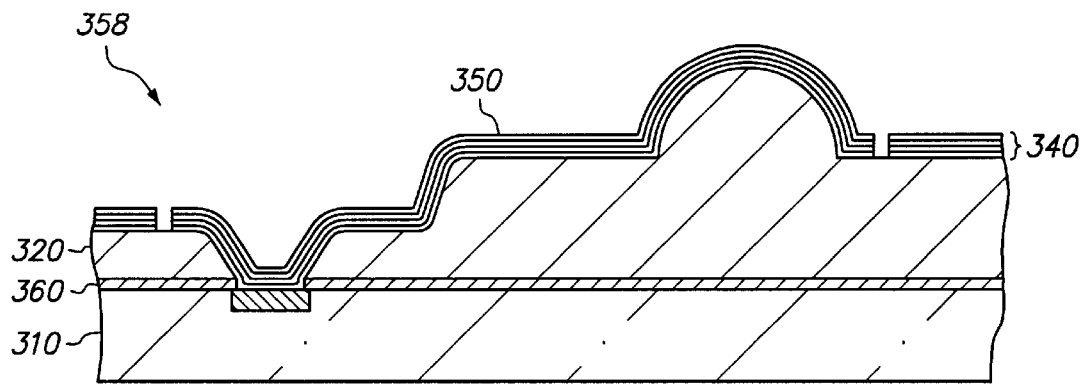
Figure 6F:
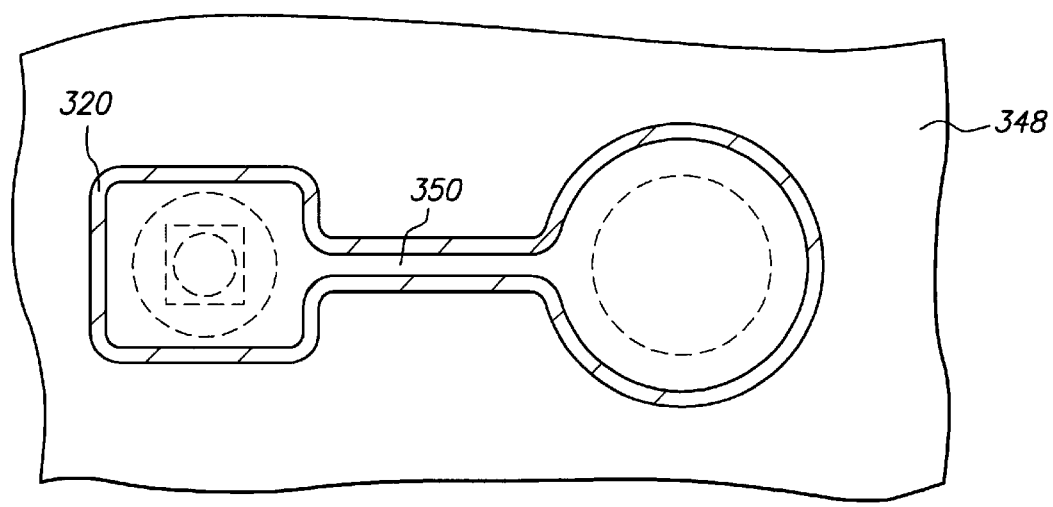

FIGS. 5F and 6F are cross-sectional and top bottom views, respectively, of routing line 350 subtractively formed from metal layer 340. Semiconductor chip assembly 358 includes chip 310, molded substrate 320, routing line 350 and adhesive 360.

FIGS. 7A–7F and 8A–8F are cross-sectional and top views, respectively, of a method of manufacturing a semiconductor chip assembly in accordance with a fourth embodiment of the present invention. In the fourth embodiment, the molded substrate is formed and attached to the chip by transfer molding. However, the molded substrate is not molded on the chip. Instead, an adhesive is deposited on the chip, and then the molded substrate is molded on the adhesive. Thereafter, an opening is formed in the adhesive below the through-hole to expose the pad, the metal layer is deposited on the molded substrate and into the through-hole and on the adhesive and the pad, and a portion of the metal layer is selectively removed to form the routing line. In addition, the through-hole is substantially larger than the opening in the adhesive and the pad. Thus, the primary difference between the first and fourth embodiments is that in the fourth embodiment the molded substrate is molded on an adhesive on the chip and the through-hole is enlarged. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, molded substrate 420 corresponds to molded substrate 120, etc.

Figure 7A:
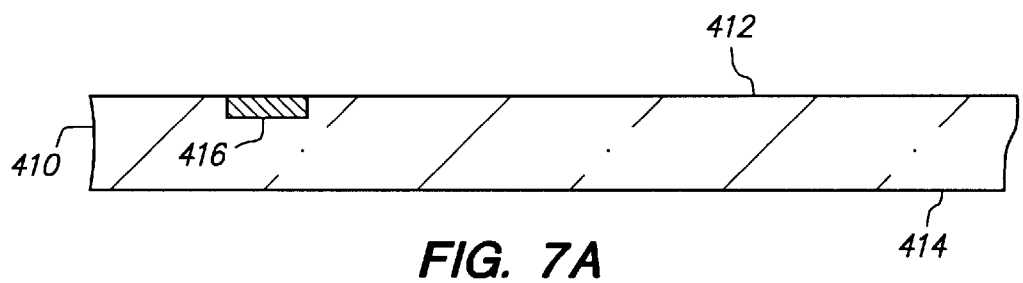
FIGS. 7A–7F are cross-sectional views showing a method of manufacturing a semiconductor chip assembly in accordance with a fourth embodiment of the present invention in which an adhesive is placed on the chip and then the molded substrate with an enlarged through-hole is formed on the adhesive by transfer molding.
Figure 8A:
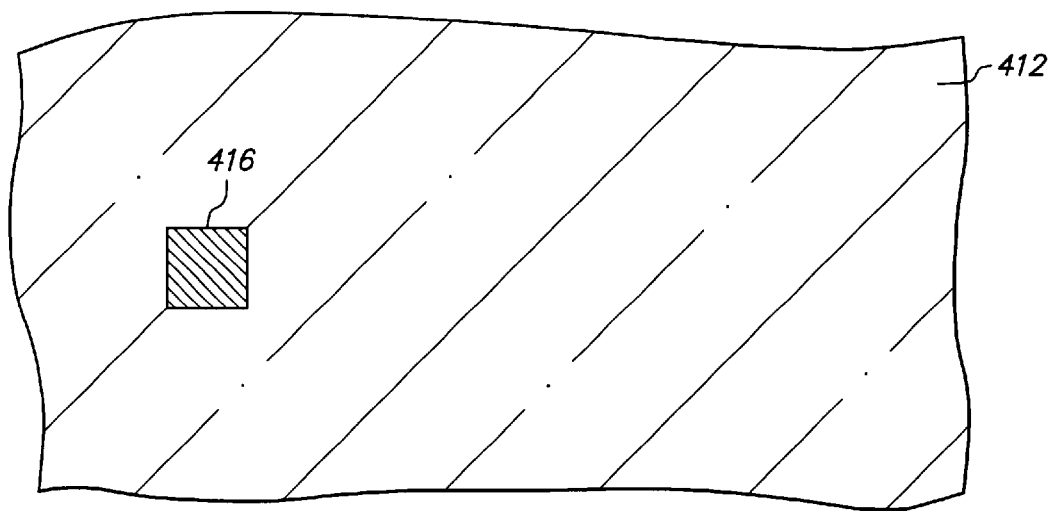
FIGS. 8A–8F are top plan views corresponding to FIGS. 7A–7F, respectively.

FIGS. 7A and 8A are cross-sectional and top views, respectively, of semiconductor chip 410 that includes upper surface 412, lower surface 414 and pad 416.

Figure 7B:
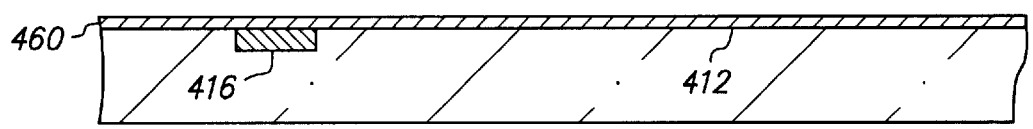
Figure 8B:
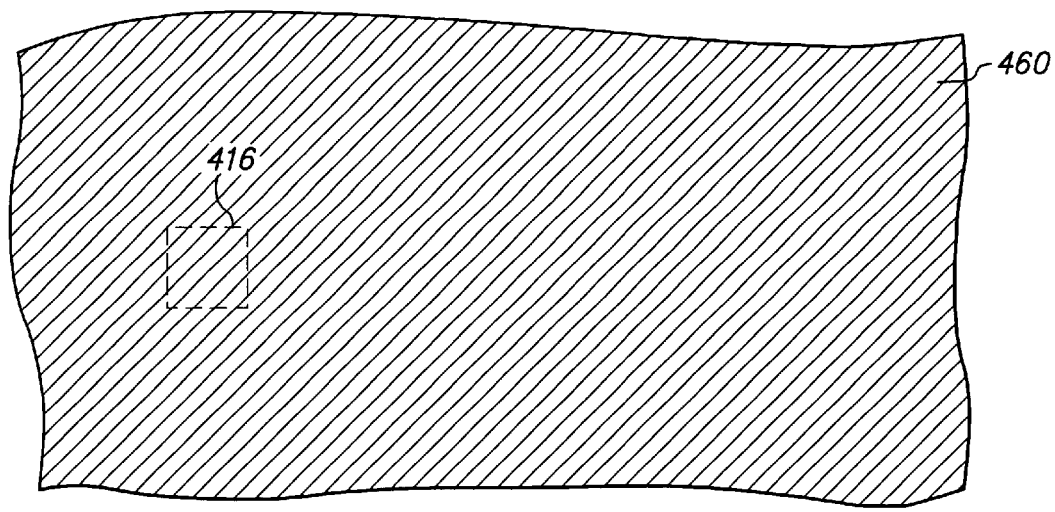

FIGS. 7B and 8B are cross-sectional and top views, respectively, of adhesive 460 deposited on upper surface 412. Adhesive 460 is an electrical insulator that covers upper surface 412 including pad 416. Preferably, adhesive 460 is initially applied to upper surface 412 as an epoxy paste (A stage) using spin-coating. The epoxy paste is similar to that used for adhesive 360. Thereafter, the epoxy paste is partially cured or hardened (B stage) at relatively low temperature in the range of 100 to 150° C. without fully curing (C stage) the epoxy.

Figure 7C:
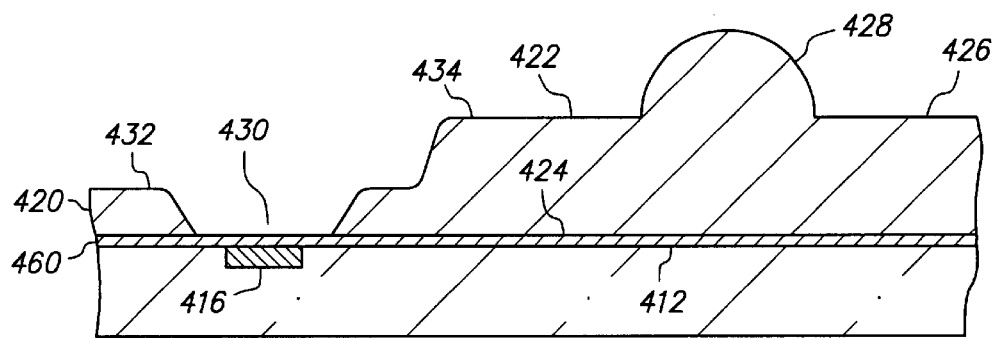
Figure 8C:
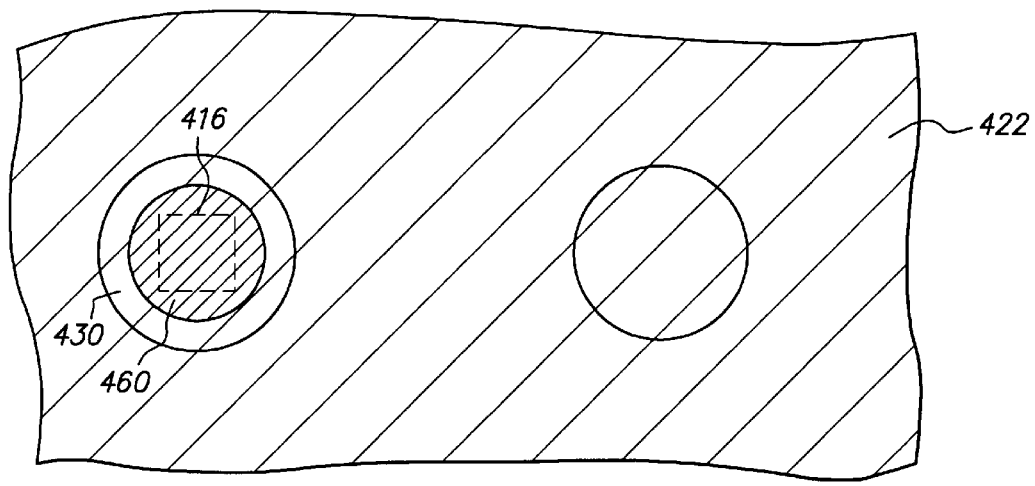

FIGS. 7C and 8C are cross-sectional and top views, respectively, of molded substrate 420 molded on adhesive 460. Molded substrate 420 includes top surface 422, bottom surface 424, base 426, bump 428 and through-hole 430. Base 426 includes recessed portion 432 and non-recessed portion 434. Through-hole 430 has a diameter of 200 microns at top surface 422, a diameter of 150 microns at bottom surface 424, and tapered sidewalls therebetween. Thus, through-hole 430 has a conical shape in which the diameter increases as the height increases and is substantially larger than through-hole 130. Pad 416 is aligned with and centered within through-hole 430. Since the 150 micron diameter of through-hole 430 at bottom surface 424 exceeds the 75 micron length and width of pad 416, all of pad 416 is directly beneath through-hole 430. Upper surface 412 does not contact bottom surface 424. Instead, adhesive 460 is sandwiched between upper surface 412 and bottom surface 424. Through-hole 430 does not expose pad 416 which remains covered by adhesive 460. In addition, the transfer molding operation that forms molded substrate 420 on adhesive 460 also fully cures and hardens adhesive 460 (C stage) which is 2 microns thick.

Figure 7D:
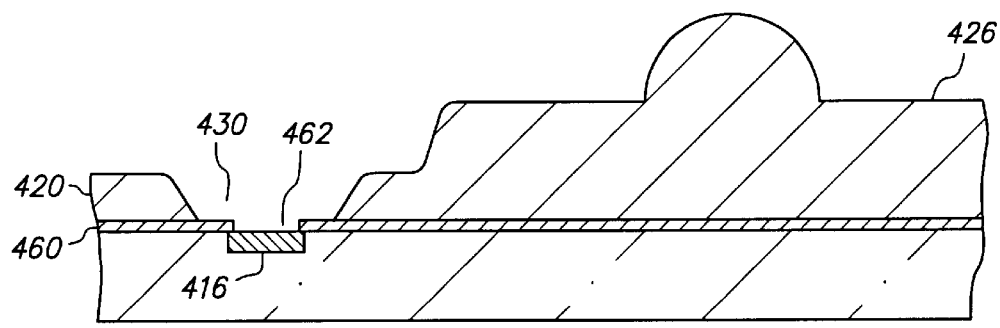
Figure 8D:
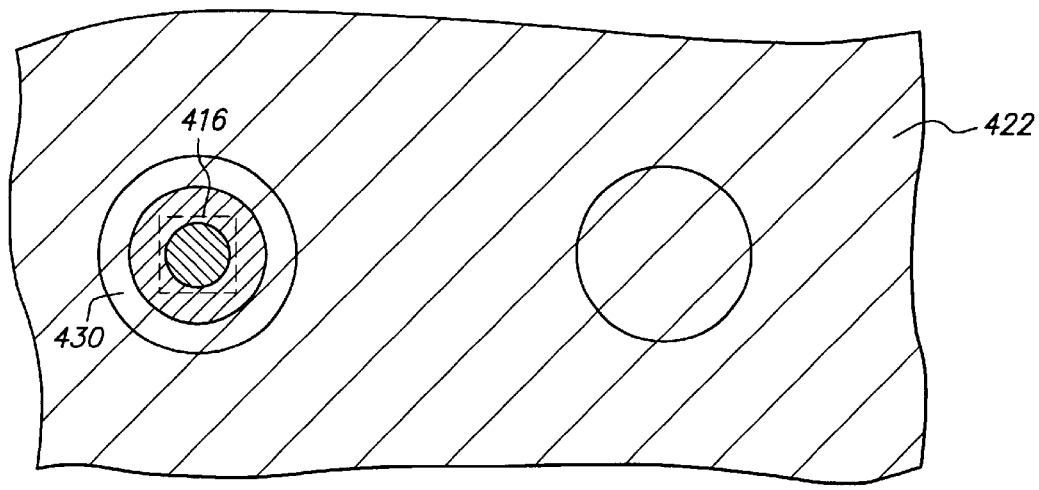

FIGS. 7D and 8D are cross-sectional and top views, respectively, of opening 462 formed in adhesive 460. In particular, a portion of adhesive 460 exposed by through-hole 430 that covers a central portion of pad 416 and is spaced from the sidewalls of through-hole 430 is selectively removed without using molded substrate 420 as an etch mask so that pad 416 is exposed by through-hole 430 and opening 462. This can be achieved by applying an etch that is highly selective of adhesive 460 with respect to pad 416. In this instance, a selective laser etch is applied. A suitable laser etching apparatus is the Model 5320 Laser Processing System mentioned above which is adjusted in a similar manner as described above for laser drilling through-hole 230. The laser is directed at a central portion of pad 416. After the laser removes whatever adhesive 460 is directly above the central portion of pad 416 it strikes pad 416. However, the laser does not strike the peripheral portion of pad 416 or molded substrate 420. Nor does the laser deform or remove an appreciable amount of pad 416. Instead, pad 416 provides an etch stop for the laser. The laser forms opening 462 with a 65 micron diameter. As a result, opening 462 is essentially identical to opening 362. Since the 75 micron length and width of pad 416 exceeds the 65 micron diameter of opening 462, all of pad 116 cannot be directly beneath opening 462. Instead, a central portion of pad 416 is directly beneath and exposed by opening 462, and a peripheral portion of pad 416 is covered by adhesive 460 and outside opening 462. Through-hole 430 and opening 462 have substantially different diameters but are axially aligned with one another and together expose pad 416. In addition, adhesive 460 has a portion of its top surface adjacent to opening 462 that is within and exposed by through-hole 430. This portion of the top surface of adhesive 460 extends between the sidewalls of through-hole 430 and the sidewalls of opening 462.

Figure 7E:
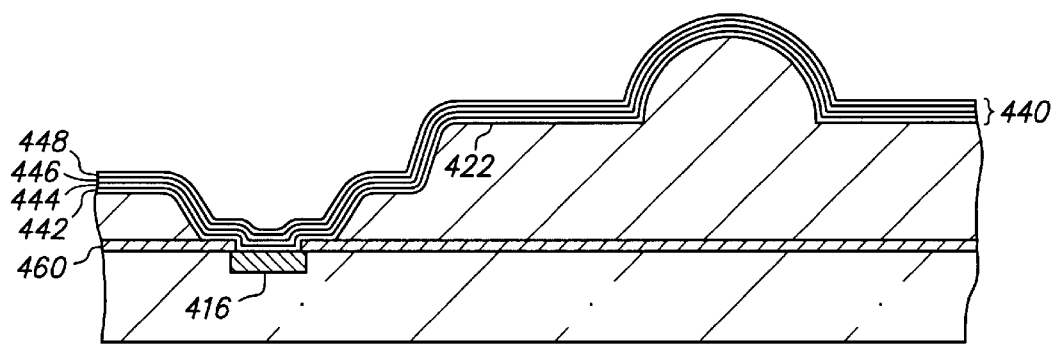
Figure 8E:
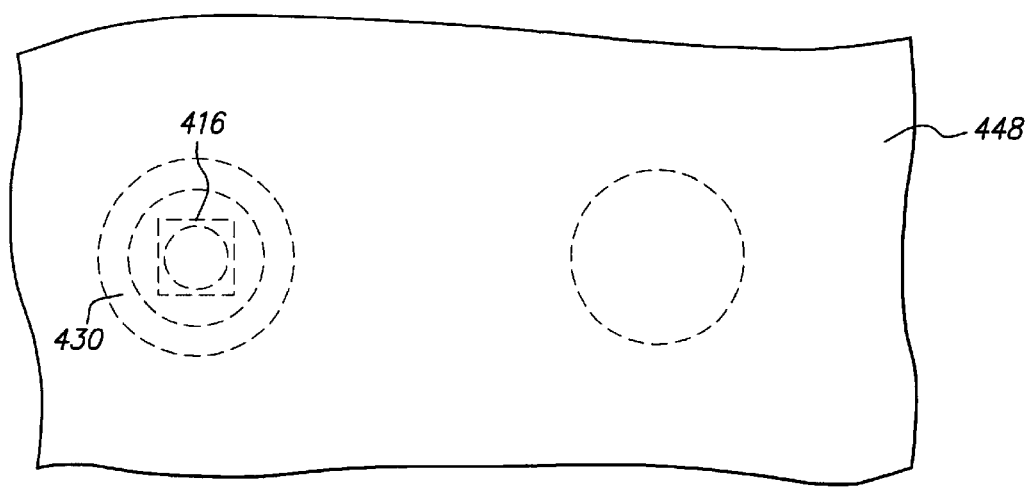

FIGS. 7E and 8E are cross-sectional and top bottom views, respectively, of metal layer 440 formed on top surface 422, the sidewalls of through-hole 430, the portion of the top surface of adhesive 460 exposed by through-hole 430, the sidewalls of opening 462, and pad 416. Metal layer 440 includes copper layer 442, copper layer 444, nickel layer 446 and gold layer 448. It is noted that the copper activator solution that renders molded substrate 420 catalytic to electroless copper also renders the exposed portion of the top surface of adhesive 460 catalytic to electroless copper.

Figure 7F:
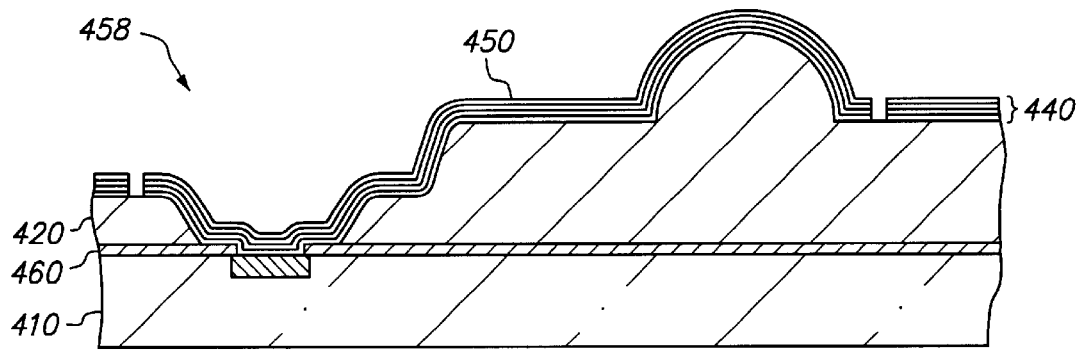
Figure 8F:
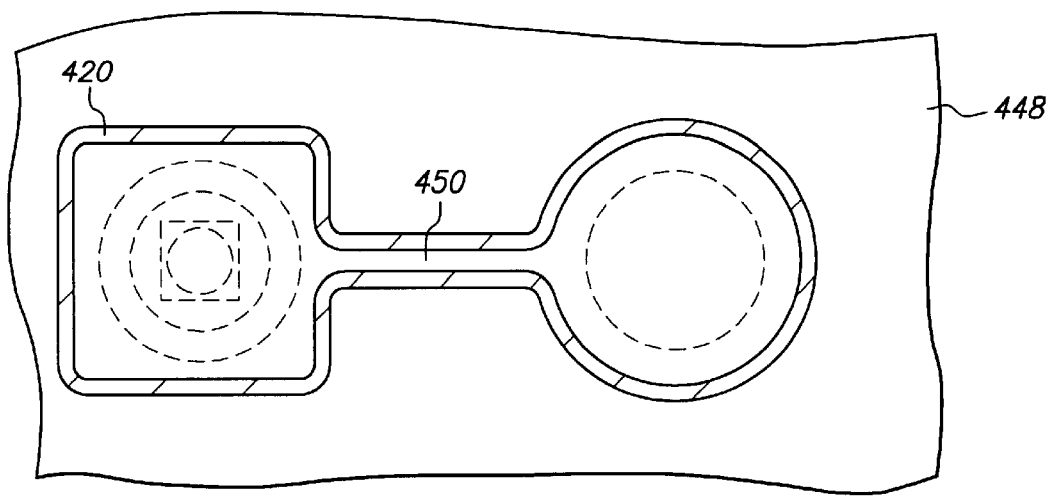

FIGS. 7F and 8F are cross-sectional and top bottom views, respectively, of routing line 450 subtractively formed from metal layer 440. Semiconductor chip assembly 458 includes chip 410, molded substrate 420, routing line 450 and adhesive 460.

FIGS. 9A–9F and 10A–10F are cross-sectional and top views, respectively, of a method of manufacturing a semiconductor chip assembly in accordance with a fifth embodiment of the present invention. In the fifth embodiment, the chip is singulated from other chips on the wafer and then attached to the molded substrate, and the molded substrate is formed by transfer molding and then attached to the chip. In addition, the molded substrate does not contact the chip. Instead, an adhesive is sandwiched between the molded substrate and the chip. Thereafter, an opening is formed in the adhesive below the through-hole to expose the pad, the metal layer is deposited on the molded substrate and into the through-hole and on the pad, and a portion of the metal layer is selectively removed to form the routing line. Furthermore, the molded substrate has a larger surface area than the chip, and the bump fans-out from the pad and is located outside the periphery of the chip. Thus, the primary difference between the first and fifth embodiments is that in the fifth embodiment the molded substrate is formed and then adhesively attached to the singulated chip to form a grid array that is larger than a chip size package. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, molded substrate 520 corresponds to molded substrate 120, etc.

Figure 9A:
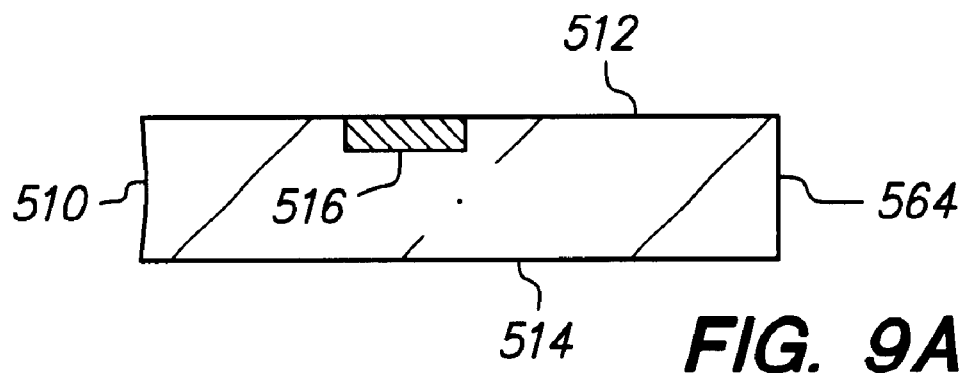
FIGS. 9A–9F are cross-sectional views showing a method of manufacturing a semiconductor chip assembly in accordance with a fifth embodiment of the present invention in which the molded substrate is formed by transfer molding and then attached to the substrate by an adhesive.
Figure 10A:
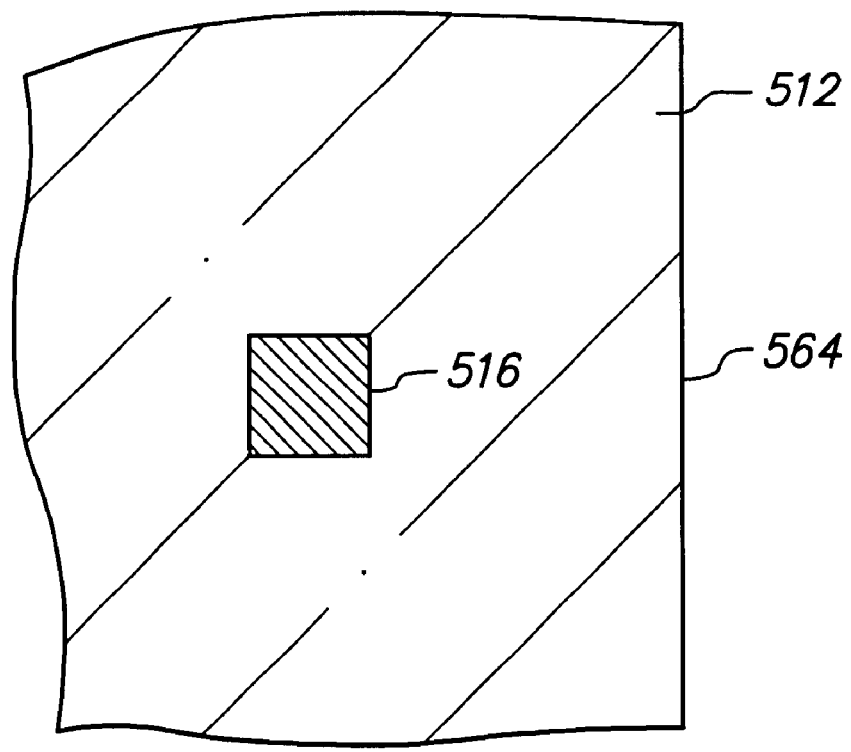
FIGS. 10A–10F are top plan views corresponding to FIGS. 9A–9F, respectively.

FIGS. 9A and 10A are cross-sectional and top views, respectively, of semiconductor chip 510 that includes upper surface 512, lower surface 514 and pad 516. Chip 510 has already been singulated from other chips on a wafer and includes outer edge 564 proximate to pad 516. Outer edge 564 is one of four outer edges of chip 510 between upper surface 512 and lower surface 514.

Figure 9B:
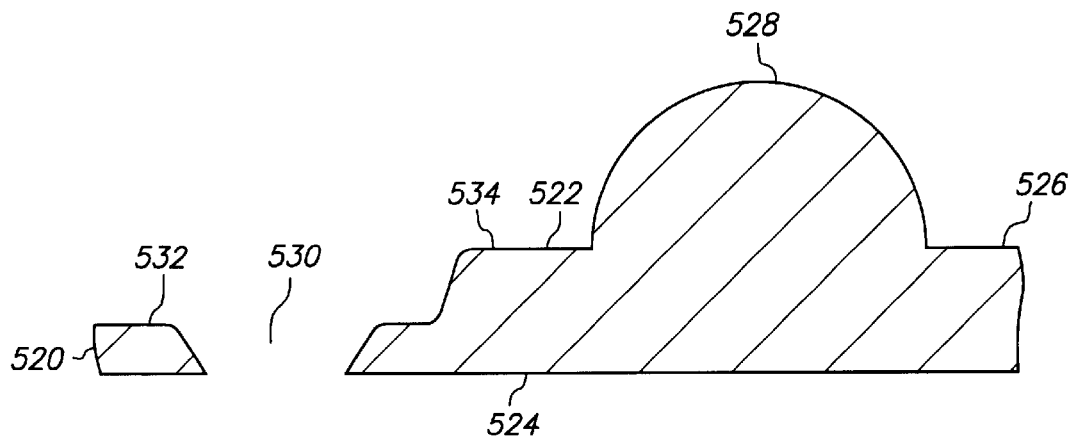
Figure 10B:
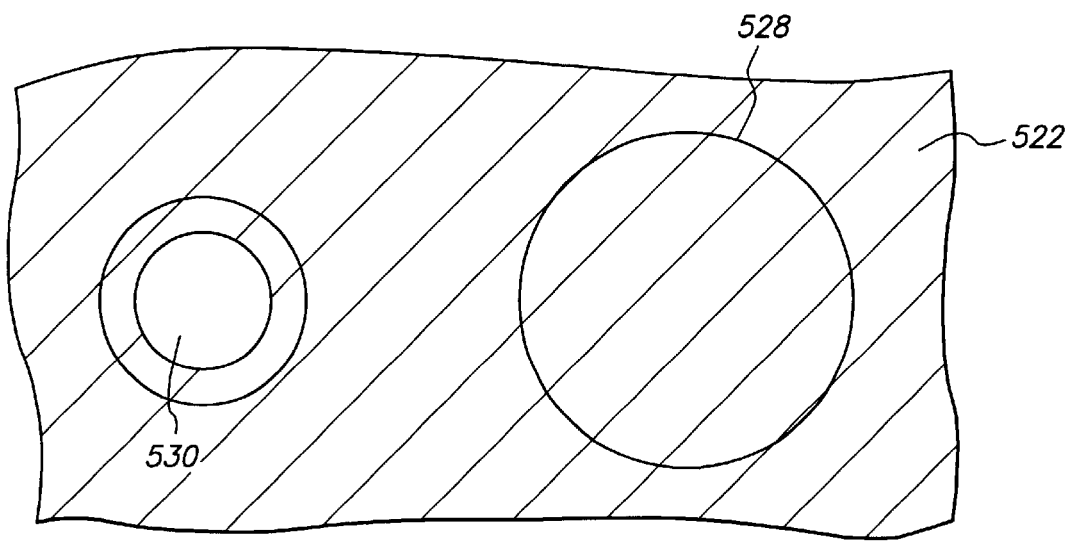

FIGS. 9B and 10B are cross-sectional and top views, respectively, of molded substrate 520. Molded substrate 520 includes top surface 522, bottom surface 524, base 526, bump 528 and through-hole 530. Base 526 includes recessed portion 532 and non-recessed portion 534. Bump 528 is a hemisphere with a radius of 500 microns. Thus, bump 528 extends 500 microns above base 526 and is substantially larger than bump 128. Through-hole 530 is similar to through-hole 430.

Figure 9C:
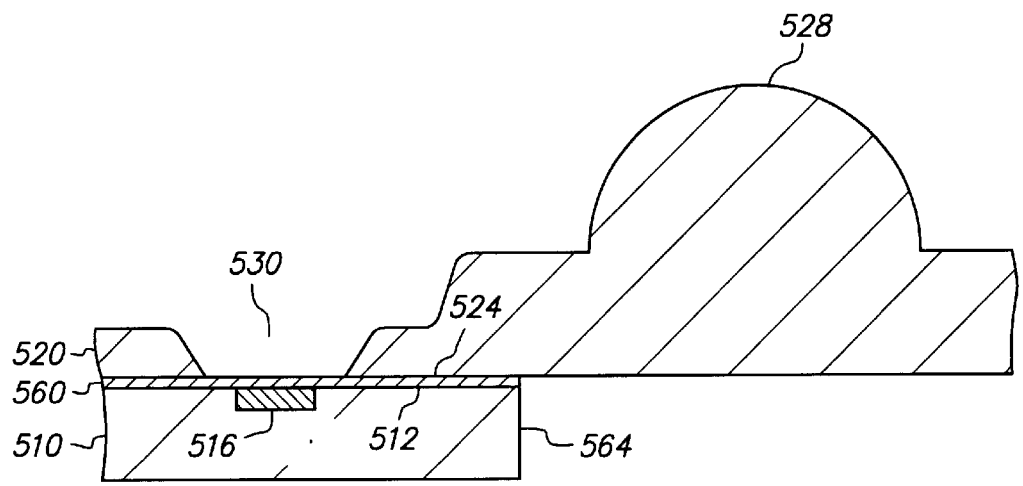
Figure 10C:
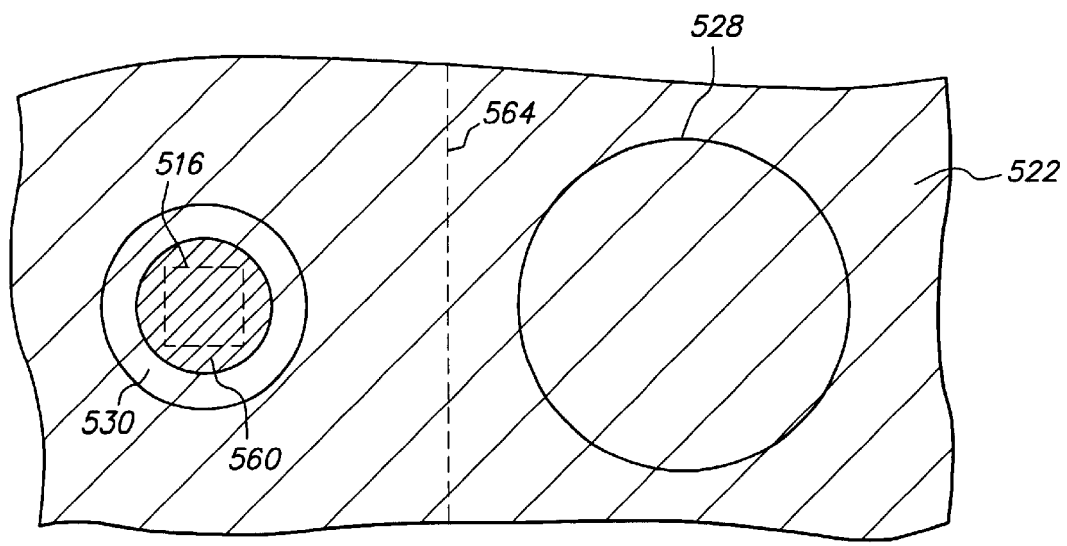

FIGS. 9C and 10C are cross-sectional and top views, respectively, of molded substrate 520 attached to chip 510 by adhesive 560 after molded substrate 520 has been formed. Adhesive 560 is an electrical insulator with a thickness of 2 microns. Preferably, adhesive 560 is initially applied to upper surface 512 as an epoxy paste (A stage) using spin-coating. The epoxy paste is similar to that used for adhesive 360. Thereafter, bottom surface 524 is disposed on the epoxy paste, and then the epoxy paste is fully cured or hardened (C stage) at relatively low temperature in the range of 200 to 250° C. Upper surface 512 does not contact bottom surface 524. Instead, adhesive 560 is sandwiched between upper surface 512 and bottom surface 524. Through-hole 530 does not expose pad 516 which remains covered by adhesive 560. Furthermore, bump 528 is disposed on a portion of base 526 that extends beyond outer edge 564 of chip 510.

Figure 9D:
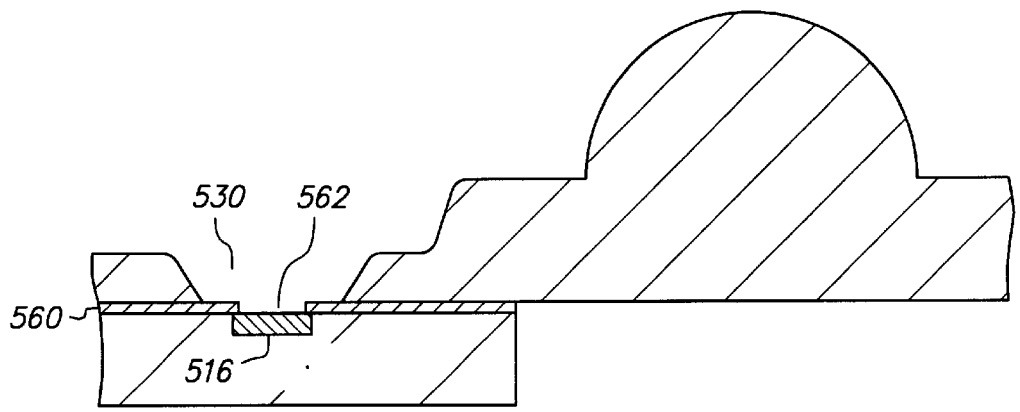
Figure 10D:
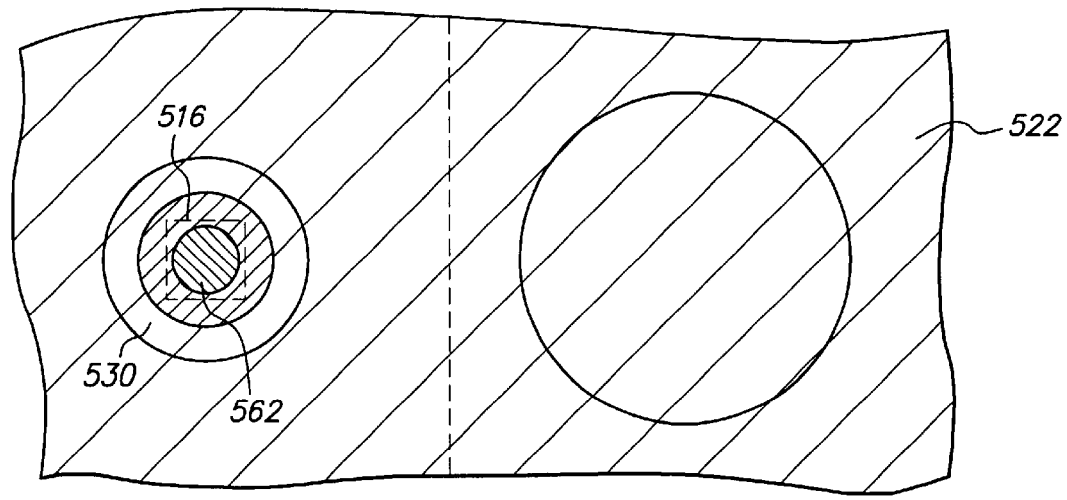

FIGS. 9D and 10D are cross-sectional and top views, respectively, of opening 562 formed in adhesive 560. Opening 562 is formed in a similar manner to opening 462. As a result, through-hole 530 and opening 562 are axially aligned with one another and expose pad 516.

Figure 9E:
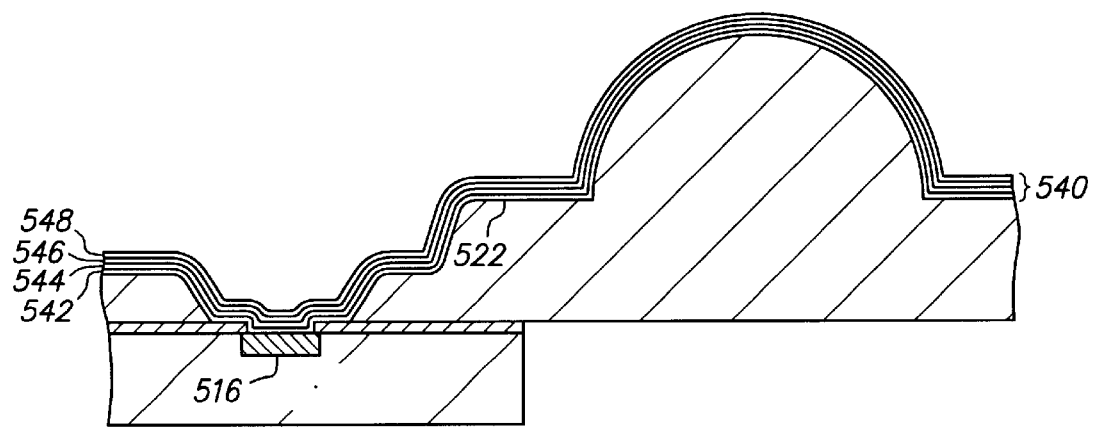
Figure 10E:
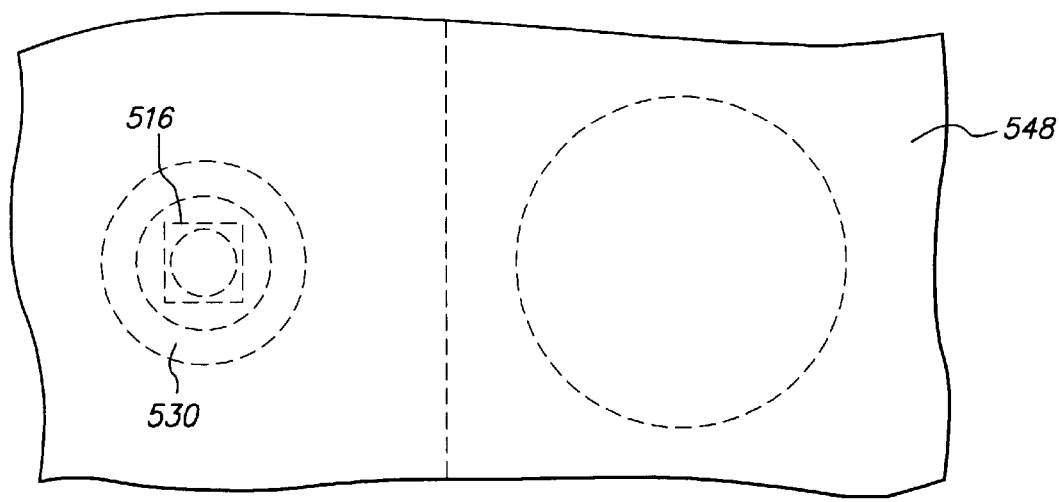

FIGS. 9E and 10E are cross-sectional and top bottom views, respectively, of metal layer 540 formed on top surface 522, the sidewalls of through-hole 530, the portion of the top surface of adhesive 560 exposed by through-hole 530, the sidewalls of opening 562, and pad 516. Metal layer 540 includes copper layer 542, copper layer 544, nickel layer 546 and gold layer 548.

Figure 9F:
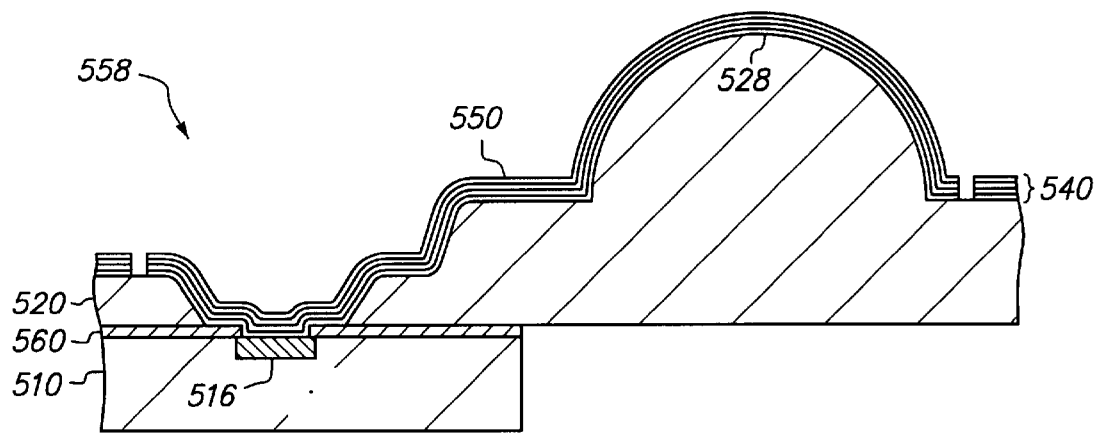
Figure 10F:
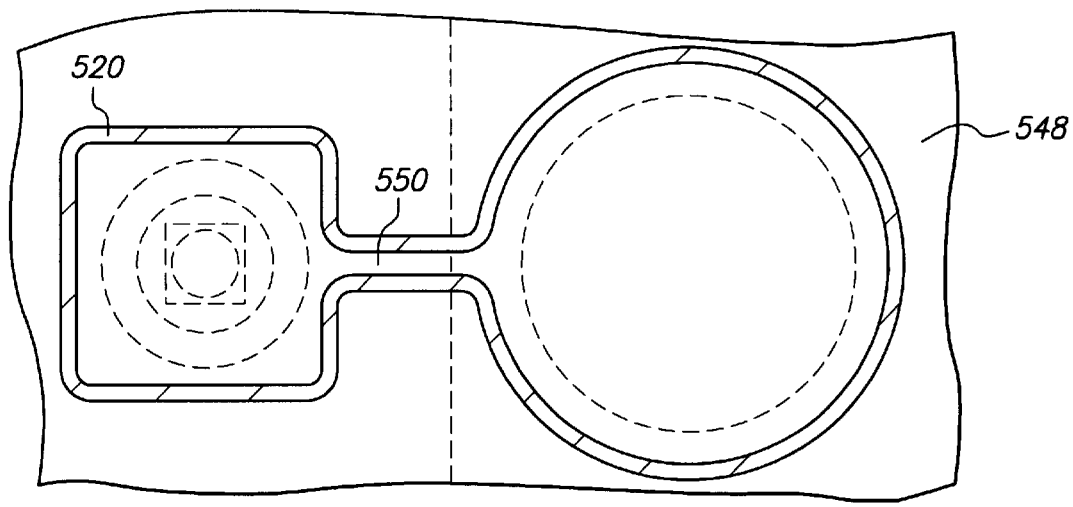

FIGS. 9F and 10F are cross-sectional and top bottom views, respectively, of routing line 550 subtractively formed from metal layer 540. Bump 528 is positioned farther than pad 516 from a central region of chip 510, so routing line 550 provides horizontal fan-out routing for pad 516. Semiconductor chip assembly 558 includes chip 510, molded substrate 520, routing line 550 and adhesive 560.

FIGS. 11A–11G and 12A–12G are cross-sectional and top views, respectively, of a method of manufacturing a semiconductor chip assembly in accordance with a sixth embodiment of the present invention. In the sixth embodiment, the chip is singulated from other chips on the wafer and then attached to the molded substrate, and the molded substrate is formed by transfer molding, a first portion of the metal layer is formed on the molded substrate, and then the molded substrate is attached to the chip. The molded substrate does not contact the chip. Instead, an adhesive is sandwiched between the molded substrate and the chip. Thereafter, an opening is formed in the adhesive below the through-hole to expose the pad, a second portion of the metal layer is formed on the first portion of the metal layer and the pad, and then the metal layer is etched to form the routing line. Furthermore, the molded substrate has a larger surface area than the chip, and the bump fans-out from the pad and is located outside the periphery of the chip. Thus, the primary difference between the first and sixth embodiments is that in the sixth embodiment the molded substrate is formed and then adhesively attached to the singulated chip to form a grid array that is larger than a chip size package, a first portion of the metal layer that covers the bump is formed before the molded substrate is attached to the chip, and a second portion of the metal layer that contacts the pad is formed after the molded substrate is attached to the chip. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, molded substrate 620 corresponds to molded substrate 120, etc.

Figure 11A:
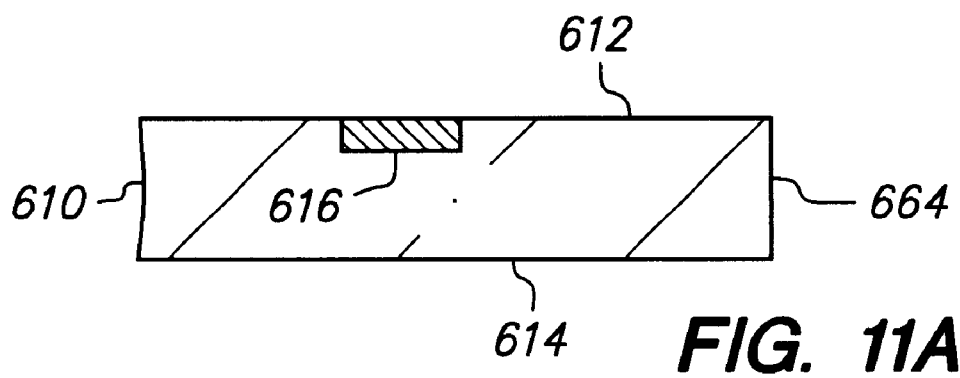
FIGS. 11A–11G are cross-sectional views showing a method of manufacturing a semiconductor chip assembly in accordance with a sixth embodiment of the present invention in which the molded substrate is formed by transfer molding, a first portion of the metal layer is formed on the molded substrate, the molded substrate is attached to the chips using an adhesive, a second portion of the metal layer is formed on the first portion of the metal layer and the chip pad, and then the routing line is formed.
Figure 12A:
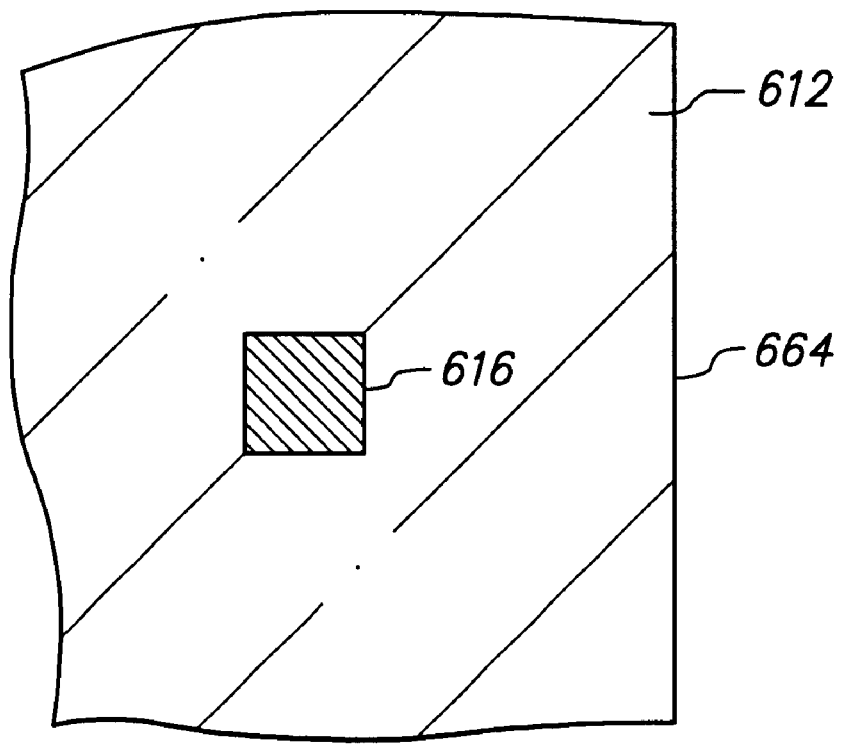
FIGS. 12A–12G are top plan views corresponding to FIGS. 11A–11G, respectively.

FIGS. 11A and 12A are cross-sectional and top views, respectively, of semiconductor chip 610 that includes upper surface 612, lower surface 614, pad 616 and outer edge 664. Chip 610 is similar to chip 510.

Figure 11B:
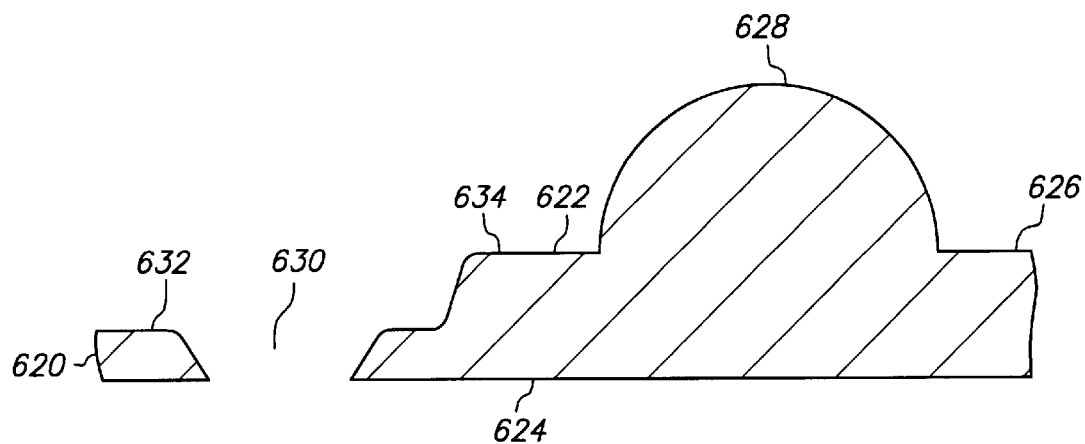
Figure 12B:
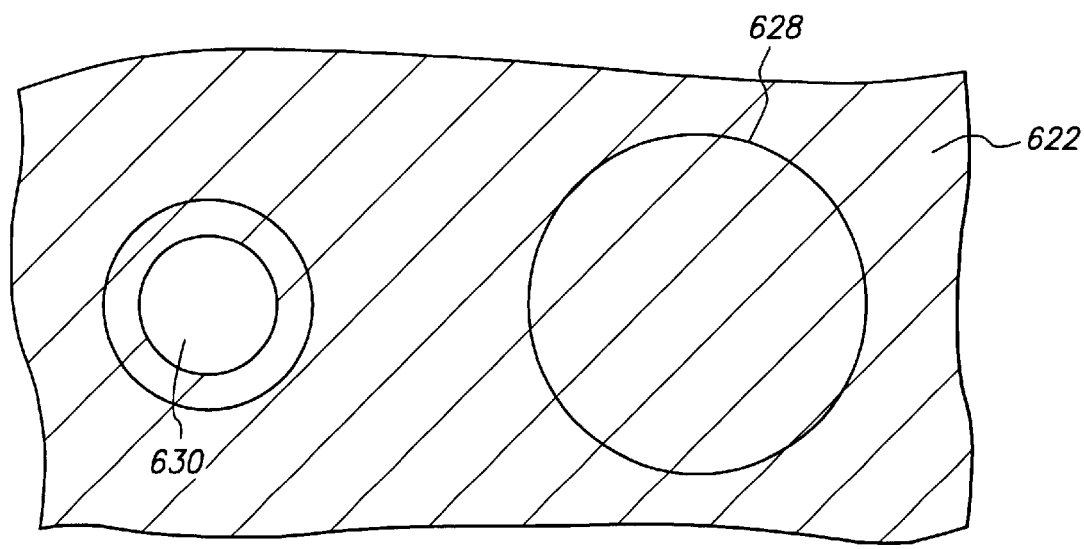

FIGS. 11B and 12B are cross-sectional and top views, respectively, of molded substrate 620. Molded substrate 620 includes top surface 622, bottom surface 624, base 626, bump 628 and through-hole 630. Base 626 includes recessed portion 632 and non-recessed portion 634. Bump 628 is similar to bump 528, and through-hole 630 is similar to through-hole 430.

Figure 11C:
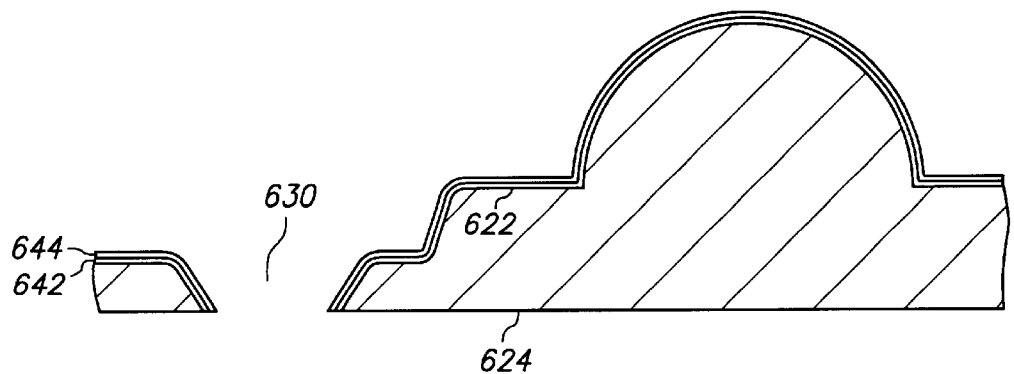
Figure 12C:
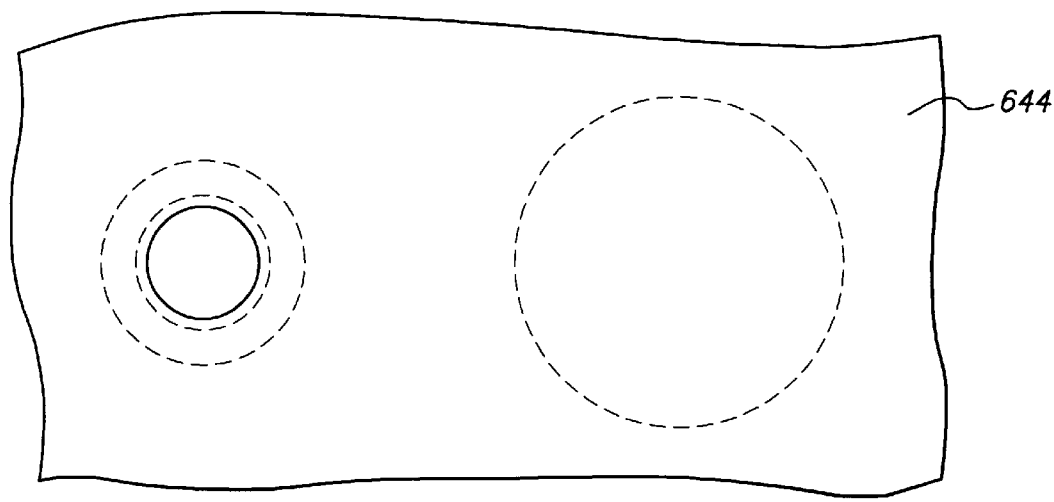

FIGS. 11C and 12C are cross-sectional and top bottom views, respectively, of copper layers 642 and 644 formed on top surface 622 and the sidewalls of through-hole 630. Copper layers 642 and 644 are is not formed on bottom surface 624. For instance, the copper activator solution can be sprayed on top surface 622 and into through-hole 630, or bottom surface 624 can be covered by a mask while the structure is sequentially dipped in the copper activator solution and the electroless copper plating solution. Copper layers 642 and 644 constitute a first portion of metal layer 640. However, since nickel layer 646 and gold layer 648 have yet to be deposited, metal layer 640 is not complete.

Figure 11D:
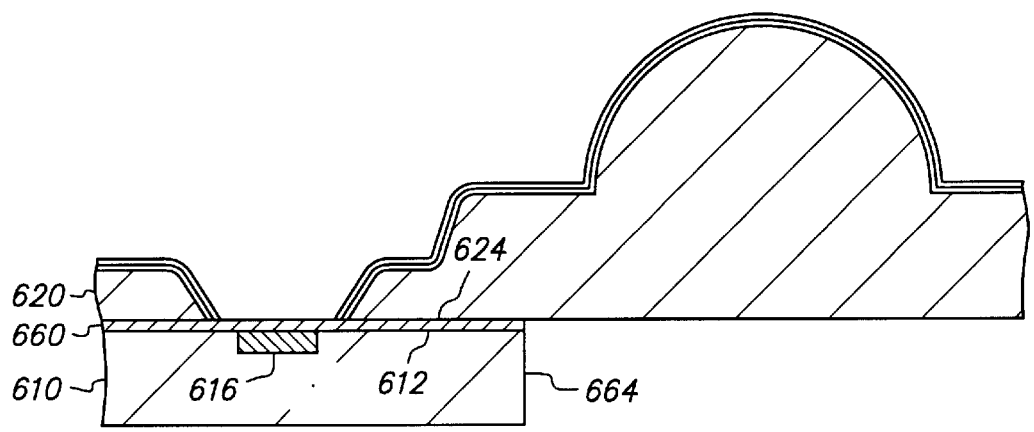
Figure 12D:
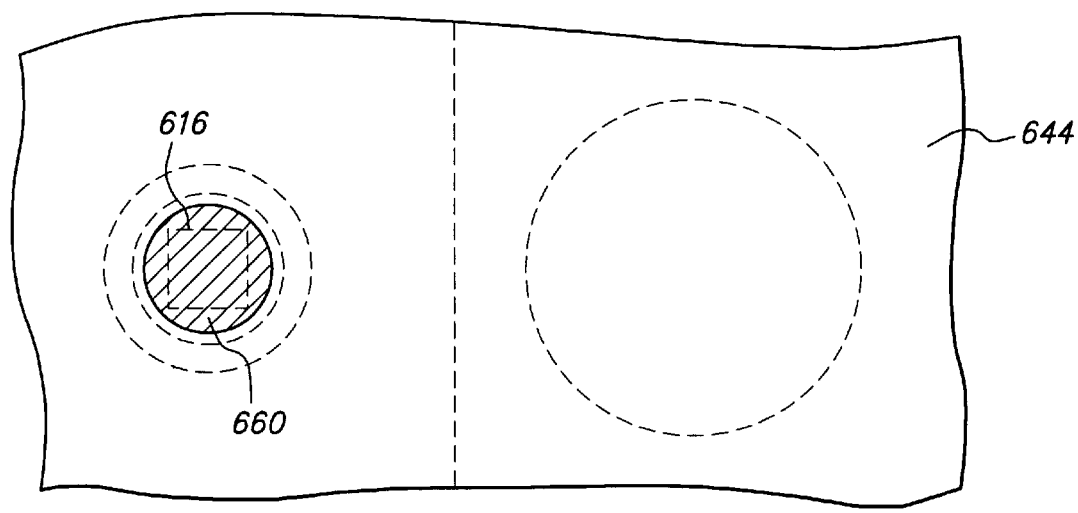

FIGS. 11D and 12D are cross-sectional and top bottom views, respectively, of molded substrate 620 attached to chip 610 by adhesive 660 after molded substrate 620 and the first portion of metal layer 640 have been formed. Adhesive 660 is similar to adhesive 560. In addition, a nickel activator solution is sprayed on the top surface of adhesive 660 after adhesive 660 is disposed on upper surface 612 but before adhesive 660 contacts bottom surface 624 in order to render adhesive 660 catalytic to electroless nickel. A suitable nickel activator solution is MacDermid M-SYSTEMS™.

Figure 11E:
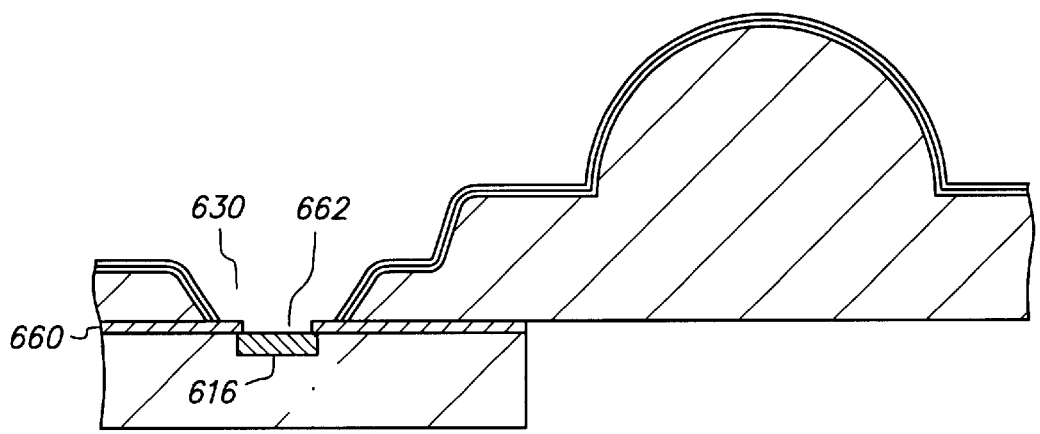
Figure 12E:
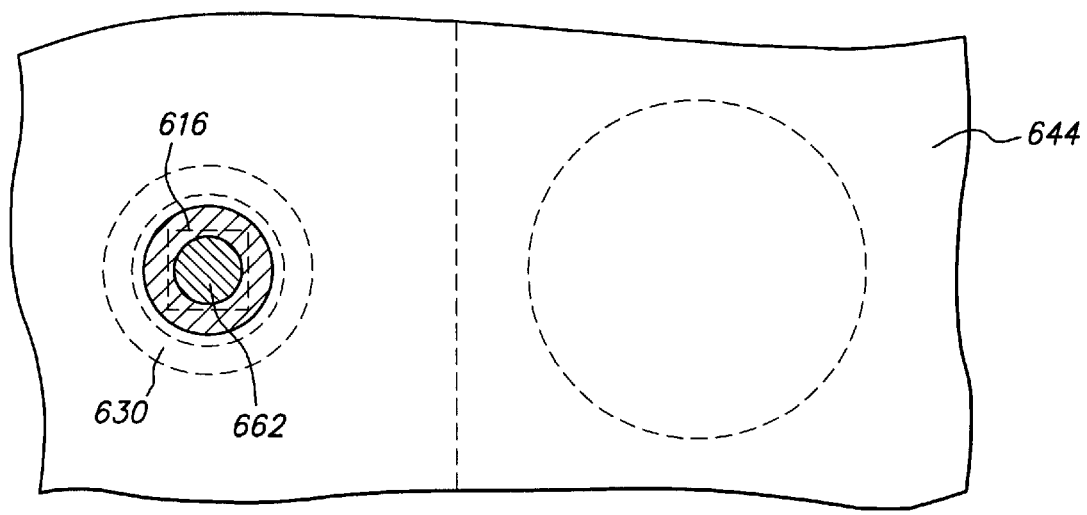

FIGS. 11E an 12E are cross-sectional and top views, respectively, of opening 662 formed in adhesive 660. Opening 662 is formed in a similar manner to opening 462. As a result, through-hole 630 and opening 662 are axially aligned with one another and expose pad 616.

Figure 11F:
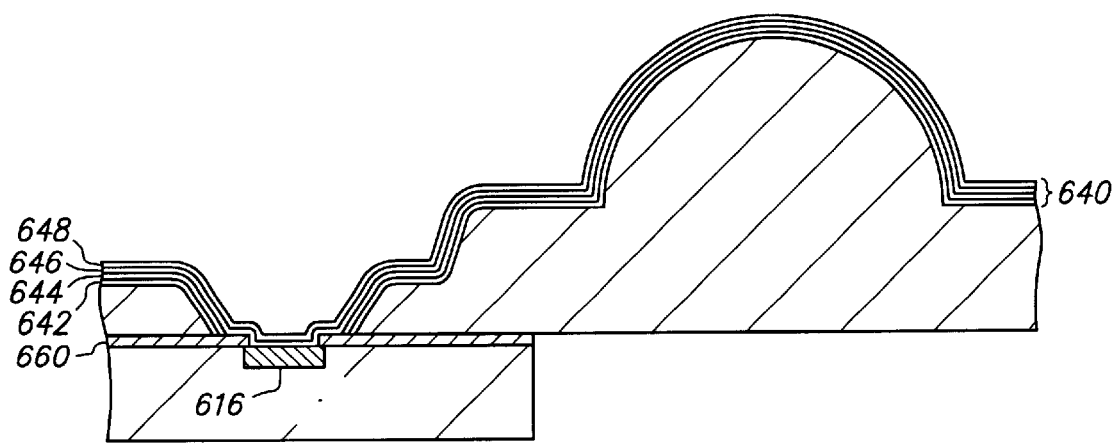
Figure 12F:
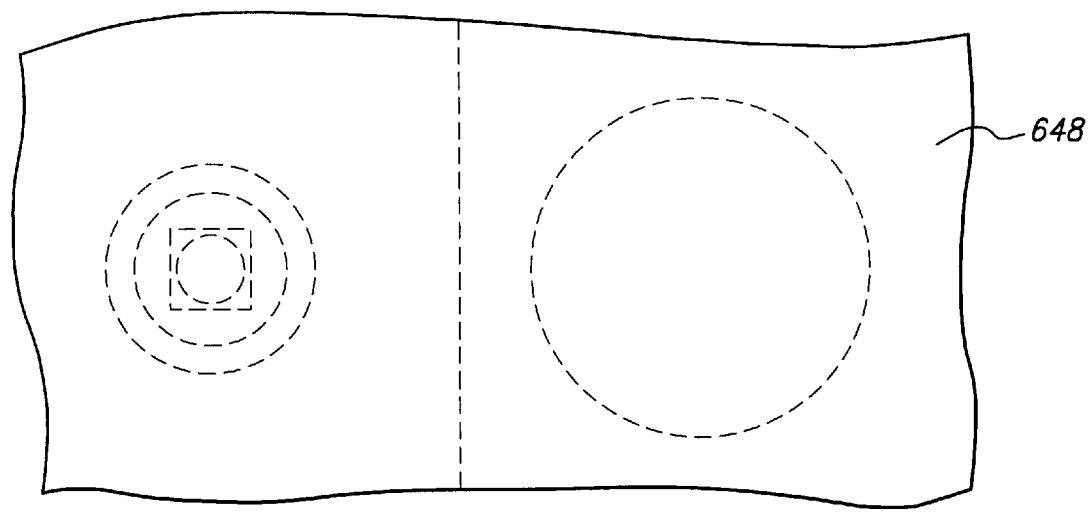

FIGS. 11F and 12F are cross-sectional and top views, respectively, of nickel layer 646 formed on copper layer 644, the portion of the top surface of adhesive 660 exposed by through-hole 630, and pad 616, and gold layer 648 formed on nickel layer 646. Nickel layer 646 is formed by electroless deposition. Initially, the structure is dipped in an electroless nickel plating solution such as Enthone Enplate NI-424 at 85° C. Advantageously, both pad 616 (which includes a gold surface layer), copper layer 644 and adhesive 660 are catalytic to electroless nickel. Thereafter, gold layer 648 is electroplated on nickel layer 646. Nickel layer 646 and gold layer 648 constitute a second portion of metal layer 640. Since copper layers 642 and 644, nickel layer 646 and gold layer 648 have now been deposited, metal layer 640 is complete.

Figure 11G:
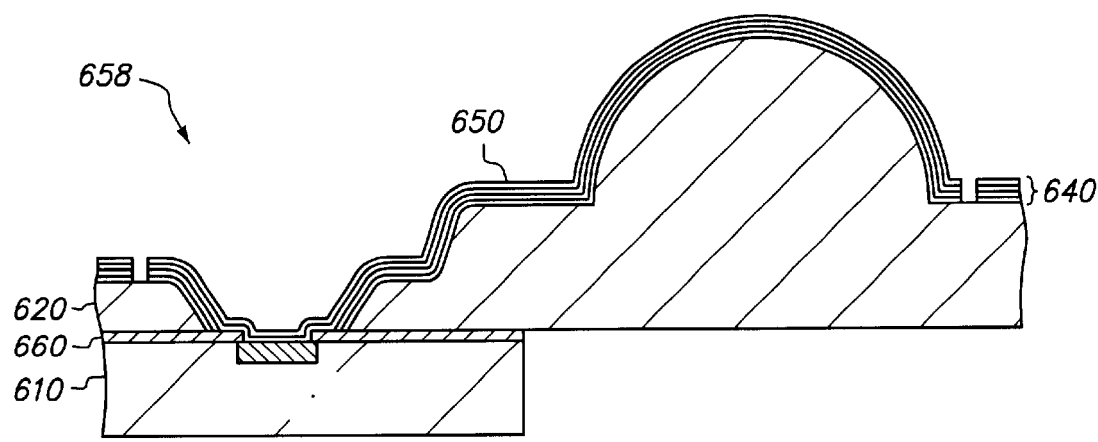
Figure 12G:
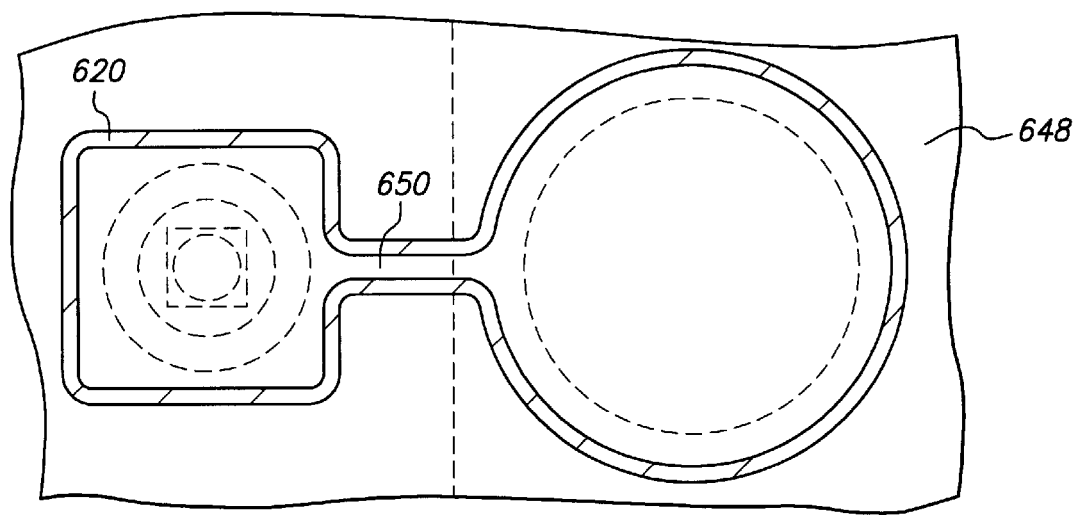

FIGS. 11G and 12G are cross-sectional and top bottom views, respectively, of routing line 650 subtractively formed from metal layer 640. Semiconductor chip assembly 658 includes chip 610, molded substrate 620, routing line 650 and adhesive 660.

FIGS. 13A–13G and 14A–14G are cross-sectional and top views, respectively, of a method of manufacturing a semiconductor chip assembly in accordance with a seventh embodiment of the present invention. In the seventh embodiment, the chip is singulated from other chips on the wafer and then attached to the molded substrate, and the molded substrate is formed by transfer molding, a first portion of the routing line is formed on the molded substrate, and then the molded substrate is attached to the chip. The molded substrate does not contact the chip. Instead, an adhesive is sandwiched between the molded substrate and the chip. Thereafter, an opening is formed in the adhesive below the through-hole to expose the pad, and a second portion of the routing line is formed in the through-hole and on the pad by electroless plating. Furthermore, the molded substrate has a larger surface area than the chip, and the bump fans-out from the pad and is located outside the periphery of the chip. Thus, the primary difference between the first and seventh embodiments is that in the seventh embodiment the molded substrate is formed and then adhesively attached to the singulated chip to form a grid that is larger than a chip size package, a first portion of the routing line that covers the bump is formed before the molded substrate is attached to the chip, and a second portion of the routing line that contacts the pad is formed by electroless plating after the molded substrate is attached to the chip. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, molded substrate 720 corresponds to molded substrate 120, etc.

Figure 13A:
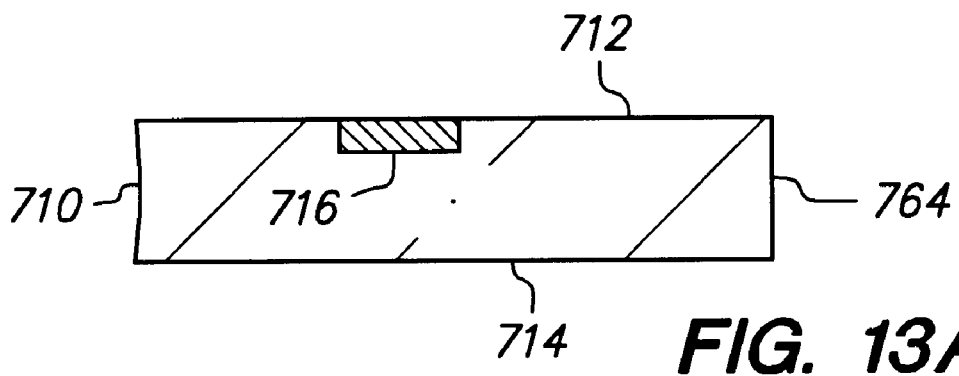
FIGS. 13A–13G are cross-sectional views showing a method of manufacturing a semiconductor chip assembly in accordance with a seventh embodiment of the present invention in which the molded substrate is formed by transfer molding, a first portion of the routing line is formed on the molded substrate, the molded substrate is attached to the chip using an adhesive, and then a second portion of the routing line is formed in the through-hole and on the chip pad by electroless plating.
Figure 14A:
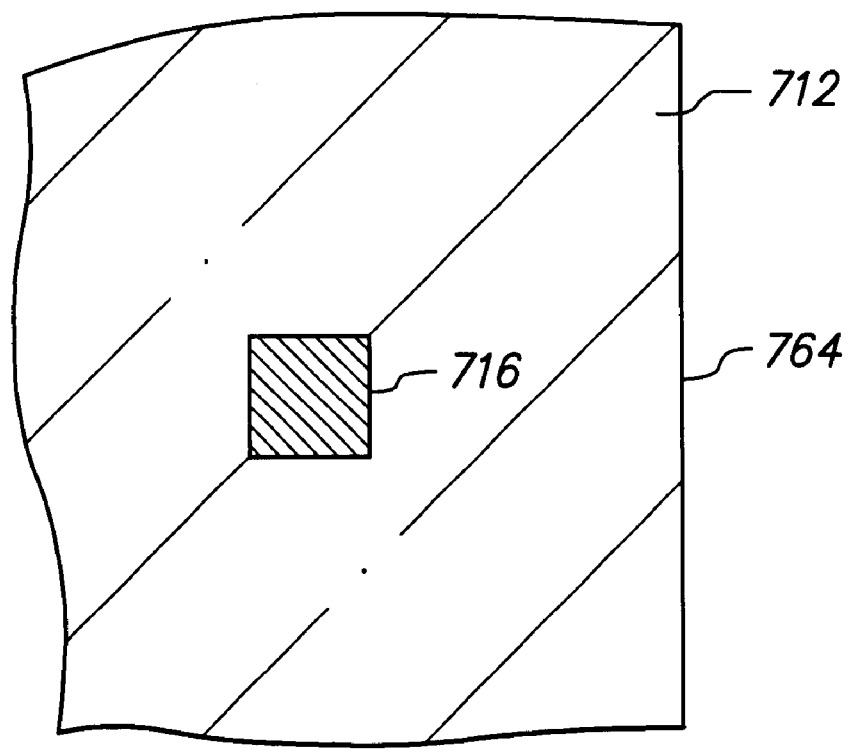
FIGS. 14A–14G are top plan views corresponding to FIGS. 13A–13G, respectively.

FIGS. 13A and 14A are cross-sectional and top views, respectively, of semiconductor chip 710 that includes upper surface 712, lower surface 714, pad 716 and outer edge 764. Chip 710 is similar to chip 510.

Figure 13B:
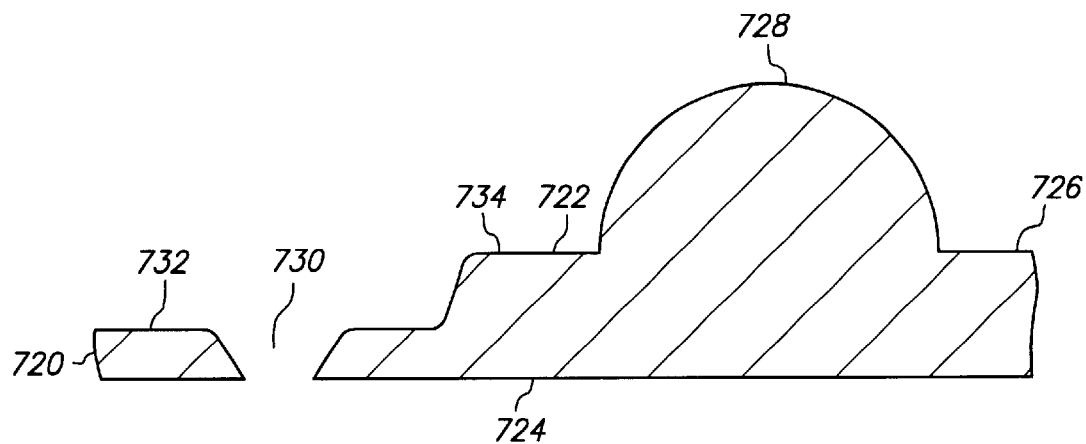
Figure 14B:
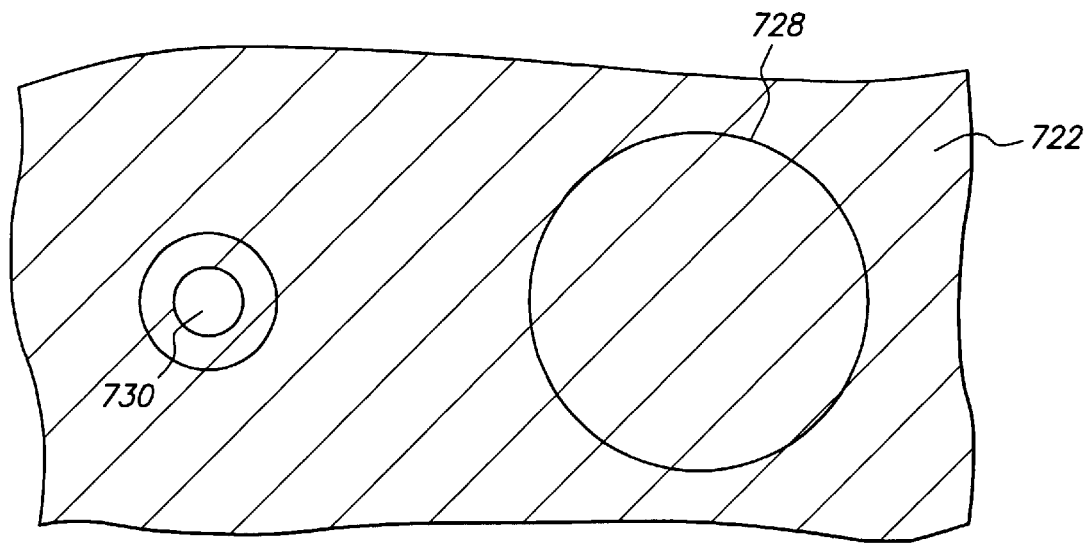

FIGS. 13B and 14B are cross-sectional and top views, respectively, of molded substrate 720. Molded substrate 720 includes top surface 722, bottom surface 724, base 726, bump 728 and through-hole 730. Base 726 includes recessed portion 732 and non-recessed portion 734. Bump 728 is similar to bump 528.

Figure 13C:
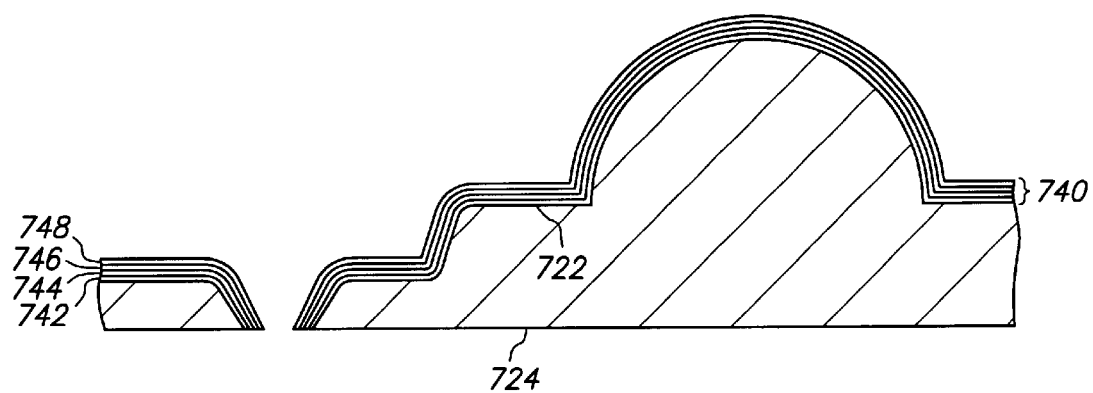
Figure 14C:
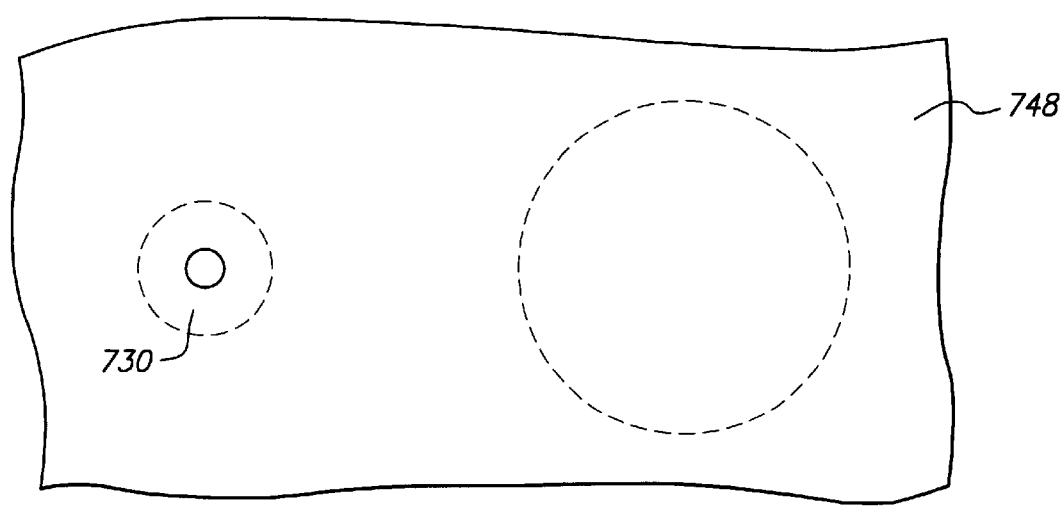

FIGS. 13C and 14C are cross-sectional and top bottom views, respectively, of metal layer 740 formed on top surface 722 and the sidewalls of through-hole 730. Metal layer 740 includes copper layer 742, copper layer 744, nickel layer 746 and gold layer 748. Metal layer 740 is not formed on bottom surface 724. For instance, the copper activator solution can be sprayed on top surface 722 and into through-hole 730, or bottom surface 724 can be covered by a mask while the structure is sequentially dipped in the copper activator solution, the electroless copper plating solution, and the electrolytic copper, nickel and gold plating solutions.

Figure 13D:
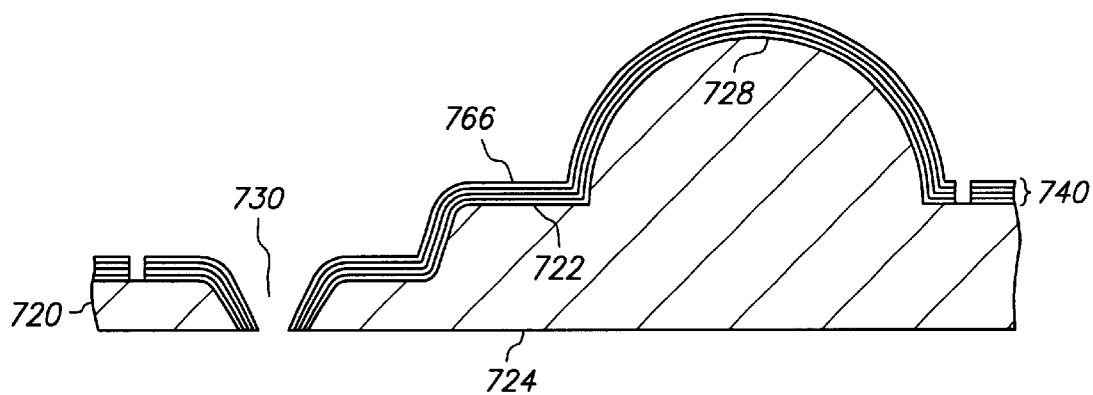
Figure 14D:
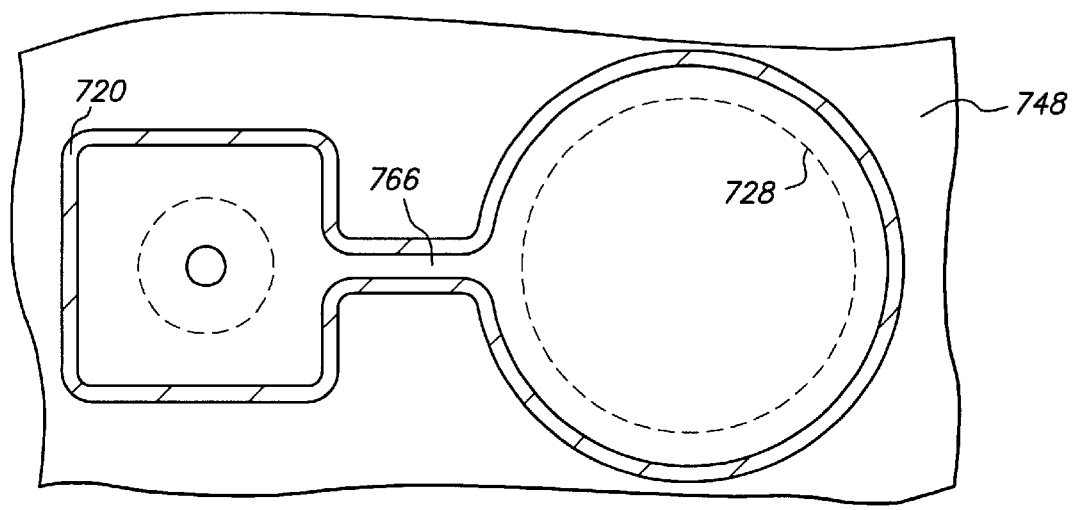

FIGS. 13D and 14D are cross-sectional and top bottom views, respectively, of conductive trace 766 subtractively formed from metal layer 740. Conductive trace 766 constitutes a first portion of routing line 750 that covers bump 728, extends along top surface 722 to through-hole 730, extends through through-hole 730 to bottom surface 724, and covers the sidewalls of through-hole 730 thereby spanning 360 degrees around through-hole 730.

Figure 13E:
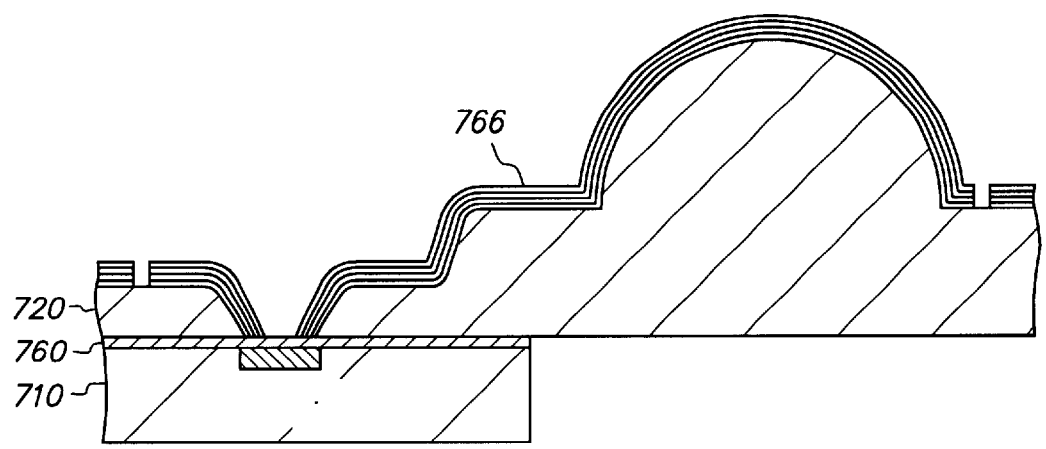
Figure 14E:
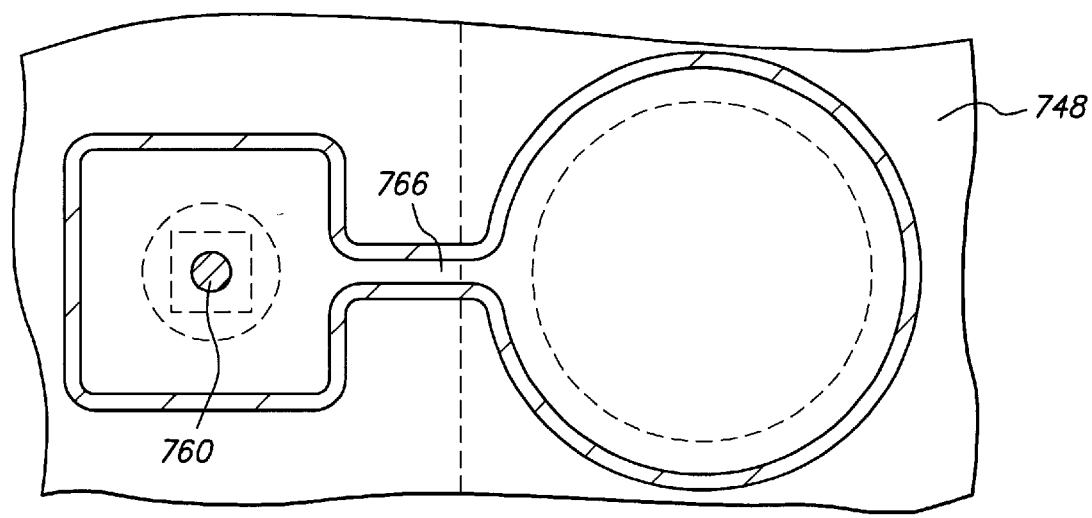

FIGS. 13E and 14E are cross-sectional and top views, respectively, of molded substrate 720 attached to chip 710 by adhesive 760 after molded substrate 720 and conductive trace 766 have been formed. Adhesive 760 is similar to adhesive 560.

Figure 13F:
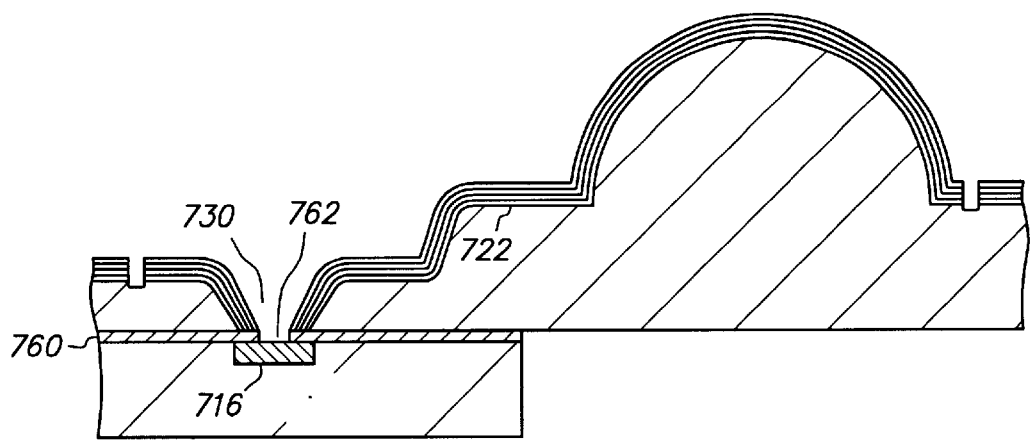
Figure 14F:
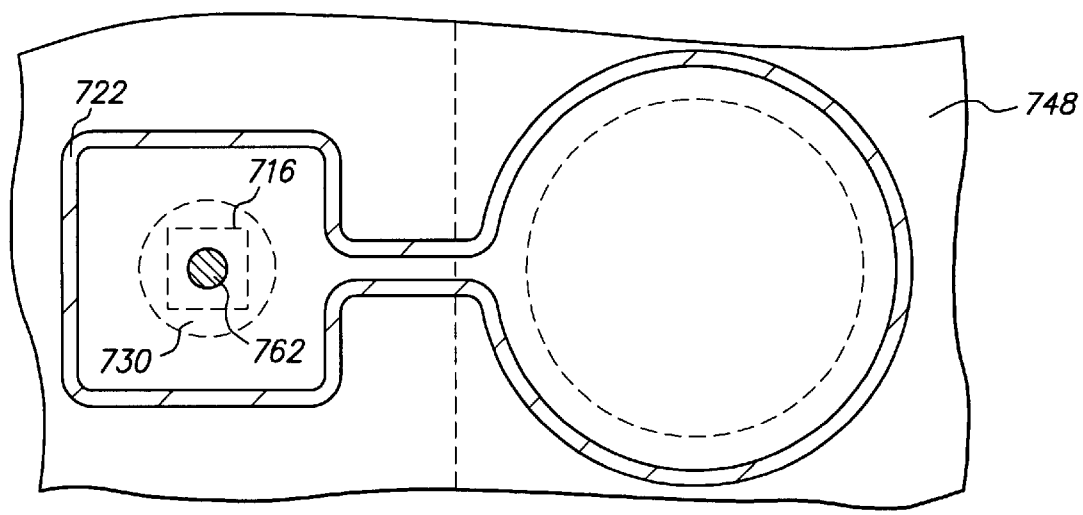

FIGS. 13F and 14F are cross-sectional and top views, respectively, of opening 762 formed in adhesive 760. Opening 762 is formed in a similar manner to opening 362. In particular, a blanket plasma etch is applied to remove the portion of adhesive 760 exposed by through-hole 730. The plasma etch removes any adhesive 760 that resides in through-hole 730 as well as any adhesive 760 directly below through-hole 730, thereby forming opening 762 and exposing pad 716. The plasma etch also removes a few microns from the exposed portion of top surface 722 that is adjacent to the periphery of conductive trace 766 and exposed by the etching steps that define conductive trace 766. Although the plasma etch has no appreciable effect on molded substrate 720, it does remove the catalytic surface layer of the exposed portion of top surface 722 that was rendered catalytic to electroless copper by the copper activator solution. As a result, the exposed portion of top surface 722 is no longer catalytic to electroless copper. In addition, through-hole 730 and opening 762 are axially aligned with one another and expose pad 716, and conductive trace 766 is separated from pad 716 by the thickness of adhesive 760.

Figure 13G:
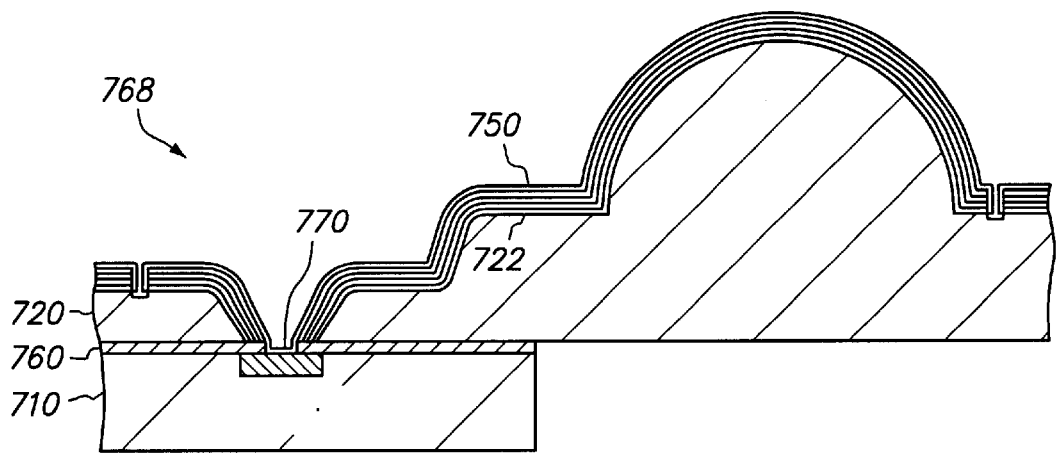
Figure 14G:
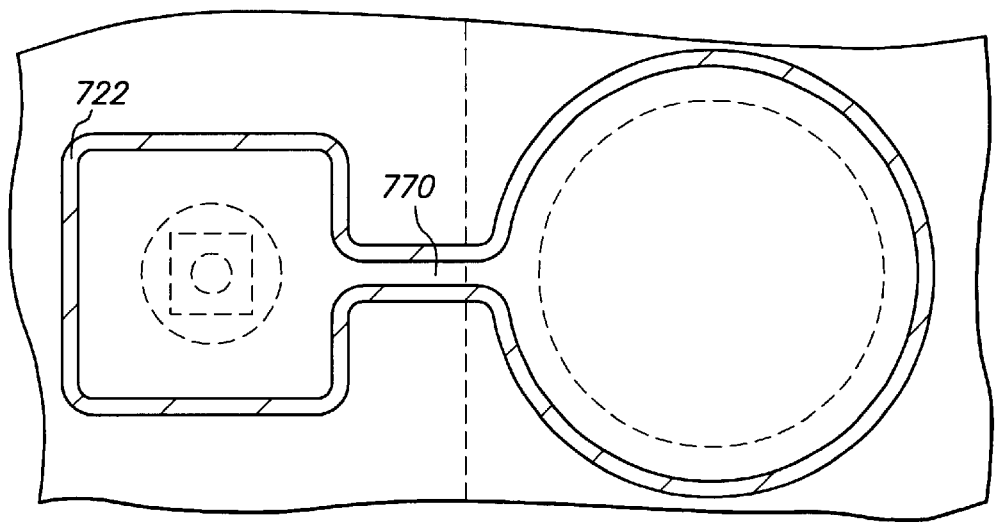

FIGS. 13G and 14G are cross-sectional and top bottom views, respectively, of electrolessly plated connection joint 770 additively formed on conductive trace 766 and pad 716 by electroless plating. Electrolessly plated connection joint 770 constitutes a second portion of routing line 750 that contacts conductive trace 766 and pad 716. Thus, routing line 750 consists of conductive trace 766 and electrolessly plated connection joint 770 and provides horizontal fan-out routing for pad 716. Initially, the structure is submerged in an electroless copper plating solution such as Shipley CUPOSIT™ 250 at 60° C. and electrolessly plated contact joint 770 deposits on conductive trace 766 and the exposed central portion of pad 716. Since, however, the exposed portion of top surface 722 adjacent to conductive trace 766 is no longer catalytic to electroless copper, electrolessly plated connection joint 770 does not deposit on it. The electroless plating operation continues until electrolessly plated connection joint 770 has the desired thickness, such as 10 microns, but is not thick enough to bridge conductive trace 766 to the remainder of metal layer 740. After the electroless plating operation is completed, electrolessly plated connection joint 770 has a bowl-shape inside through-hole 730 and provides a robust, permanent electrical connection between pad 716 and conductive trace 766. Semiconductor chip assembly 758 includes chip 710, molded substrate 720, routing line 750 and adhesive 760.

FIGS. 15A–15G and 16A–16G are cross-sectional and top views, respectively, of a method of manufacturing a semiconductor chip assembly in accordance with an eighth embodiment of the present invention. In the eighth embodiment, the chip is singulated from other chips on the wafer and then attached to the molded substrate, and the molded substrate is formed by transfer molding, a first portion of the routing line is formed on the molded substrate, and then the molded substrate is attached to the chip. The molded substrate does not contact the chip. Instead, an adhesive is sandwiched between the molded substrate and the chip. Thereafter, an opening is formed in the adhesive below the through-hole to expose the pad, and a second portion of the routing line is formed in the through-hole and on the pad by ball bonding. Furthermore, the molded substrate has a larger surface area than the chip, and the bump fans-out from the pad and is located outside the periphery of the chip. Thus, the primary difference between the first and eighth embodiments is that in the eighth embodiment the molded substrate is formed and then adhesively attached to the singulated chip to form a grid array that is larger than a chip size package, a first portion of the routing line that covers the bump is formed before the molded substrate is attached to the chip, and a second portion of the routing line that contacts the pad is formed by ball bonding after the molded substrate is attached to the chip. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, molded substrate 820 corresponds to molded substrate 120, etc.

Figure 15A:
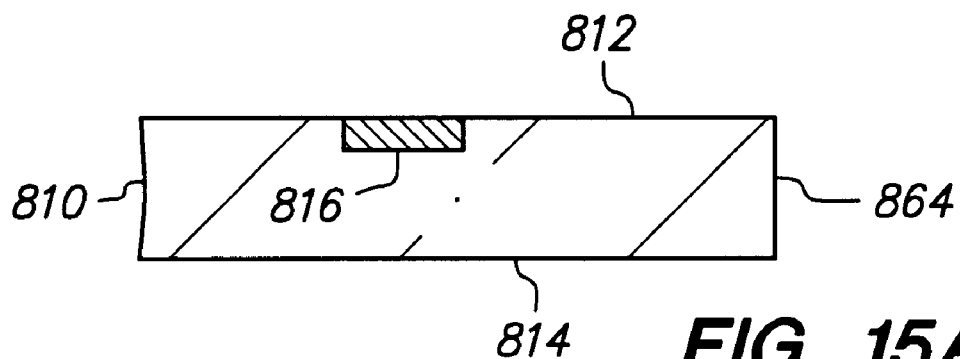
FIGS. 15A–15G are cross-sectional views showing a method of manufacturing a semiconductor chip assembly in accordance with an eighth embodiment of the present invention in which the molded substrate is formed by transfer molding, a first portion of the routing line is formed on the molded substrate, the molded substrate is attached to the chip using an adhesive, and then a second portion of the routing line is formed in the through-hole and on the chip pad by ball bonding.
Figure 16A:
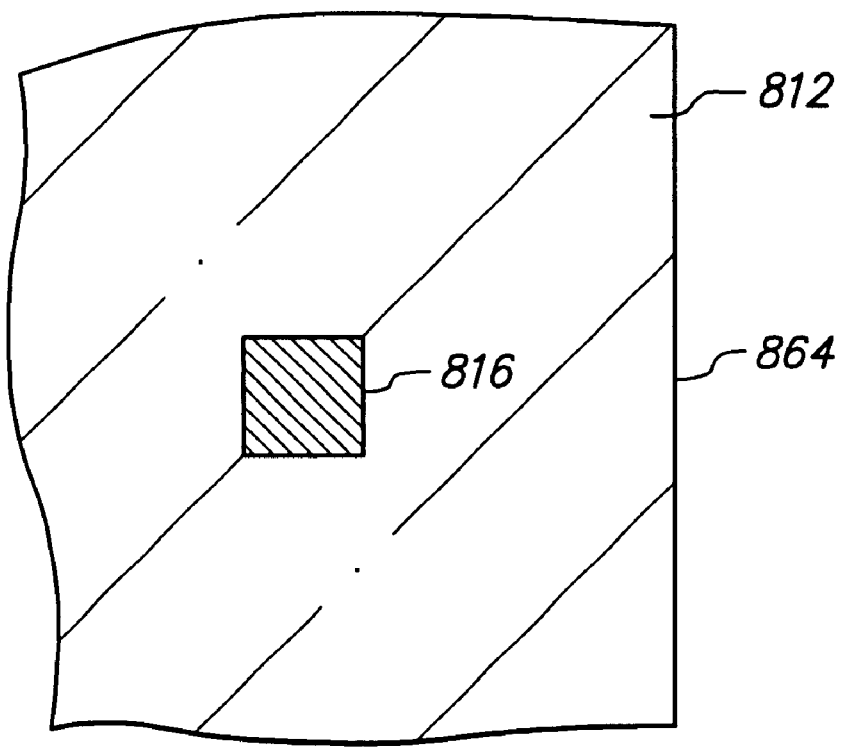
FIGS. 16A–16G are top plan views corresponding to FIGS. 15A–15G, respectively.

FIGS. 15A and 16A are cross-sectional and top views, respectively, of semiconductor chip 810 that includes upper surface 812, lower surface 814, pad 816 and outer edge 864. Chip 810 is similar to chip 510.

Figure 15B:
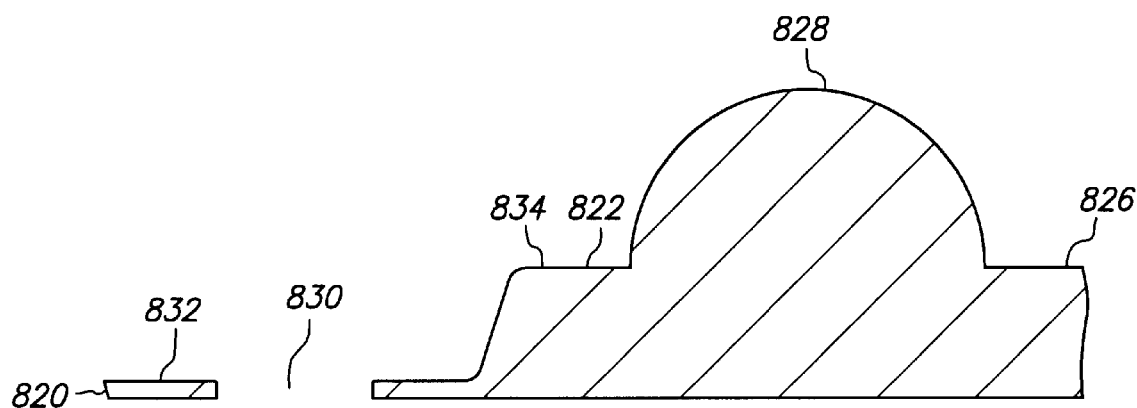
Figure 16B:
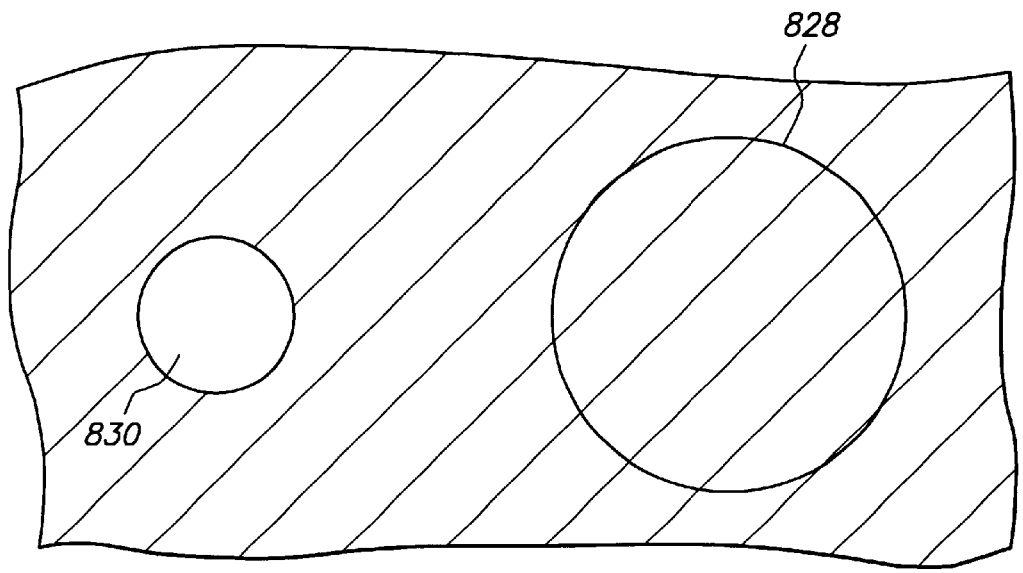

FIGS. 15B and 16B are cross-sectional and top views, respectively, of molded substrate 820. Molded substrate 820 includes top surface 822, bottom surface 824, base 826, bump 828 and through-hole 830. Base 826 includes recessed portion 832 and non-recessed portion 834. Recessed portion 832 has a thickness of 10 microns. Thus, recessed portion 832 is substantially thinner than recessed portion 132. Bump 828 is similar to bump 528, and through-hole 830 is similar to through-hole 430 except that the diameter of through-hole 830 is 150 microns at both top surface 822 and bottom surface 824. Thus, the sidewalls of through-hole 830 are vertical.

Figure 15C:
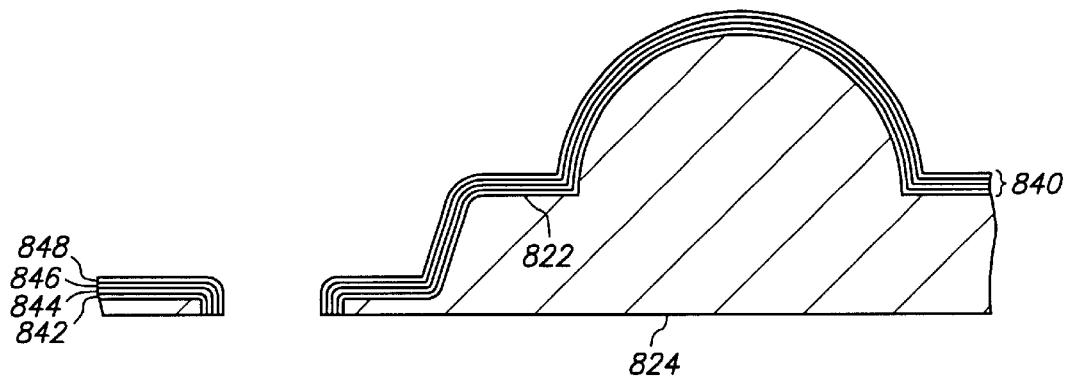
Figure 16C:
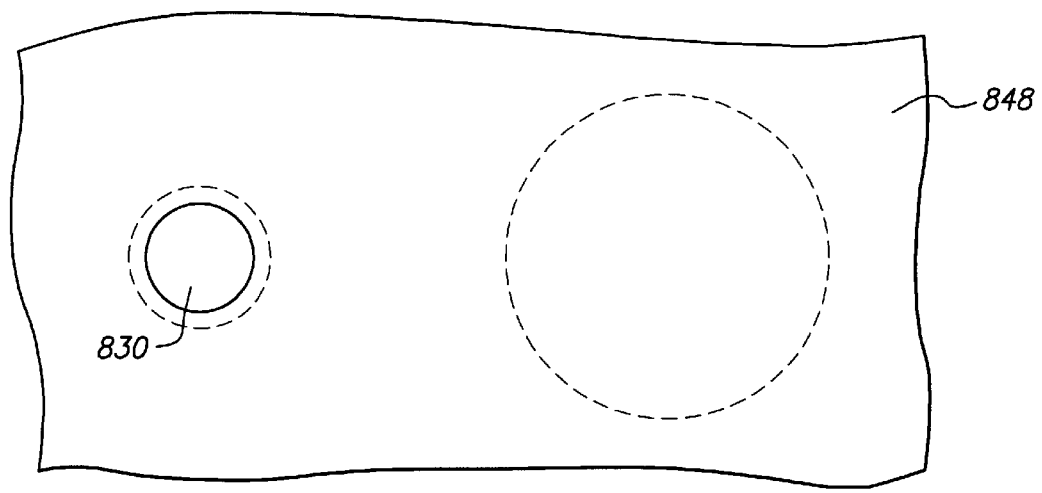

FIGS. 15C and 16C are cross-sectional and top bottom views, respectively, of metal layer 840 formed on top surface 822 and the sidewalls of through-hole 830. Metal layer 840 includes copper layer 842, copper layer 844, nickel layer 846 and gold layer 848. Metal layer 840 is similar to metal layer 740.

Figure 15D:
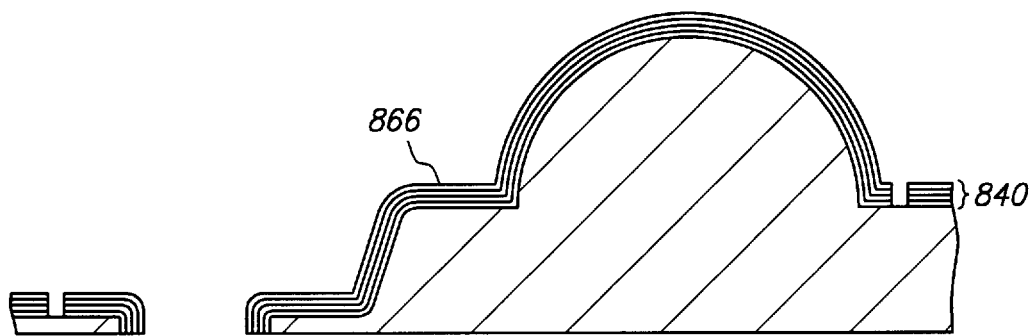
Figure 16D:
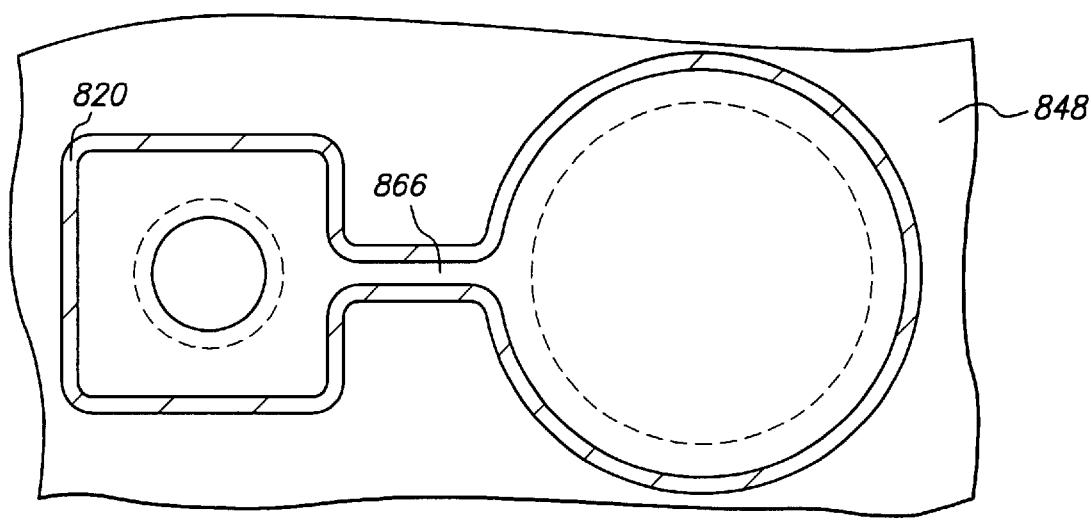

FIGS. 15D and 16D are cross-sectional and top bottom views, respectively, of conductive trace 866 subtractively formed from metal layer 840. Conductive trace 866 is similar to conductive trace 766.

Figure 15E:
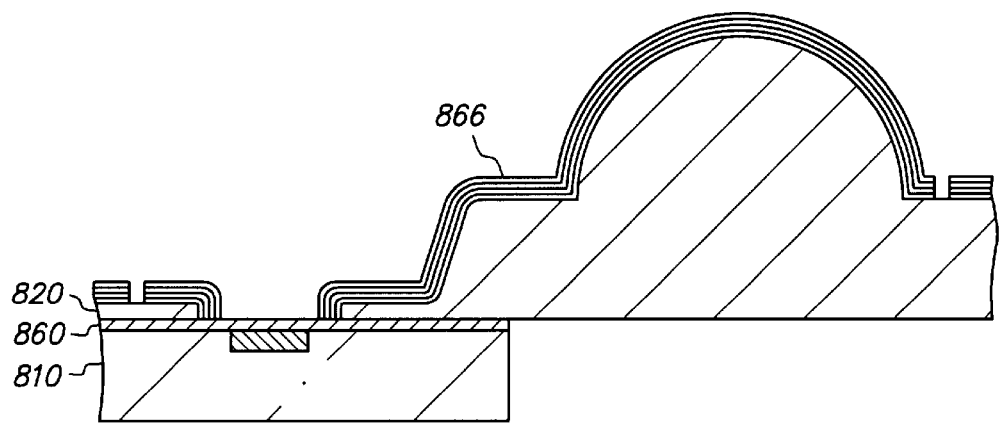
Figure 16E:
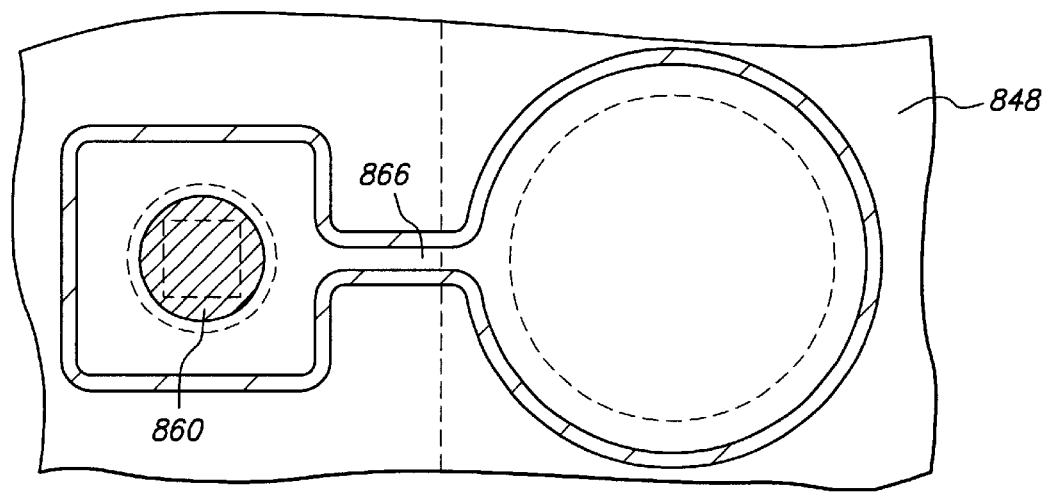

FIGS. 15E and 16E are cross-sectional and top views, respectively, of molded substrate 820 attached to chip 810 by adhesive 860 after molded substrate 820 and conductive trace 866 have been formed. Adhesive 860 is similar to adhesive 560.

Figure 15F:
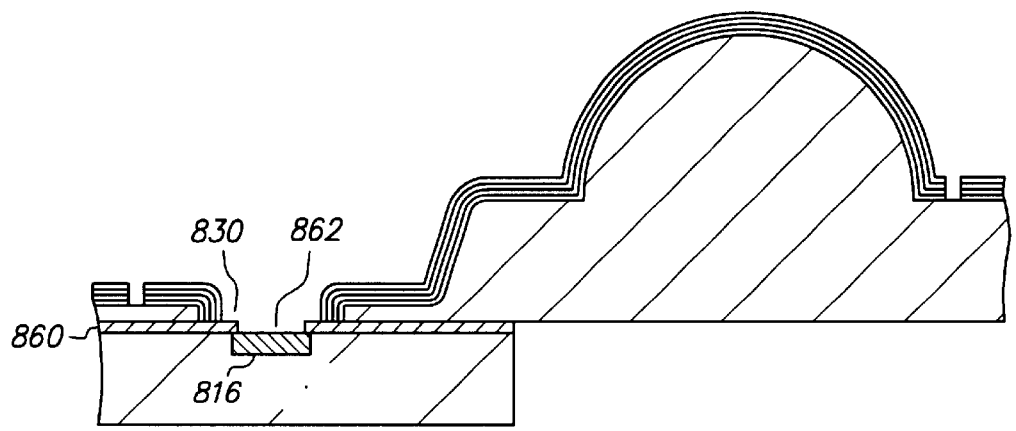
Figure 16F:
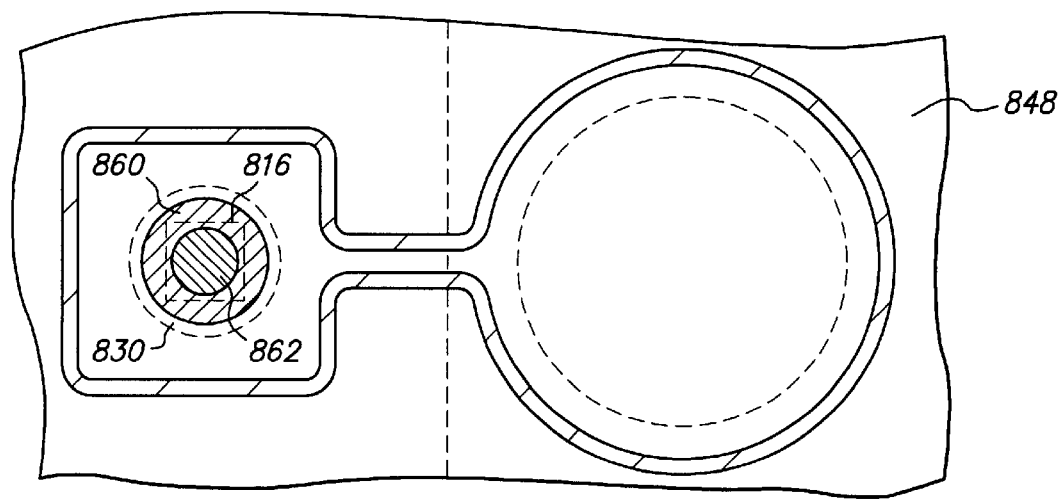

FIGS. 15F and 16F are cross-sectional and top views, respectively, of opening 862 formed in adhesive 860. Opening 862 is formed in a similar manner to opening 462. As a result, through-hole 830 and opening 862 are axially aligned with one another and expose pad 816. In addition, conductive trace 866 is separated from pad 816 by the thickness of adhesive 860.

Figure 15G:
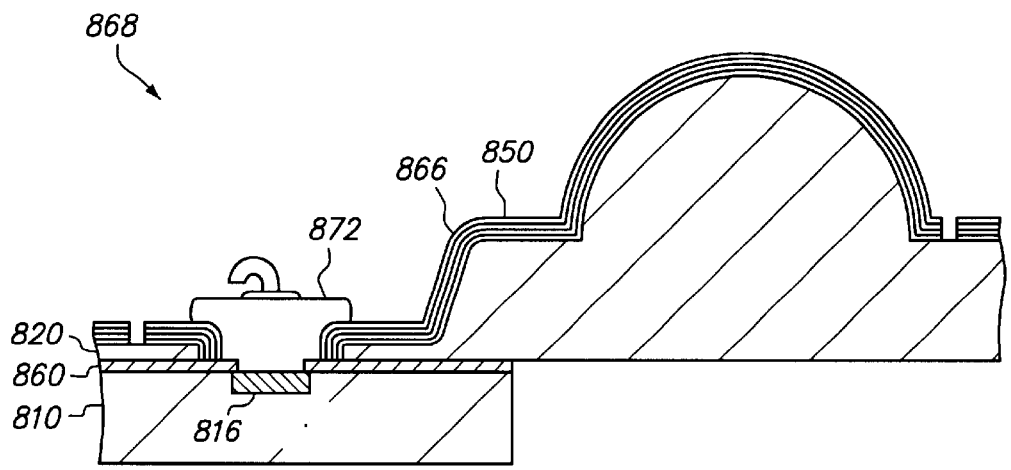
Figure 16G:
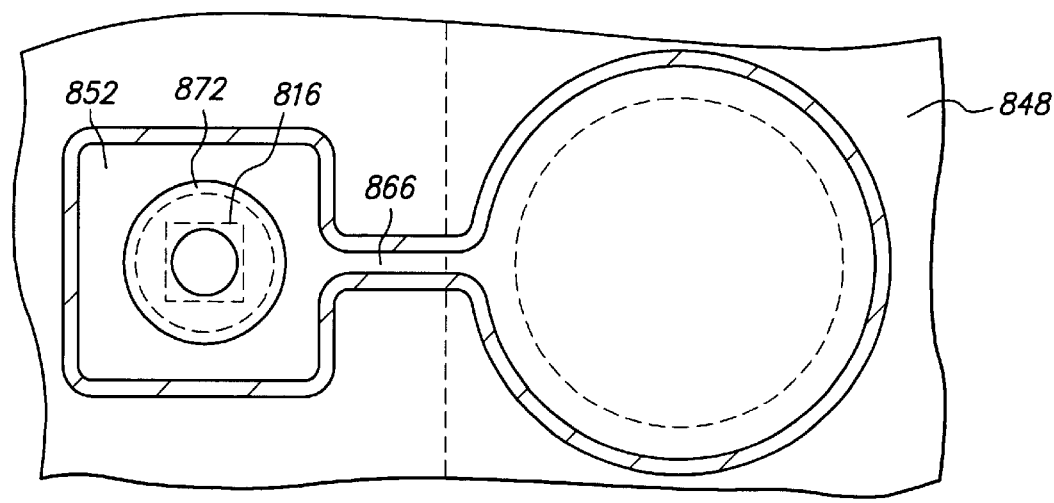

FIGS. 15G and 16G are cross-sectional and top bottom views, respectively, of ball bond connection joint 872 additively formed on conductive trace 866 and pad 816 by wire bonding. Ball bond connection joint 872 constitutes a second portion of routing line 850 that contacts conductive trace 866 and pad 816. Thus, routing line 850 consists of conductive trace 866 and ball bond connection joint 872 and provides horizontal fan-out routing for pad 816. Ball bond connection joint 872 is a gold ball bond formed by thermosonic wire bonding that provides a robust, permanent electrical connection between conductive trace 866 and pad 816. Semiconductor chip assembly 858 includes chip 810, molded substrate 820, routing line 850 and adhesive 860.

FIGS. 17A–17E are enlarged cross-sectional views showing a method of making ball bond connection joint 872.

Figure 17A:
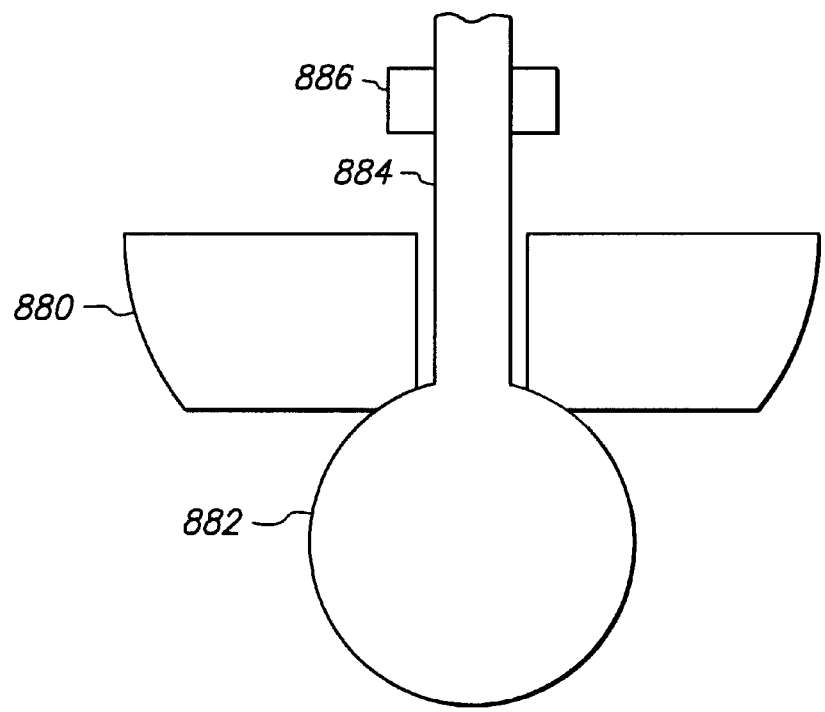
FIGS. 17A–17E are enlarged cross-sectional views showing a method of making the ball bond connection joint in FIG. 15G.
Figure 17A:
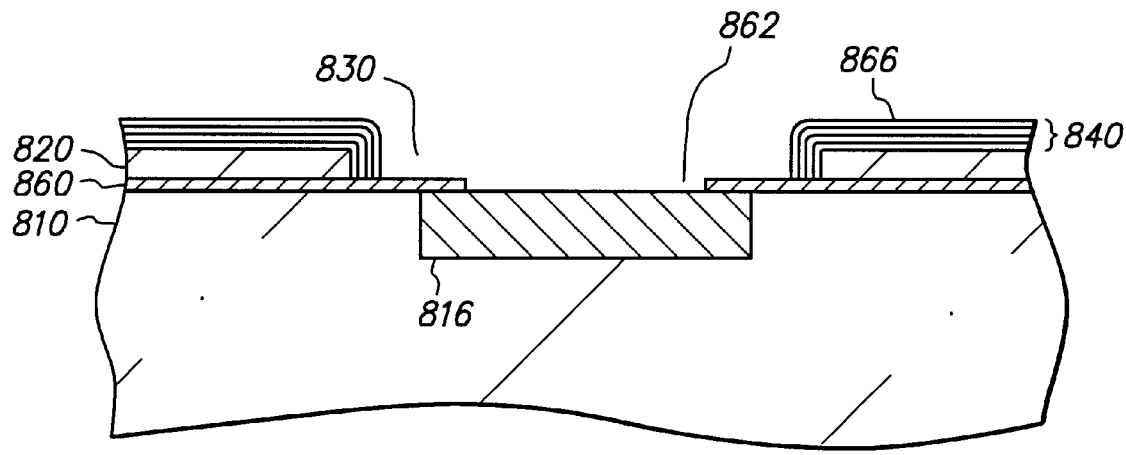

FIG. 17A shows the partially completed assembly after capillary 880 and wire ball 882 are positioned above through-hole 830. Capillary 880 is part of a conventional thermosonic wire bonding apparatus. Capillary 880 has a conical shape and can be composed of alumina, tungsten carbide, ceramic, artificial ruby or various refractory metals. Wire ball 882 is composed of gold and protrudes from the bottom of capillary 880. Wire ball 882 is formed at the end of gold wire 884 by applying thermal energy, such as electronic flame-off or a hydrogen gas flame jet, as is conventional. Wire 884 is fed from a spool (not shown) through clamp 886 and a bore in capillary 880. Clamp 886 is closed to hold wire 884 in place. Wire ball 882 is suitably sized so that the subsequently formed ball bond connection joint 872 fills through-hole 830 and opening 862. The desired size of wire ball 882 can be determined through arithmetic calculations.

Figure 17B:
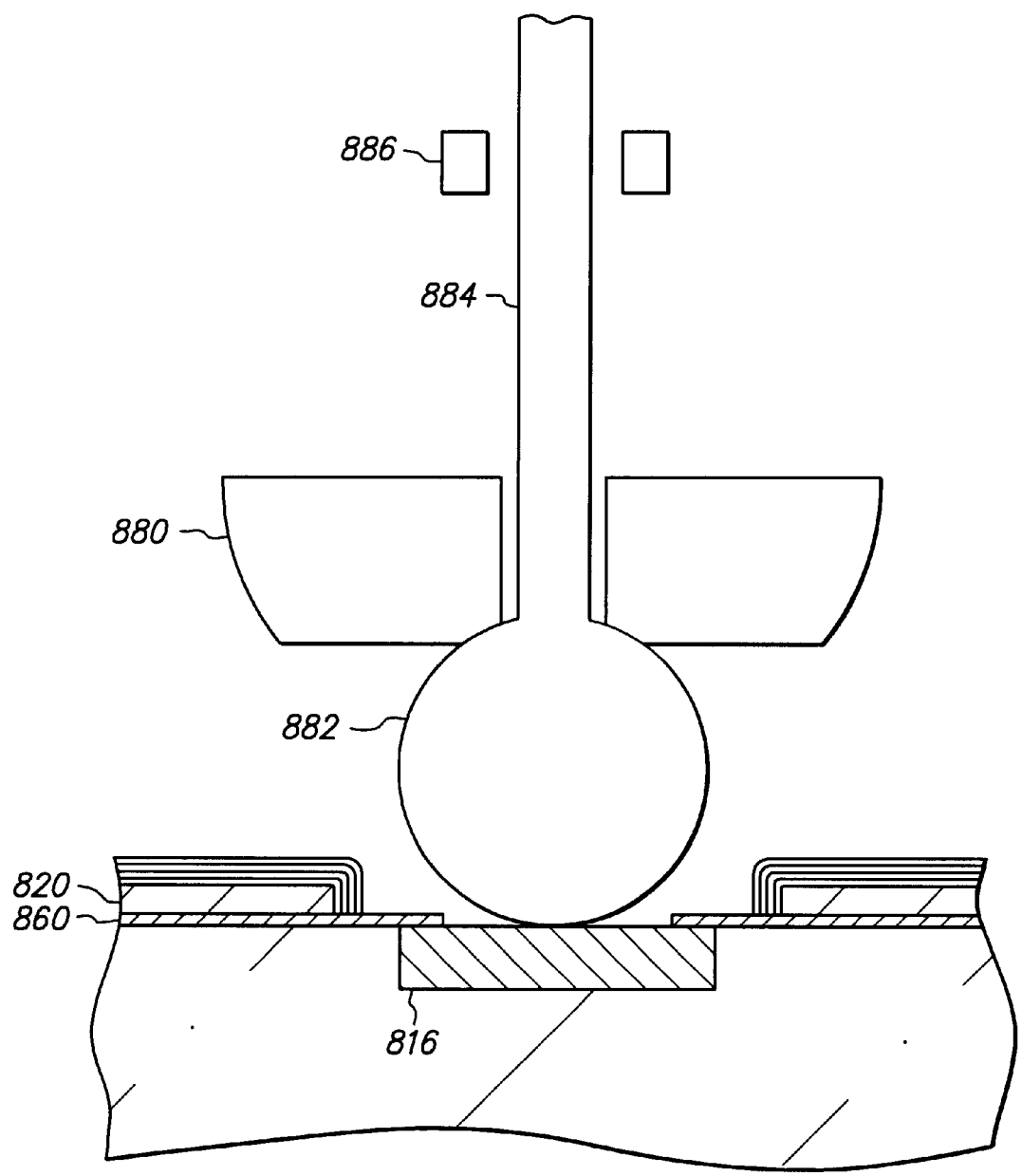

FIG. 17B shows the partially completed assembly after capillary 880 moves downward towards pad 816 such that wire ball 882 enters through-hole 830 and opening 862 and contacts pad 816. Clamp 886 opens before the movement begins so that wire 884 unwinds from its spool as capillary 880 moves. In addition, capillary 880 is heated to about 150 to 200° C. and provides horizontal ultrasonic oscillatory motions with a frequency of about 60 to 120 KHz. The combination of heat from capillary 880 and the recent flaming operation place wire ball 882 in a soft state which is easy to deform. However, the temperature of wire ball 882 does not damage of deform molded substrate 820 of adhesive 860.

Figure 17C:
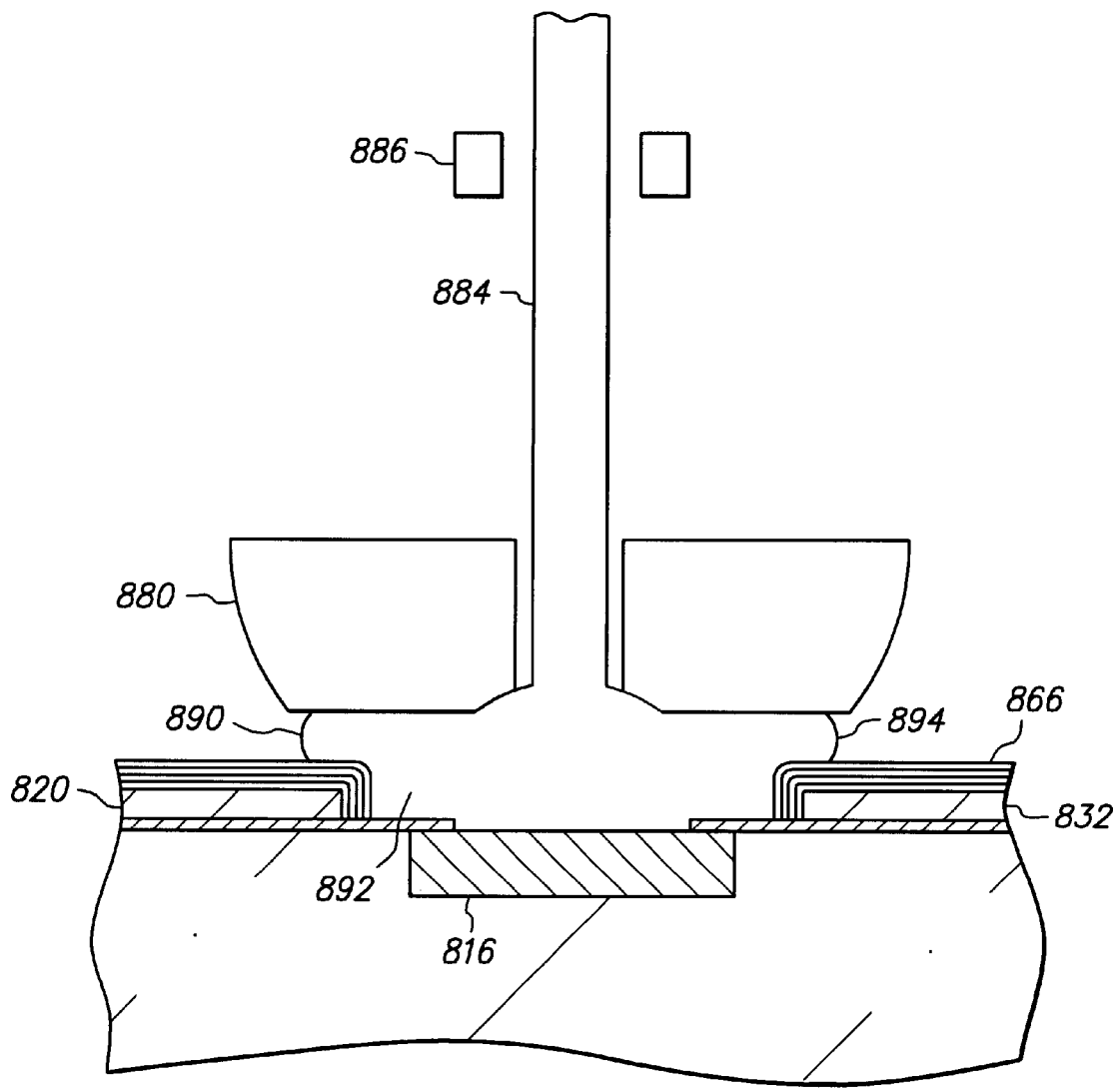

FIG. 17C shows the partially completed assembly after capillary 880 moves further downward towards pad 816 such that wire ball 882 deforms into mushroom-shaped ball bond 890 that contacts conductive trace 866 and fills through-hole 830 and opening 862. More particularly, since wire ball 882 is still in a soft state which is easy to deform, and capillary 880 exerts a downward force of about 25 to 45 grams while continuing to oscillate ultrasonically, wire ball 882 squeezes into through-hole 830 and opening 862 and deforms into mushroom-shaped ball bond 890 that includes stem 892 and pileus or cap 894. Stem 892 fills through-hole 830 and opening 862 and contacts pad 816 and the sidewalls of through-hole 830 and opening 862. Cap 894 extends above conductive trace 866 at recessed portion 832 and contacts a portion of the top surface of enlarged rectangular region 852 that is adjacent to through-hole 830 without contacting the peripheral edges of enlarged rectangular region 852 or molded substrate 820. Clamp 886 remains open so that wire 884 continues to unwind from its spool as capillary 880 moves. Furthermore, the combination of heat, pressure and ultrasonic vibration forms a fused metallic joint between ball bond 890 and pad 816 and a fused metallic joint between ball bond 890 and conductive trace 866.

Figure 17D:
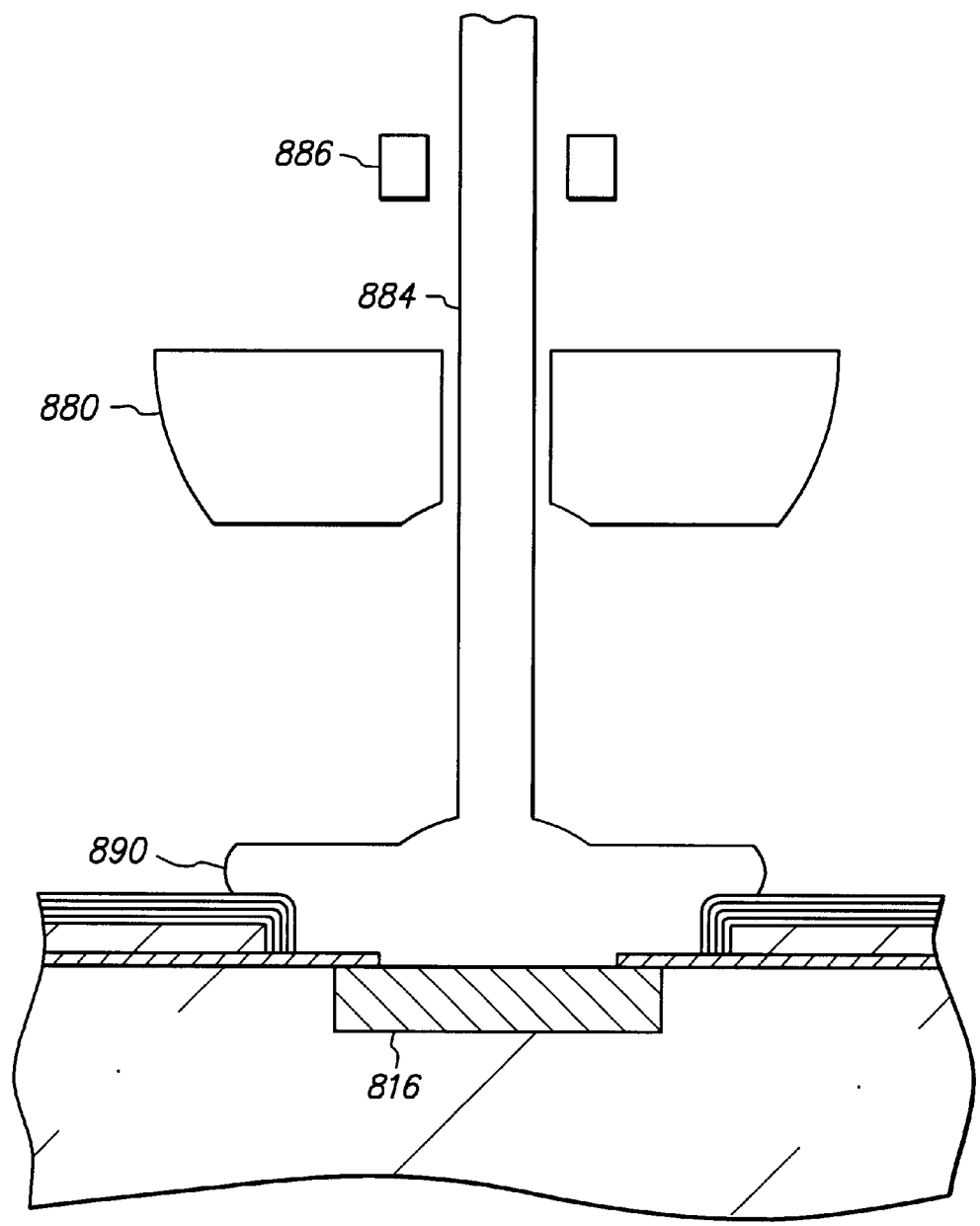

FIG. 17D shows the partially completed assembly after capillary 880 moves upward away from pad 816 and mushroom-shaped ball bond 890 while clamp 886 remains open and wire 884 slides through capillary 880 without exerting upward pressure on ball bond 890. In addition, ball bond 890 begins to cool and solidify.

Figure 17E:
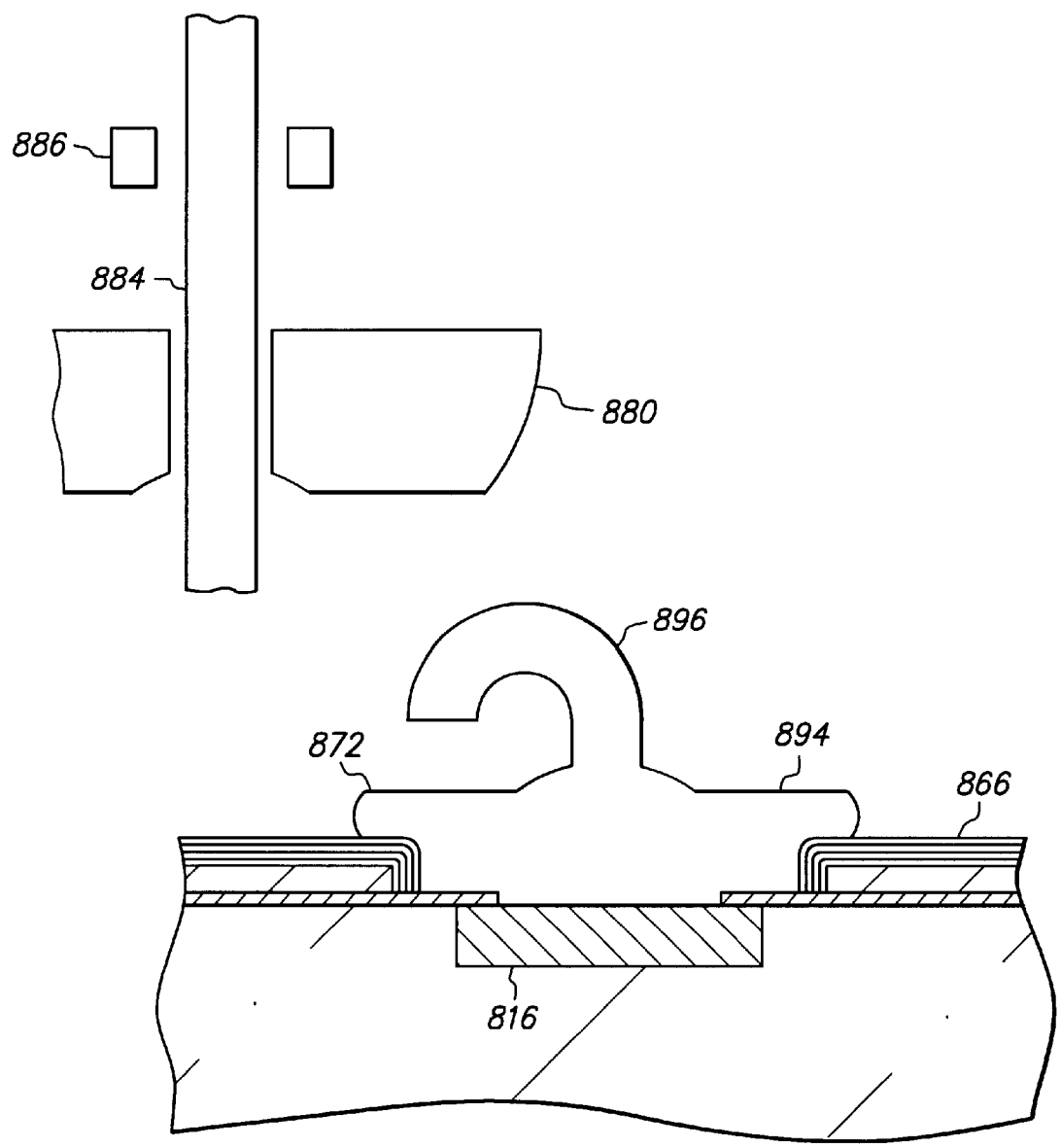

FIG. 17E shows the completed assembly after ball bond 890 solidifies to form ball bond connection joint 872, clamp 886 closes, and capillary 880 moves in a horizontal loop and then downward with a force of 70 to 90 grams in order to cut wire 884 at its edge in proximity to cap 894 thereby disconnecting wire 884 from ball bond connection joint 872. As a result, ball bond connection joint 872 has a mushroom-shape with an inconsequential inverted U-shaped tail 896 that extends above cap 894. Of importance, ball bond connection joint 872 forms an alloyed metallic bond to pad 816 and conductive trace 866 at essentially the same time during a single thermosonic ball bonding operation.

The semiconductor chip assemblies described above are merely exemplary. Numerous other embodiments are contemplated.

Various features of the embodiments described above can be combined with one another. For example, the through-hole can be formed after the molded substrate is formed regardless of whether the molded substrate is molded on the chip, molded on an adhesive on the chip, or adhesively attached to the chip after it is molded, and regardless of how the routing line is formed. As another example, the through-hole diameter at the bottom surface of the molded substrate can substantially exceed that of the opening in the adhesive, thereby exposing a portion of the top surface of the adhesive between the sidewalls of the through-hole and the sidewalls of the opening, regardless of whether the molded substrate is molded on the adhesive or adhesively attached to the chip after it is molded, regardless of how the through-hole is formed, and regardless of how the routing line is formed. As a further example, a chip size package with horizontal fan-in routing can be formed regardless of whether the molded substrate is molded on the chip, molded on an adhesive on the chip, or adhesively attached to the chip after it is molded, regardless of how the through-hole is formed, and regardless of how the routing line is formed. Other combinations of the embodiments described above will be readily apparent to those skilled in the art and need not be exhaustively enumerated.

The routing line can have various shapes and sizes, can be fabricated in a variety of ways, and can be various conductive metals including copper, gold, nickel, aluminum, tin, combinations thereof, and alloys thereof. Of common metallic materials, copper has especially low resistivity and cost. Furthermore, those skilled in the art will understand that in the context of a semiconductor chip assembly, a copper conductor is typically a copper alloy that is mostly copper but not pure elemental copper, such copper-zirconium (99.9% copper), copper-silver-phosphorus-magnesium (99.7% copper), or copper-tin-iron-phosphorus (99.7% copper). If desired, the conductive trace portion of the routing line can be spot plated near the through-hole to make it compatible with receiving a particular connection joint.

The routing line can be fabricated, for instance, by electrolessly depositing a copper layer on the molded substrate, electroplating a copper layer on the electroless copper layer, electroplating a tin layer on the electroplated copper layer, using laser direct write to define the periphery of the routing line by selectively removing a portion of the tin layer using the copper layers as an etch stop, and then applying a wet chemical etch to selectively remove exposed portions of the copper layers using the patterned tin layer as an etch mask. Likewise, the conductive trace portion of the routing line can be formed in this manner before providing the connection joint.

The routing line may function as a signal, power or ground layer depending on the purpose of the associated chip pad. Likewise, the routing line can fan-in or fan-out or both, regardless of whether the molded substrate is molded onto or adhesively attached to the chip, and regardless of whether the assembly is a chip size package or a grid array.

The bump can have numerous shapes such as a hemisphere or a frustum.

The base can have recessed and non-recessed portions with various shapes and dimensions, or alternatively can be a relatively flat layer. For instance, when the through-hole diameter at the bottom surface of the molded substrate is substantially larger than the diameter of the opening in the adhesive, thereby exposing a portion of the top surface of the adhesive between the sidewalls of the through-hole and the sidewalls of the opening, the recessed portion of the base can be omitted such that the through-hole is formed in the non-recessed portion of the base.

The pad can have numerous shapes including a flat rectangular shape and a bumped shape. For instance, a bump-shaped pad may extend into or above the through-hole. The pad can either be partially or completely exposed by the through-hole prior to being contacted by the metal layer or routing line. The pad can have a length and width that are larger than, equal to, or smaller than the diameter of the through-hole. Preferably, the pad and through-hole have the same or similar size, and essentially all of the pad is directly beneath the through-hole.

The through-hole can have a circular, ovular, square, rectangular or other shape (as viewed from the top surface of the molded substrate). Likewise, the through-hole sidewalls may have a wide variety of shapes and slopes including vertical sidewalls, tapered sidewalls, continuous sidewalls and stepped sidewalls. Furthermore, the through-hole can be formed after the transfer molding by numerous approaches including laser direct write, projection laser ablation through a metal mask, and photolithography. Moreover, if an adhesive is sandwiched between the molded substrate and the chip, then the through-hole in the molded substrate and the underlying opening in the adhesive can be formed essentially simultaneously by a single processing step.

The through-hole need not necessarily expose a single pad. For instance, a rectangularly-shaped through-hole can expose all the pads proximate to a single outer edge of the chip. Preferably, the rectangularly-shaped through-hole exposes insulative portions of the upper surface of the chip between the pads without exposing edges of the pads that are parallel to the corresponding outer edge of the chip. In fact, the molded substrate can include four rectangularly-shaped through-holes, each parallel to an adjacent outer edge of the chip and exposing the pads proximate to the corresponding outer edge of the chip. Advantageously, if the metal layer or routing lines are formed on the pads by an electroless plating operation, the relatively large rectangularly-shaped through-holes that each expose a plurality of pads can facilitate electroless deposition by improving the flow of the electroless plating solution near the pads in comparison to smaller through-holes with relatively high aspect ratios that each expose a single pad. Furthermore, the electroless plating does not occur on the exposed insulative portions of the upper surface of the chip between the pads, thereby avoiding plating conductive bridges between the pads. For instance, electrolessly plated copper does not plate on silicon dioxide between adjacent pads.

Numerous adhesives can be applied between the molded substrate and the chip. For instance, the adhesive can be applied as a paste, a laminated layer, or a liquid applied by stenciling, screen-printing, spin-on, or spray-on. If a paste or liquid adhesive is applied, the adhesive may fill some or all of the through-hole and be subsequently removed. If a laminated adhesive is applied then no appreciable amount of adhesive may reside inside the through-hole. Thermosetting adhesive liquids and pastes such as epoxies are generally suitable. Likewise, thermoplastic adhesives are also generally suitable. Furthermore, the opening in the adhesive beneath the through-hole may be formed either before or after attaching the molded substrate to the chip. For instance, the adhesive can be applied as a liquid or paste (A stage) to the bottom surface of the molded substrate, the adhesive can be partially cured (B stage), an etch can form the opening in the adhesive, the partially cured adhesive can be brought into contact with the chip, and then the adhesive can be fully cured (C stage). Alternatively, the liquid or paste adhesive can be sandwiched between the molded substrate and the chip, the adhesive can be fully cured thereby mechanically fastening the molded substrate to the chip, and then an etch can form the opening in the adhesive.

Numerous etches can be applied to form the through-hole in the molded substrate and/or the opening in the adhesive. For instance, Nd:YAG and $CO_2$ lasers are generally suitable.

If the molded substrate is attached to the chip by the transfer molding operation, the molded compound can also be applied to the lower surface of the chip to provide back-side protection. Likewise, an encapsulant can be provided on the lower surface of the chip either before or after attaching the molded substrate to the chip.

The connection joint can be formed from a wide variety of materials including copper, gold, nickel, palladium, tin, alloys thereof, and combinations thereof, can be formed by a wide variety of processes including electroplating, electroless plating, ball bonding and solder reflow, and can have a wide variety of shapes and sizes. The choice between a connection joint that partially or completely fills the through-hole and the shape of the connection joint depends on design and reliability considerations. Further details regarding an electroplated connection joint are disclosed in U.S. application Ser. No. 09/643,212, filed Aug. 22, 2000 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/643,214, filed Aug. 22, 2000 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/665,928, filed Sep. 20, 2000 by Charles W. C. Lin entitled "Semiconductor Chip Assembly with Ball Bond Connection Joint" which is incorporated by reference.

An electroplated or electrolessly plated connection joint need not be restricted to a single metal. For instance, the connection joint can be formed during the initial stage using copper, and then, after the connection joint has begun to plate on the pad, the connection joint can be formed during the later stages using nickel and then palladium. The nickel protects the copper from corrosion, and the palladium provides wetting for a contact terminal of the routing line that covers the bump when solder is applied to the contact terminal during the next level assembly but is of relatively little importance to the connection joint. As another example, the connection joint can be formed during the initial stage with copper, and then the connection joint can be formed during the later stages using nickel and then solder. The nickel protects the copper from corrosion, and the solder is used to provide solder joints that cover the bumps for the next level assembly but is of relatively little importance to the connection joint. Thus, the connection joint may include a wide variety of metal layers, particularly where the bottom metal layer is well-suited to contacting the conductive trace and the pad, and the top metal layer is well-suited for providing a surface layer for a contact terminal on the bump that facilitates connection with the next level assembly.

An electroplated connection joint can also be formed by an electroplating operation that utilizes a plating mask so that only selected portions of the metal layer or routing line that are connected to the plating bus are electroplated. For instance, the plating mask can expose the enlarged rectangular portion of the routing line and the through-hole while covering the enlarged circular region and the routing region of the routing line.

A ball bond connection joint may be formed by thermocompression or thermosonic wire bonding and composed of any conventional bonding wire material including gold, silver, copper, palladium, and alloys thereof. For instance, gold alloyed with a small amount of beryllium exhibits grain growth at low temperature which enhances stability and increases strength by precipitation hardening. Gold alloyed with 5 to 10 ppm beryllium by weight or 30 to 100 ppm copper by weight is commonly used for thermocompression and thermosonic wire bonding. Similarly, gold alloyed with 1 percent palladium raises the recrystallization temperature so that the fully annealed area above the ball bond resulting from the thermal source (such as electronic flame-off), called the heat-affected zone (HAZ), is extremely short, resulting in a short tail or stump on the ball bond after the wire is broken from the ball bond with a simple upward vertical movement. Furthermore, aluminum alloyed with small amounts of silicon, magnesium or both has been proposed for thermosonic wire bonding.

A ball bond connection joint may be formed by initially contacting the wire ball to the pad, the conductive trace, or both, depending on the relative dimensions of the wire ball and the through-hole. Likewise, the diameter of the wire ball may be larger, smaller, or equal to the diameter of the through-hole. If, for instance, the diameter of the wire ball is smaller than the diameter of the through-hole and the wire ball initially contacts the pad without contacting the conductive trace, then it may be desirable to move the capillary in a horizontal loop to assure that the ball bond contacts the conductive trace and fills the through-hole. Furthermore, the capillary can be withdrawn (clamp open) and then reapplied (clamp closed) to supply additional gold to the ball bond.

A ball bond connection joint may completely or partially fill the through-hole. It is generally preferred that the ball bond connection joint completely fill the through-hole and contact a top surface of the conductive trace in order to maximize the contact area with the conductive trace and the pad. However, if the wire ball seals the through-hole before adequately contacting the pad, then trapped air between the wire ball and the pad may create a compressive force that prevents the wire ball from adequately contacting the pad. Trapped air can be reduced or eliminated by proper choice of shapes and dimensions. For example, if the through-hole has sidewalls that taper at an angle such as 45 degrees so that the diameter increases with increasing height, and the wire ball contacts the pad before contacting the conductive trace, then little or no trapped air should occur.

After a ball bond connection joint is formed, the tail can be reduced or eliminated. For instance, the tail can be flattened or "coined" using a secondary operation after cutting the wire. Alternatively, before moving or after slightly moving the capillary vertically upwards and away from the ball bond, the clamp can be closed and then the capillary can be moved horizontally to shear the wire from the ball bond at or near their juncture. This shearing operation requires that the capillary have adequate clearance for the horizontal motion, which will depend on the dimensions and shapes of the capillary and the ball bond as well as the amount of the upward vertical movement. As another example, the wire bonding equipment may include a blade that creates a notch in the wire to provide a weak point that subsequently breaks.

After the routing line is formed, if a plating bus exists then it is disconnected from the routing line. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, then prior to singulation a photolithography step can be added to selectively cut related circuitry on the assembly that is dedicated to the plating bus since this circuitry would otherwise short the routing lines together.

After the routing line is formed, a soldering material or solder ball can be deposited on the portion over the bump by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

The working format for the semiconductor chip assembly can be a single chip, a wafer, a strip or a panel based on the manufacturing design. For instance, when the working format is a wafer, numerous molded substrates are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip size packages, ball grid arrays, or other structures. The wafer-based approach employs fewer steps and is less time consuming than the strip-based approach, however the strip-based approach is easier to control and has better dimensional stability than the wafer-based approach since aligning the through-holes with the pads involves a single chip rather than the entire wafer.

Advantageously, the semiconductor chip assembly of the present invention is reliable and inexpensive. The molded substrate protects the chip from handling damage, provides a known dielectric barrier for the routing line, and prevents solder reflow at the top surface from contacting the chip. The mode of the connection shifts from the initial mechanical coupling to metallurgical coupling to assure sufficient metallurgical bond strength. Furthermore, the mechanical and metallurgical coupling can occur without wire bonding, TAB, flip-chip bonding, polishing, photolithography or solder joints. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a semiconductor chip assembly, comprising:
   providing a semiconductor chip that includes a conductive pad;
   providing a molded substrate that includes a base and a bump that extends above the base;
   forming a through-hole in the base that is offset from the bump;
   attaching the molded substrate to the chip;
   aligning the through-hole with the pad; and
   forming a routing line that extends from the bump to the through-hole and extends through the through-hole and contacts the pad.

2. The method of claim 1, including forming the molded substrate and attaching the molded substrate to the chip using transfer molding.

3. The method of claim 1, including forming the molded substrate using transfer molding and then attaching the molded substrate to the chip using an adhesive.

4. The method of claim 1, including forming the molded substrate and the through-hole simultaneously.

5. The method of claim 1, including forming the molded substrate and then forming the through-hole.

6. The method of claim 1, including forming the through-hole before attaching the molded substrate to the chip.

7. The method of claim 1, including forming the through-hole after attaching the molded substrate to the chip.

8. The method of claim 1, including forming a portion of the routing line that extends to the bump before attaching the molded substrate to the chip.

9. The method of claim 1, including forming a portion of the routing line that extends to the bump after attaching the molded substrate to the chip.

10. The method of claim 1, including singulating the chip from a wafer before attaching the molded substrate to the chip.

11. The method of claim 1, including singulating the chip from a wafer after attaching the molded substrate to the chip.

12. The method of claim 1, including forming a portion of the routing line that extends into the through-hole and contacts the pad by plating.

13. The method of claim 1, including forming a portion of the routing line that extends into the through-hole and contacts the pad by wire bonding a ball bond.

14. The method of claim 1, including forming the routing line by depositing a metal layer over the molded substrate and then applying a laser to the metal layer to define a periphery of the routing line.

15. The method of claim 1, including forming the routing line by depositing a first metal layer over the molded substrate, depositing a second metal over the first metal layer, applying a laser etch to the second metal layer to define a periphery of the routing line, and applying a wet chemical etch to the first metal layer using the second metal layer as an etch mask.

16. The method of claim 1, wherein the bump to closer than the pad to a central region of the chip.

17. The method of claim 1, wherein the bump is farther than the pad from a central region of the chip.

18. The method of claim 1, wherein the routing line that provides all horizontal and vertical routing between a top of the bump and the pad.

19. The method of claim 1, wherein the assembly is a grid array package.

20. The method of claim 1, wherein the assembly is a chip size package.

21. A method of manufacturing a semiconductor chip assembly, comprising:
   providing a semiconductor chip that includes upper and lower surfaces, wherein the upper surface includes a conductive pad;
   providing a molded substrate that includes top and bottom surfaces, wherein the molded substrate includes a base, a bump and a through-hole, the base extends to the top and bottom surfaces, the bump extends above the base at the top surface, and the through-hole is in the base and offset from the bump and extends between the top and bottom surfaces;
   attaching the molded substrate to the chip;
   exposing the pad through the through-hole; and
   forming a routing line that covers the bump and extends along the top surface from the bump to the through-hole and extends through the through-hole and is electrically connected to the pad.

22. The method of claim 21, including the following steps in the sequence set forth:
   providing the molded substrate and attaching the molded substrate to the chip using transfer molding;
   depositing a metal layer on the molded substrate, into the through-hole and on the pad; and
   removing a portion of the metal layer to define a periphery of the routing line.

23. The method of claim 21, including the following steps in the sequence set forth:
   providing the molded substrate using transfer molding;
   depositing a first portion of a metal layer on the molded substrate and into the through-hole;
   attaching the molded substrate to the chip using an adhesive between the upper and bottom surfaces;
   depositing a second portion of the metal layer on the first portion of the metal layer and the pad; and
   removing a portion of the metal layer to define a periphery of the routing line.

24. The method of claim 21, including the following steps in the sequence set forth:
   providing the molded substrate using transfer molding;
   forming a first portion of the routing line that covers the bump and extends into the through-hole;
   attaching the molded substrate to the chip using an adhesive between the upper and bottom surfaces; and forming a second portion of the routing line that contacts the first portion of the routing line and the pad.

25. The method of claim 21, wherein the molded substrate is compressible and permits a portion of the conductive trace that covers the bump to exhibit elastic deformation in response to vertically oriented external pressure directed towards the top surface.

26. The method of claim 21, wherein the routing line spans 360 degrees around the through-hole.

27. The method of claim 21, wherein the pad includes a central region directly beneath the through-hole and a peripheral region not directly beneath the through-hole.

28. The method of claim 21, wherein all of the pad is directly beneath the through-hole.

29. The method of claim 21, wherein the assembly is devoid of wire bonds, TAB leads and solder joints.

30. The method of claim 21, wherein the assembly is a chip size package.

31. A method of manufacturing a semiconductor chip assembly, comprising:
    attaching a chip to a molded substrate, wherein the chip includes upper and lower surfaces, the upper surface includes first and second pads, the molded substrate includes top and bottom surfaces, the top surface includes a base and first and second bumps that extend above the base, the bottom surface includes the base, and first and second through-holes in the base extend between the top and bottom surfaces, are offset from the first and second bumps, respectively, and are aligned with the first and second pads, respectively; and then
    forming first and second routing lines that are electrically isolated from one another, wherein the first routing line contacts the first pad and a top of the first bump and extends along the top surface between the first bump and the first through-hole and extends through and spans 360 degrees around the first through-hole, and the second routing line contacts the second pad and a top of the second bump and extends along the top surface between the second bump and the second through-hole and extends through and spans 360 degrees around the second through-hole.

32. The method of claim 31, including forming the molded substrate and attaching the molded substrate to the chip using transfer molding.

33. The method of claim 32, including forming the through-holes using the transfer molding.

34. The method of claim 32, including forming the through-holes using laser drilling after the transfer molding.

35. The method of claim 32, including forming the routing lines by depositing a metal layer on the molded substrate, into the through-holes and on the pads, and then removing a portion of the metal layer to define peripheries of the routing lines and electrically isolate the routing lines from one another.

36. The method of claim 32, including forming the routing lines by forming first portions of the routing lines that cover the first and second bumps, respectively, and then forming second portions of the routing lines that contact the first and second pads, respectively.

37. The method of claim 32, including forming the molded substrate on the chip such that the upper surface contacts the bottom surface using the transfer molding.

38. The method of claim 32, including providing an adhesive on the chip and then forming the molded substrate on the adhesive such that the adhesive is sandwiched between the upper and bottom surfaces using the transfer molding.

39. The method of claim 32, including singulating the chip from a wafer after forming the routing lines.

40. The method of claim 31, including providing the molded substrate using transfer molding and then attaching the molded substrate to the chip using an adhesive between the upper and bottom surfaces.

41. The method of claim 40, including forming the through-holes using the transfer molding.

42. The method of claim 40, including forming the through-holes using laser drilling after the transfer molding.

43. The method of claim 40, including forming the routing lines by depositing a metal layer on the molded substrate, into the through-holes and on the pads, and then removing a portion of the metal layer to define peripheries of the routing lines and electrically isolate the routing lines from one another.

44. The method of claim 40, including forming the routing lines by forming first portions of the routing lines that cover the first and second bumps, respectively, and then forming second portions of the routing lines that contact the first and second pads, respectively.

45. The method of claim 40, including singulating the chip from a wafer before attaching the chip to the molded substrate.

46. The method of claim 31, wherein forming the routing lines includes electrolessly depositing a first metal layer on the molded substrate, into the through-holes and on the pads, then electroplating a second metal layer over the first metal layer, then applying a laser etch to the second metal layer to define a periphery of the routing lines, and then applying a wet chemical etch to the first metal layer using the second metal layer as an etch mask.

47. The method of claim 31, wherein forming the routing lines includes electrolessly depositing a first metal layer on the molded substrate, then electroplating a second metal layer over the first metal layer, then applying a laser etch to the second metal layer to define a periphery of first and second conductive traces, then applying a wet chemical etch to the first metal layer using the second metal layer as an etch mask, then forming first and second connection joints in the first and second through-holes, respectively, on the first and second conductive traces, respectively, and on the first and second pads, respectively.

48. The method of claim 31, wherein the molded substrate is an electrically insulating polymer, and the routing lines include copper.

49. The method of claim 31, wherein the assembly is devoid of wire bonds, TAB leads and solder joints.

50. The method of claim 31, wherein the assembly is a chip size package.

51. A method of manufacturing a semiconductor chip assembly, comprising:
    providing a semiconductor chip that includes upper and lower surfaces, wherein the upper surface includes a pad;
    forming a molded substrate on the upper surface using transfer molding, wherein the molded substrate includes top and bottom surfaces, the top surface includes a base and a bump that extends above the base, the bottom surface includes the base, and the bottom surface contacts the upper surface;
    forming a through-hole in the base that extends between the top and bottom surfaces and is offset from the bump and exposes the pad; then
    depositing a metal layer on the top surface, in the through-hole and on the pad; and
    removing a portion of the metal layer on the top surface such that a remaining portion of the metal layer provides a routing line between the pad and a top of the bump.

52. The method of claim 51, including forming the through-hole during the transfer molding.

53. The method of claim 51, including forming the through-hole after the transfer molding using laser drilling.

54. The method of claim 51, wherein depositing the metal layer includes electrolessly plating a first metal layer on the top surface, in the through-hole and on the pad, and then electroplating a second metal layer over the first metal layer.

55. The method of claim 54, wherein removing the portion of the metal layer includes laser etching the second metal layer and then wet chemical etching the first metal layer using the second metal layer as an etch mask.

56. The method of claim 51, wherein the molded substrate is compressible and permits a portion of the routing line that covers the top of the bump to exhibit elastic deformation in response to vertically oriented external pressure directed towards the top surface.

57. The method of claim 51, wherein the upper surface includes a plurality of pads, the top surface includes a plurality of bumps, the metal layer is deposited on the plurality of pads and the plurality of bumps, and the routing line is electrically isolated from the plurality of pads except for the pad and is electrically isolated from the plurality of bumps except for the bump.

58. The method of claim 57, wherein the through-hole exposes the plurality of pads before depositing the metal layer.

59. The method of claim 51, wherein the assembly is devoid of wire bonds, TAB leads and solder joints.

60. The method of claim 51, including singulating the chip from other chips on a wafer after removing the portion of the metal layer, wherein the assembly is a chip size package.

61. A method of manufacturing a semiconductor chip assembly, comprising:
    providing a semiconductor chip that includes upper and lower surfaces, wherein the upper surface includes a pad;
    providing an adhesive on the upper surface that covers the pad;
    forming a molded substrate on the adhesive using transfer molding, wherein the molded substrate includes top and bottom surfaces, the top surface includes a base and a bump that extends above the base, the bottom surface includes the base, and the bottom surface contacts the adhesive without contacting the upper surface;
    forming a through-hole in the base that extends between the top and bottom surfaces and is offset from the bump;
    forming an opening in the adhesive, wherein the through-hole and the opening expose the pad; then
    depositing a metal layer on the top surface, in the through-hole and on the pad; and
    removing a portion of the metal layer on the top surface such that a remaining portion of the metal layer provides a routing line between the pad and a top of the bump.

62. The method of claim 61, including forming the through-hole during the transfer molding.

63. The method of claim 61, including forming the through-hole after the transfer molding using laser drilling.

64. The method of claim 61, wherein depositing the metal layer includes electrolessly plating a first metal layer on the top surface, in the through-hole and on the pad, and then electroplating a second metal layer over the first metal layer.

65. The method of claim 64, wherein removing the portion of the metal layer includes laser etching the second metal layer and then wet chemical etching the first metal layer using the second metal layer as an etch mask.

66. The method of claim 61, wherein the molded substrate is compressible and permits a portion of the routing line that covers the top of the bump to exhibit elastic deformation in response to vertically oriented external pressure directed towards the top surface.

67. The method of claim 61, wherein the upper surface includes a plurality of pads, the top surface includes a plurality of bumps, the metal layer is deposited on the plurality of pads and the plurality of bumps, and the routing line is electrically isolated from the plurality of pads except for the pad and is electrically isolated from the plurality of bumps except for the bump.

68. The method of claim 67, wherein the through-hole exposes the plurality of pads before depositing the metal layer.

69. The method of claim 61, wherein the assembly is devoid of wire bonds, TAB leads and solder joints.

70. The method of claim 61, including singulating the chip from other chips on a wafer after removing the portion of the metal layer, wherein the assembly is a chip size package.

71. A method of manufacturing a semiconductor chip assembly, comprising:
    providing a semiconductor chip that includes upper and lower surfaces, wherein the upper surface includes a pad;
    forming a molded substrate using transfer molding, wherein the molded substrate includes top and bottom surfaces, the top surface includes a base and a bump that extends above the base, and the bottom surface includes the base;
    forming a through-hole in the base that extends between the top and bottom surfaces and is offset from the bump;
    depositing a metal layer on the top surface and in the through-hole;
    removing a portion of the metal layer on the top surface such that a remaining portion of the metal layer provides a first portion of a routing line between the through-hole and a top of the bump; then
    attaching the molded substrate to the chip using an adhesive;
    exposing the pad using the through-hole and an opening in the adhesive; and
    forming a second portion of the routing line in the through-hole that contacts the first portion of the routing line and the pad, wherein the routing line extends between a top of the bump and the pad.

72. The method of claim 71, including forming the through-hole during the transfer molding.

73. The method of claim 71, including forming the through-hole after the transfer molding using laser drilling.

74. The method of claim 71, wherein depositing the metal layer includes electrolessly plating a first metal layer on the top surface and in the through-hole, and then electroplating a second metal layer over the first metal layer.

75. The method of claim 74, wherein removing the portion of the metal layer includes laser etching the second metal layer and then wet chemical etching the first metal layer using the second metal layer as an etch mask.

76. The method of claim 71, wherein the molded substrate is compressible and permits a portion of the conductive trace that covers the top of the bump to exhibit elastic deformation in response to vertically oriented external pressure directed towards the top surface.

77. The method of claim 71, wherein the upper surface includes a plurality of pads, the top surface includes a plurality of bumps, the metal layer is deposited on the plurality of bumps, and the routing line is electrically isolated from the plurality of pads except for the pad and electrically isolated from the plurality of bumps except for the bump.

78. The method of claim 77, wherein the through-hole exposes the plurality of pads before forming the second portion of the routing line.

79. The method of claim 71, wherein the second portion of the routing line is formed by plating.

80. The method of claim 79, wherein the second portion of the routing line is formed by electroplating.

81. The method of claim 79, wherein the second portion of the routing line is formed by electroless plating.

82. The method of claim 79, wherein the second portion of the routing line contacts a portion of a top surface of the adhesive between the pad and the sidewalls of the through-hole.

83. The method of claim 79, wherein the second portion of the routing line has a bowl-shape.

84. The method of claim 71, wherein the second portion of the routing line is formed by ball bonding.

85. The method of claim 84, wherein the second portion of the routing line is formed by applying thermosonic ball bonding.

86. The method of claim 84, wherein the second portion of the routing line is formed by applying thermocompression ball bonding.

87. The method of claim 84, wherein the second portion of the routing line is formed by applying thermocompression or thermosonic wire bonding using a capillary that inserts a wire ball into the through-hole and presses the wire ball against the first portion of the routing line and the pad to form a ball bond inside the through-hole that contacts and bonds to the first portion of the routing line and the pad, thereby providing a connection joint that electrically connects the first portion of the routing line and the pad.

88. The method of claim 84, wherein the second portion of the routing line has a mushroom-shape.

89. The method of claim 71, wherein the assembly is devoid of wire bonds, TAB leads and solder joints.

90. The method of claim 71, including singulating the chip from other chips on a wafer before attaching the molded substrate to the chip.

91. A semiconductor chip assembly, comprising:

a semiconductor chip that includes upper and lower surfaces, wherein the upper surface includes a conductive pad; and a molded substrate that includes top and bottom surfaces, wherein the top surface includes a base and a bump that extends above the base, the bottom surface is mechanically attached to the upper surface, a through-hole in the base between the top and bottom surfaces and offset from the bump is aligned with the pad, and an electrically conductive routing line contacts a top of the bump and extends along the top surface to the through-hole and extends through the through-hole and contacts the pad.

92. The assembly of claim 91, wherein the molded substrate is molded on the chip.

93. The assembly of claim 91, wherein the molded substrate is attached to the chip by an adhesive between the upper and bottom surfaces.

94. The assembly of claim 91, wherein the routing line is the only conductor in the through-hole.

95. The assembly of claim 91, wherein the molded substrate is compressible and permits a portion of the routing line that covers the top of the bump to exhibit elastic deformation in response to vertically oriented external pressure directed towards the top surface.

96. The assembly of claim 91, wherein the routing line spans 360 degrees around the through-hole.

97. The assembly of claim 91, wherein the molded substrate is an electrically insulating polymer.

98. The assembly of claim 91, wherein the assembly is devoid of wire bonds, TAB leads and solder joints.

99. The assembly of claim 91, wherein the assembly is a grid array package.

100. The assembly of claim 91, wherein the assembly is a chip size package.

* * * * *